(12) United States Patent
Ashida et al.

(10) Patent No.: US 9,893,408 B2
(45) Date of Patent: Feb. 13, 2018

(54) DIRECTIONAL COUPLER

(71) Applicant: TDK CORPORATION, Tokyo (JP)

(72) Inventors: Yuta Ashida, Tokyo (JP); Yasunori Sakisaka, Tokyo (JP); Noriaki Ootsuka, Tokyo (JP); Tetsuzo Goto, Tokyo (JP); Takeshi Kijima, Tokyo (JP)

(73) Assignee: TDK CORPORATION, Tokyo (JP)

( * ) Notice: Subject to any disclaimer, the term of this patent is extended or adjusted under 35 U.S.C. 154(b) by 30 days.

(21) Appl. No.: 15/206,614

(22) Filed: Jul. 11, 2016

(65) Prior Publication Data

US 2017/0040661 A1    Feb. 9, 2017

(30) Foreign Application Priority Data

Aug. 7, 2015 (JP) ................. 2015-156653

(51) Int. Cl.
*H01P 5/18*   (2006.01)
*H03H 7/01*   (2006.01)
*H01P 3/08*   (2006.01)
*H03H 1/00*   (2006.01)

(52) U.S. Cl.
CPC ............. *H01P 5/18* (2013.01); *H01P 5/187* (2013.01); *H03H 7/0115* (2013.01); *H03H 2001/0078* (2013.01)

(58) Field of Classification Search
CPC ............. H01P 5/12; H01P 5/19; H01P 5/227
USPC ................ 333/109–112, 116–120
See application file for complete search history.

(56) References Cited

U.S. PATENT DOCUMENTS

| 7,042,309 | B2 * | 5/2006 | Podell ............. H01P 5/187 333/112 |
| 9,000,864 | B2 * | 4/2015 | Tanaka ............. H01P 5/184 333/116 |
| 9,077,061 | B2 | 7/2015 | Tamaru |
| 9,385,411 | B2 * | 7/2016 | Ohashi ............. H01P 5/187 |
| 9,391,354 | B2 * | 7/2016 | Ootsuka ............. H01P 5/185 |
| 9,614,269 | B2 * | 4/2017 | Srirattana ............. H01P 5/185 |
| 9,653,771 | B2 * | 5/2017 | Ootsuka ............. H01P 5/184 |

* cited by examiner

*Primary Examiner* — Dean Takaoka
(74) *Attorney, Agent, or Firm* — Oliff PLC

(57) ABSTRACT

A directional coupler includes: a first to a fourth port; a main line connecting the first and second ports; a first to a fourth subline section electromagnetically coupled to the main line; a first to a third matching section; and a stack. The first subline, first matching, third subline, third matching, fourth subline, second matching, and second subline sections are arranged in this order between the third and fourth port. The first and second matching sections include an inductor connecting two subline sections located on opposite sides of the matching section. Each of one or more conductor layers used to form the inductor includes two connection portions for electrical connection to respective other elements, and a line portion connecting the two connection portions. The inductor excluding the connection portions does not include potions that overlap each other when viewed in the stacking direction of the stack.

7 Claims, 26 Drawing Sheets

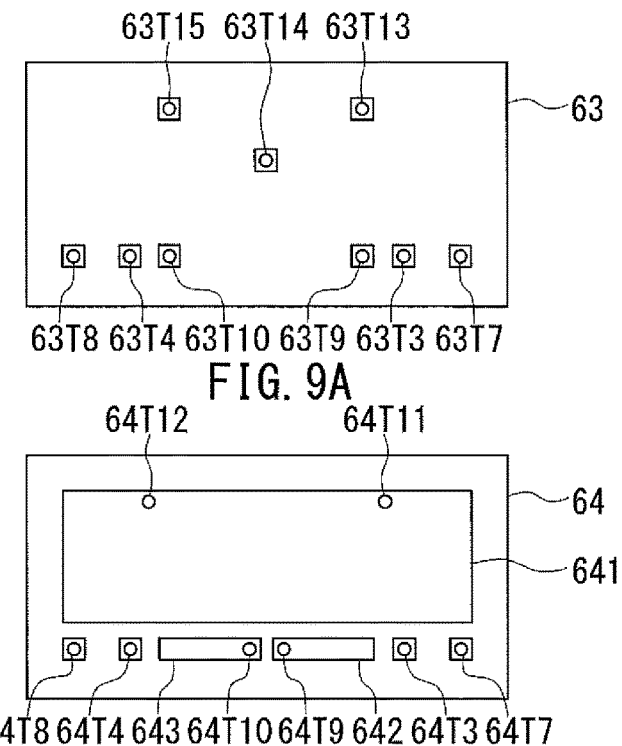
FIG. 9A
FIG. 9B
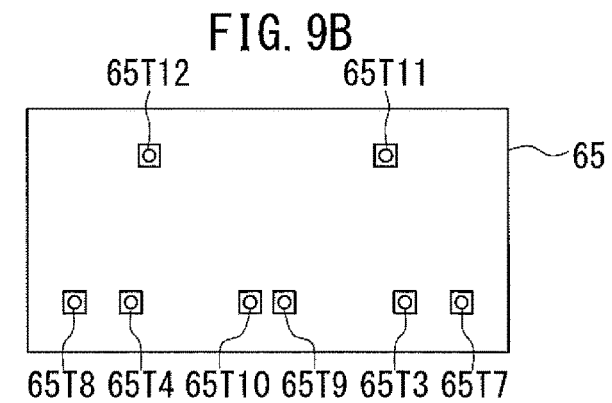
FIG. 9C
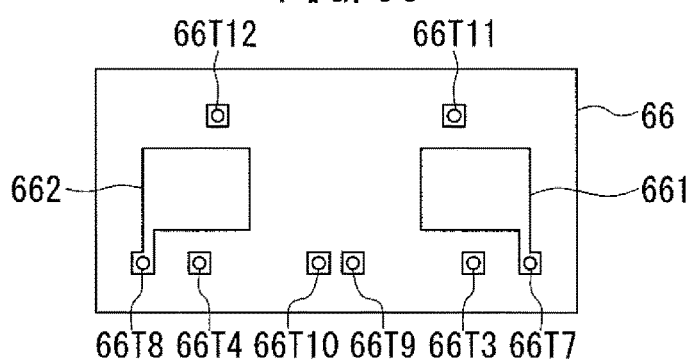
FIG. 9D

DIRECTIONAL COUPLER

BACKGROUND OF THE INVENTION

1. Field of the Invention

The present invention relates to a wideband capable directional coupler.

2. Description of the Related Art

Directional couplers are used for detecting the levels of transmission/reception signals in transmission/reception circuits of wireless communication apparatuses such as cellular phones and wireless LAN communication apparatuses.

A directional coupler configured as follows is known as a conventional directional coupler. The directional coupler has an input port, an output port, a coupling port, a terminal port, a main line, and a subline. One end of the main line is connected to the input port, and the other end of the main line is connected to the output port. One end of the subline is connected to the coupling port, and the other end of the subline is connected to the terminal port. The main line and the subline are configured to be electromagnetically coupled to each other. The terminal port is grounded via a terminator having a resistance of 50Ω, for example. The input port receives a high frequency signal, and the output port outputs the same. The coupling port outputs a coupling signal having a power that depends on the power of the high frequency signal received at the input port.

Major parameters indicating the characteristics of directional couplers include coupling, isolation, and return loss at the coupling port. Definitions of these parameters will now be described. First, assume that the input port receives a high frequency signal of power P1. In this case, let P3 be the power of the signal output from the coupling port. Further, assuming that the output port receives a high frequency signal of power P02, let P03 be the power of the signal output from the coupling port. Assuming that the coupling port receives a high frequency signal of power P5, let P6 be the power of the signal reflected at the coupling port. Further, let C represent coupling, I represent isolation, and RL represent return loss at the coupling port. These parameters are defined by the following equations.

$C = 10 \log(P3/P1) [\text{dB}]$ $I = 10 \log(P03/P02) [\text{dB}]$ $RL = 10 \log(P6/P5) [\text{dB}]$ The coupling of the conventional directional coupler increases with increasing frequency of the high frequency signal received at the input port. The conventional directional coupler thus suffers from the problem that the frequency response of the coupling is not flat. Where coupling is denoted as −c (dB), an increase in coupling means a decrease in the value of c.

U.S. Pat. No. 9,077,061 B2 discloses a directional coupler aiming to resolve the aforementioned problem. The directional coupler disclosed therein has a subline divided into a first subline and a second subline. One end of the first subline is connected to the coupling port. One end of the second subline is connected to the terminal port. A phase conversion unit is provided between the other end of the first subline and the other end of the second subline. The phase conversion unit causes a phase shift to be generated in a signal passing therethrough in such a manner that the absolute value of the phase shift monotonically increases within the range from 0 degree to 180 degrees as the frequency increases in a predetermined frequency band. The phase conversion unit is specifically a low-pass filter.

Mobile communication systems conforming to the Long Term Evolution (LTE) standard have become practically used in recent years, and further, practical use of mobile communication systems conforming to the LTE-Advanced standard, which is an evolution of the LTE standard, is under study. Carrier Aggregation (CA) is one of the key technologies of the LTE-Advanced standard. CA uses multiple carriers called component carriers simultaneously to enable wideband transmission.

A mobile communication apparatus operable under CA uses multiple frequency bands simultaneously. Accordingly, such a mobile communication apparatus requires a wideband capable directional coupler, that is, a directional coupler usable for multiple signals in multiple frequency bands.

The directional coupler disclosed in U.S. Pat. No. 9,077,061 B2 has insufficient isolation in a frequency band not lower than the cut-off frequency of the low-pass filter. More specifically, where isolation is denoted as −i (dB), this directional coupler does not exhibit a sufficiently large value of i in a frequency band not lower than the cut-off frequency of the low-pass filter. Thus, this directional coupler does not work in a frequency band not lower than the cut-off frequency of the low-pass filter.

We proceed to explain why the directional coupler disclosed in U.S. Pat. No. 9,077,061 B2 does not exhibit sufficiently large value of i in a frequency band not lower than the cut-off frequency of the low-pass filter. In this directional coupler, there are formed a path connecting the connection point between the first subline and the low-pass filter to the ground via only a first capacitor, and a path connecting the connection point between the second subline and the low-pass filter to the ground via only a second capacitor. Consequently, in a frequency band not lower than the cut-off frequency of the low-pass filter, a high frequency signal going from the first subline to the low-pass filter mostly flows to the ground via the first capacitor, and a high frequency signal going from the second subline to the low-pass filter mostly flows to the ground via the second capacitor. Thus, in this directional coupler, most part of the high frequency signal fails to pass through the low-pass filter in a frequency band not lower than the cut-off frequency of the low-pass filter.

For the reason described above, the directional coupler disclosed in U.S. Pat. No. 9,077,061 B2 is only usable over a limited frequency band lower than the cut-off frequency of the low-pass filter. Providing a wideband capable directional coupler is thus difficult with the technology described in U.S. Pat. No. 9,077,061 B2.

OBJECT AND SUMMARY OF THE INVENTION

It is an object of the present invention to provide a wideband capable directional coupler.

A directional coupler of the present invention includes: a first port; a second port; a third port; a fourth port; a main line connecting the first port and the second port; N subline sections each of which is formed of a line configured to be electromagnetically coupled to the main line; (N−1) matching section(s); and a stack for integrating the first to fourth ports, the main line, the N subline sections and the (N−1) matching section(s).

N is an integer of 2 or more. The N subline sections and the (N−1) matching section(s) are arranged in series between the third port and the fourth port such that one of the N subline sections is connected to the third port, another one of the N subline sections is connected to the fourth port, and the subline sections alternate with the matching section(s) in terms of circuitry. The (N−1) matching section or each of the (N−1) matching sections causes a change in the phase of a signal passing therethrough.

The (N−1) matching section or at least one of the (N−1) matching sections includes a first path connecting two subline sections located on opposite sides of the matching section, and a second path connecting the first path to the ground. The first path includes a first inductor. The second path includes a first capacitor and a second inductor connected in series.

The stack includes a plurality of dielectric layers and a plurality of conductor layers stacked on each other. The plurality of conductor layers include one or more inductor-forming layers which are one or more conductor layers used to form the first inductor. Each of the one or more inductor-forming layers includes two connection portions for electrical connection to respective other elements, and a line portion connecting the two connection portions. The entirety of the first inductor excluding the two connection portions does not include portions that overlap each other when viewed in a direction of stacking of the plurality of dielectric layers and the plurality of conductor layers.

In the directional coupler of the present invention, the stack may have a top surface and a bottom surface located at opposite ends in the direction of stacking of the plurality of dielectric layers and the plurality of conductor layers. The first inductor may be located closer to the top surface of the stack than are the first capacitor, the second inductor, the main line and the N subline sections. In this case, the second inductor may be located closer to the bottom surface of the stack than is the first capacitor.

In the directional coupler of the present invention, the first inductor may be formed only of one inductor-forming layer having a spiral shape. Alternatively, the first inductor may be formed of a plurality of inductor-forming layers. In this case, the plurality of inductor-forming layers are arranged such that their respective line portions do not overlap each other when viewed in the direction of stacking of the plurality of dielectric layers and the plurality of conductor layers. When the first inductor is formed of a plurality of inductor-forming layers, the entirety of the first inductor may have a spiral shape when viewed in the direction of stacking of the plurality of dielectric layers and the plurality of conductor layers.

In the directional coupler of the present invention, the first inductor may have a first end and a second end opposite to each other, and the second inductor may have a first end and a second end, the first end being closest to the first path in terms of circuitry, the second end being closest to the ground in terms of circuitry. The first capacitor may be provided between the first end of the first inductor and the first end of the second inductor. In this case, the second path may further include a second capacitor provided between the second end of the first inductor and the first end of the second inductor.

In the directional coupler of the present invention, the (N−1) matching section or at least one of the (N−1) matching sections includes the first path and the second path, the first path including the first inductor, the second path including the first capacitor and the second inductor connected in series. The matching section having such a configuration is capable of passing high frequency signals over a wider frequency band when compared with low-pass filters. Thus, according to the present invention, it is possible to reduce a change in coupling in response to a change in frequency over a wide frequency band. Further, in the present invention, each of the one or more inductor-forming layers used to form the first inductor includes the two connection portions and the line portion. The entirety of the first inductor excluding the two connection portions does not include portions that overlap each other when viewed in the direction of stacking of the plurality of dielectric layers and the plurality of conductor layers. This makes it possible to prevent the first inductor from having a large stray capacitance, and thus allows for a further reduction of a change in coupling in response to a change in frequency. By virtue of the foregoing, the directional coupler of the present invention achieves wideband capability.

Other and further objects, features and advantages of the invention will appear more fully from the following description.

BRIEF DESCRIPTION OF THE DRAWINGS

FIG. 9A to FIG. 9D are explanatory diagrams illustrating the respective patterned surfaces of the thirteenth to sixteenth dielectric layers of the stack included in the directional coupler shown in FIG. 3.

DETAILED DESCRIPTION OF THE PREFERRED EMBODIMENTS

[First Embodiment]

Figure 1:
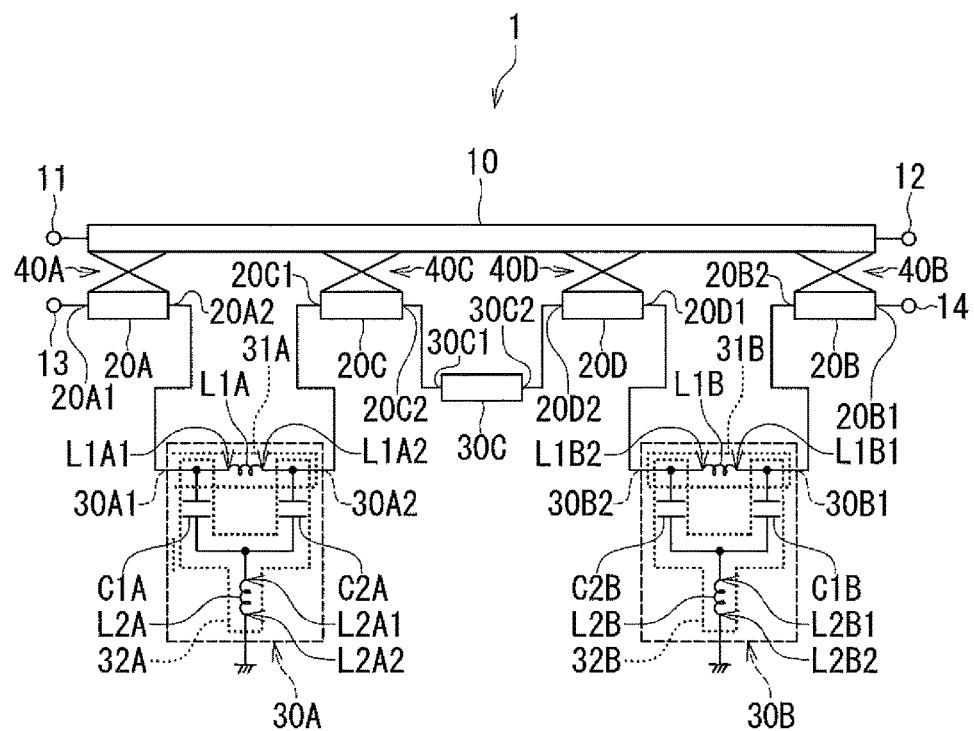
FIG. 1 is a circuit diagram illustrating the circuitry of a directional coupler according to a first embodiment of the invention.

Preferred embodiments of the present invention will now be described in detail with reference to the drawings. First, reference is made to FIG. 1 to describe the circuitry of a directional coupler according to a first embodiment of the invention. As shown in FIG. 1, the directional coupler 1 according to the first embodiment includes a first port 11, a second port 12, a third port 13, and a fourth port 14. One of the third and fourth ports 13 and 14 is grounded via a terminator 15 having a resistance of, for example, 50Ω.

The directional coupler 1 further includes: a main line 10 connecting the first port 11 and the second port 12; N subline sections each of which is formed of a line configured to be electromagnetically coupled to the main line 10; (N−1) matching section(s); and a stack for integrating the first to fourth ports 11 to 14, the main line 10, the N subline sections and the (N−1) matching section(s).

N is an integer of 2 or more. In the first embodiment, N is 4. Specifically, the directional coupler 1 includes a first subline section 20A, a second subline section 20B, a third subline section 20C, a fourth subline section 20D, a first matching section 30A, a second matching section 30B, and a third matching section 30C.

The first subline section 20A has a first end 20A1 and a second end 20A2 opposite to each other. The second subline section 20B has a first end 20B1 and a second end 20B2 opposite to each other. The third subline section 20C has a first end 20C1 and a second end 20C2 opposite to each other. The fourth subline section 20D has a first end 20D1 and a second end 20D2 opposite to each other. The first matching section 30A has a first end 30A1 and a second end 30A2 opposite to each other. The second matching section 30B has a first end 30B1 and a second end 30B2 opposite to each other. The third matching section 30C has a first end 30C1 and s second end 30C2 opposite to each other.

The first end 20A1 of the first subline section 20A is connected to the third port 13. The first matching section 30A is provided between the second end 20A2 of the first subline section 20A and the first end 20C1 of the third subline section 20C. The first end 30A1 of the first matching section 30A is connected to the second end 20A2 of the first subline section 20A. The first end 20C1 of the third subline section 20C is connected to the second end 30A2 of the first matching section 30A.

The first end 20B1 of the second subline section 20B is connected to the fourth port 14. The second matching section 30B is provided between the second end 20B2 of the second subline section 20B and the first end 20D1 of the fourth subline section 20D. The first end 30B1 of the second matching section 30B is connected to the second end 20B2 of the second subline section 20B. The first end 20D1 of the fourth subline section 20D is connected to the second end 30B2 of the second matching section 30B.

The third matching section 30C is provided between the second end 20C2 of the third subline section 20C and the second end 20D2 of the fourth subline section 20D. In the first embodiment, the third matching section 30C is a line. The first end 30C1 of the third matching section 30C is connected to the second end 20C2 of the third subline section 20C. The second end 30C2 of the third matching section 30C is connected to the second end 20D2 of the fourth subline section 20D.

The first matching section 30A includes a first path 31A connecting the first end 30A1 and the second end 30A2, and a second path 32A connecting the first path 31A to the ground. The first path 31A includes a first inductor L1A. The first inductor L1A has a first end LA1 and a second end L1A2 opposite to each other. Here, of the two ends of the first inductor L1A, the first end L1A1 is taken as the end closer to the first subline section 20A, whereas the second end L1A2 is taken as the end closer to the third subline section 20C.

The second path 32A includes a first capacitor C1A and a second inductor L2A connected in series. The second inductor L2A has a first end L2A1 and a second end L2A2. In terms of circuitry, the first end L2A1 is closest to the first path 31A, and the second end L2A2 is closest to the ground. The first capacitor C1A is provided between the first end L1A1 of the first inductor L1A and the first end L2A1 of the second inductor L2A. In the first embodiment, the second path 32A further includes a second capacitor C2A provided between the second end L1A2 of the first inductor L1A and the first end L2A1 of the second inductor L2A. The second inductor L2A has an inductance of 0.1 nH or higher. The inductance of the second inductor L2A is preferably not higher than 7 nH.

The circuitry of the second matching section 30B is similar to that of the first matching section 30A. More specifically, the second matching section 30B includes a first path 31B connecting the first end 30B1 and the second end 30B2, and a second path 32B connecting the first path 31B to the ground. The first path 31B includes a first inductor L1B. The first inductor L1B has a first end L1B1 and a second end L1B2 opposite to each other. Here, of the two ends of the first inductor L1B, the first end L1B1 is taken as the end closer to the second subline section 20B, whereas the second end L1B2 is taken as the end closer to the fourth subline section 20D.

The second path 32B includes a first capacitor C1B and a second inductor L2B connected in series. The second inductor L2B has a first end L2B1 and a second end L2B2. In terms of circuitry, the first end L2B1 is closest to the first path 31B, and the second end L2B2 is closest to the ground. The first capacitor C1B is provided between the first end L1B1 of the first inductor L1B and the first end L2B1 of the second inductor L2B. In the first embodiment, the second path 32B further includes a second capacitor C2B provided between the second end L1B2 of the first inductor L1B and the first end L2B1 of the second inductor L2B. The second inductor L2B has an inductance of 0.1 nH or higher. The inductance of the second inductor L2B is preferably not higher than 7 nH.

Here, a combination of respective portions of the main line 10 and the first subline section 20A coupled to each other will be referred to as the first coupling section 40A. A combination of respective portions of the main line 10 and the second subline section 20B coupled to each other will be referred to as the second coupling section 40B. A combination of respective portions of the main line 10 and the third subline section 20C coupled to each other will be referred to as the third coupling section 40C. A combination of respective portions of the main line 10 and the fourth subline section 20D coupled to each other will be referred to as the fourth coupling section 40D.

The strengths of coupling of the first to fourth coupling sections 40A, 40B, 40C and 40D will be defined as follows. The strength of coupling of the first coupling section 40A is the strength of coupling of the first subline section 20A to the main line 10. The strength of coupling of the first coupling section 40A is expressible in terms of the coupling of the first coupling section 40A alone. The higher the coupling of the first coupling section 40A alone, the higher the strength of coupling of the first coupling section 40A.

The strength of coupling of the second coupling section 40B is the strength of coupling of the second subline section 20B to the main line 10. The strength of coupling of the second coupling section 40B is expressible in terms of the coupling of the second coupling section 40B alone. The higher the coupling of the second coupling section 40B alone, the higher the strength of coupling of the second coupling section 40B.

The strength of coupling of the third coupling section 40C is the strength of coupling of the third subline section 20C to the main line 10. The strength of coupling of the third coupling section 40C is expressible in terms of the coupling of the third coupling section 40C alone. The higher the coupling of the third coupling section 40C alone, the higher the strength of coupling of the third coupling section 40C.

The strength of coupling of the fourth coupling section 40D is the strength of coupling of the fourth subline section 20D to the main line 10. The strength of coupling of the fourth coupling section 40D is expressible in terms of the coupling of the fourth coupling section 40D alone. The higher the coupling of the fourth coupling section 40D alone, the higher the strength of coupling of the fourth coupling section 40D.

In the first embodiment, the third and fourth subline sections 20C and 20D are coupled more strongly to the main line 10 than are the first and second subline sections 20A and 20B. In other words, the strength of coupling of each of the third and fourth coupling sections 40C and 40D is higher than the strength of coupling of each of the first and second coupling sections 40A and 40B.

Each of the first to third matching sections 30A, 30B and 30C is a circuit for performing impedance matching between a signal source and a load, assuming a situation in which one of the third and fourth ports 13 and 14 is grounded via a terminator serving as the load, and the other of the third and fourth ports 13 and 14 is connected with the signal source having an output impedance equal to the resistance of the terminator (e.g., 50Ω). On the assumption of the above situation, the first to third matching sections 30A, 30B and 30C are each designed so that the reflection coefficient as viewed in the direction from one of the third and fourth ports 13 and 14 to the other has an absolute value of zero or near zero in the service frequency band of the directional coupler 1. Each of the first to third matching sections 30A, 30B and 30C causes a change in the phase of a signal passing therethrough. In the first embodiment, given that signals having the same frequency pass through the first to third matching sections 30A, 30B and 30C, the phase change caused by the third matching section 30C is smaller than the phase change caused by each of the first and second matching sections 30A and 30B.

The circuitry of the directional coupler 1, including element values, is preferably symmetric with respect to the third matching section 30C. The circuitry of the directional coupling 1 may not be completely symmetric, but need only be approximately symmetric.

In the following, we discuss the case where the circuitry of the directional coupler 1 is symmetric. In this case, the strength of coupling of the second coupling section 40B is equal to the strength of coupling of the first coupling section 40A, and the strength of coupling of the fourth coupling section 40D is equal to the strength of coupling of the third coupling section 40C. Further, the circuitry of the first matching section 30A and that of the second matching section 30B, including element values, are mutually symmetric with respect to the third matching section 30C. More specifically, the inductances of the first inductors L1A and L1B pairing up with each other are substantially equal to each other; the inductances of the second inductors L2A and L2B pairing up with each other are substantially equal to each other, the capacitances of the first capacitors C1A and C1B pairing up with each other are substantially equal to each other, and the capacitances of the second capacitors C2A and C2B pairing up with each other are substantially equal to each other. When signals of the same frequency pass through the first and second matching sections 30A and 30B, the first and second matching sections 30A and 30B cause changes of the same magnitude in the phase of those signals. The directional coupler 1 is bidirectional because the circuitry thereof is symmetric with respect to the third matching section 30C. As mentioned above, the inductances of two inductors pairing up with each other are "substantially equal to each other", and ditto for the capacitances of two capacitors pairing up with each other. This means that errors in the inductances and capacitances resulting from manufacturing variances of the inductors and capacitors are tolerated.

In the first matching section 30A shown in FIG. 1, the first capacitor C1A is provided between the first end L1A1 of the first inductor L1A and the first end L2A1 of the second inductor L2A, and the second capacitor C2A is provided between the second end L1A2 of the first inductor L1A and the first end L2A1 of the second inductor L2A. In the second matching section 30B shown in FIG. 1, the first capacitor C1B is provided between the first end L1B1 of the first inductor L1B and the first end L2B1 of the second inductor L2B, and the second capacitor C2B is provided between the second end L1B2 of the first inductor L1B and the first end L2B1 of the second inductor L2B. However, in terms of circuitry, the first and second capacitors C1A and C2A in the first matching section 30A may be provided in a reversed arrangement from that in the example shown in FIG. 1, and ditto for the first and second capacitors C1B and C2B in the second matching section 30B. More specifically, in the first matching section 30A, the first capacitor C1A may be provided between the second end L1A2 of the first inductor L1A and the first end L2A1 of the second inductor L2A, and the second capacitor C2A may be provided between the first end L1A1 of the first inductor L1A and the first end L2A1 of the second inductor L2A. In this case, in the second matching section 30B, the first capacitor C1B is provided between the second end L1B2 of the first inductor L1B and the first end L2B1 of the second inductor L2B, and the second capacitor C2B is provided between the first end L1B1 of the first inductor L1B and the first end L2B1 of the second inductor L2B.

The operation of the directional coupler 1 according to the first embodiment will now be described. The directional coupler 1 is usable in the following first and second modes of use. In the first mode of use, the first port 11 serves as the input port, the second port 12 serves as the output port, the third port 13 serves as the coupling port, and the fourth port 14 serves as the terminal port. In the first mode of use, the fourth port 14 is grounded via a terminator having a resistance of, for example, 50Ω. In the second mode of use, the second port 12 serves as the input port, the first port 11 serves as the output port, the fourth port 14 serves as the coupling port, and the third port 13 serves as the terminal port. In the second mode of use, the third port 13 is grounded via a terminator having a resistance of, for example, 50Ω.

In the first mode of use, a high frequency signal is received at the first port 11 and output from the second port 12. The third port 13 outputs a coupling signal having a power that depends on the power of the high frequency signal received at the first port 11.

In the first mode of use, a first, a second, a third and a fourth signal path are formed between the first port 11 serving as the input port and the third port 13 serving as the coupling port. The first signal path runs through the first coupling section 40A. The second signal path runs through the third coupling section 40C and the first matching section 30A. The third signal path runs through the fourth coupling section 40D, the third matching section 30C and the first matching section 30A. The fourth signal path runs through the second coupling section 40B, the second matching section 30B, the third matching section 30C and the first matching section 30A. When a high frequency signal has been received at the first port 11, the coupling signal to be output from the third port 13 is a signal resulting from a combination of signals that have respectively passed through the first to fourth signal paths. The coupling of the directional coupler 1 used in the first mode of use depends on the strength of coupling of each of the first to fourth coupling sections 40A, 40B, 40C and 40D and the relationship among the phases of the signals having passed through the first to fourth signal paths.

In the first mode of use, a fifth, a sixth, a seventh and an eighth signal path are formed between the second port 12 serving as the output port and the third port 13 serving as the coupling port. The fifth signal path runs through the first coupling section 40A. The sixth signal path runs through the third coupling section 40C and the first matching section 30A. The seventh signal path runs through the fourth coupling section 40D, the third matching section 30C and the first matching section 30A. The eighth signal path runs through the second coupling section 40B, the second matching section 30B, the third matching section 30C and the first matching section 30A. The isolation of the directional coupler 1 used in the first mode of use depends on the strength of coupling of each of the first to fourth coupling sections 40A, 40B, 40C and 40D and the relationship among the phases of the signals having passed through the fifth to eighth signal paths.

In the second mode of use, a high frequency signal is received at the second port 12 and output from the first port 11. The fourth port 14 outputs a coupling signal having a power that depends on the power of the high frequency signal received at the second port 12.

In the second mode of use, a ninth, a tenth, an eleventh and a twelfth signal path are formed between the second port 12 serving as the input port and the fourth port 14 serving as the coupling port. The ninth signal path runs through the second coupling section 40B. The tenth signal path runs through the fourth coupling section 40D and the second matching section 30B. The eleventh signal path runs through the third coupling section 40C, the third matching section 30C and the second matching section 30B. The twelfth signal path runs through the first coupling section 40A, the first matching section 30A, the third matching section 30C and the second matching section 30B. When a high frequency signal has been received at the second port 12, the coupling signal to be output from the fourth port 14 is a signal resulting from a combination of signals that have respectively passed through the ninth to twelfth signal paths. The coupling of the directional coupler 1 used in the second mode of use depends on the strength of coupling of each of the first to fourth coupling sections 40A, 40B, 40C and 40D and the relationship among the phases of the signals having passed through the ninth to twelfth signal paths.

In the second mode of use, a thirteenth, a fourteenth, a fifteenth and a sixteenth signal path are formed between the first port 11 serving as the output port and the fourth port 14 serving as the coupling port. The thirteenth signal path runs through the second coupling section 40B. The fourteenth signal path runs through the fourth coupling section 40D and the second matching section 30B. The fifteenth signal path runs through the third coupling section 40C, the third matching section 30C and the second matching section 30B. The sixteenth signal path runs through the first coupling section 40A, the first matching section 30A, the third matching section 30C and the second matching section 30B. The isolation of the directional coupler 1 used in the second mode of use depends on the strength of coupling of each of the first to fourth coupling sections 40A, 40B, 40C and 40D and the relationship among the phases of the signals having passed through the thirteenth to sixteenth signal paths.

Figure 2:
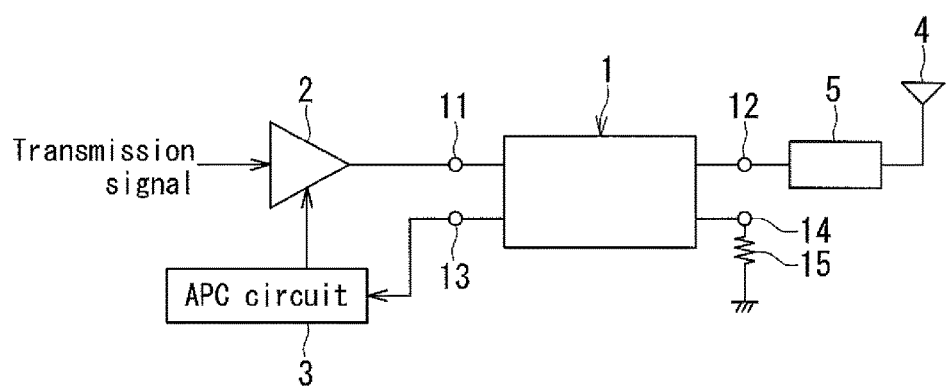
FIG. 2 is a circuit diagram illustrating an example of use of the directional coupler according to the first embodiment of the invention.

Now, an example of use of the directional coupler 1 in the first and second modes of use will be described with reference to FIG. 2. FIG. 2 is a circuit diagram illustrating an example of use of the directional coupler 1. FIG. 2 illustrates a transmission circuit including the directional coupler 1. The transmission circuit shown in FIG. 2 includes a power amplifier 2, an automatic power control (APC) circuit 3 and an impedance matching element 5, in addition to the directional coupler 1.

The power amplifier 2 has an input, an output, and a gain control end. The input of the power amplifier 2 receives a transmission signal, which is a high frequency signal. The output of the power amplifier 2 is connected to the first port 11 of the directional coupler 1.

The APC circuit 3 has an input and an output. The input of the APC circuit 3 is connected to the third port 13 of the directional coupler 1. The output of the APC circuit 3 is connected to the gain control end of the power amplifier 2.

The second port 12 of the directional coupler 1 is connected to an antenna 4 via the impedance matching element 5. The impedance matching element 5 is an element for performing impedance matching between the transmission circuit and the antenna 4 in order to sufficiently reduce the level of a reflected wave signal resulting from the transmission signal reflected at the antenna 4. The fourth port 14 of the directional coupler 1 is grounded via the terminator 15.

Next, the first mode of use of the directional coupler 1 in the transmission circuit shown in FIG. 2 will be described. In the first mode of use, the transmission signal amplified by the power amplifier 2 is received at the first port 11 and output from the second port 12. The third port 13 outputs a coupling signal having a power that depends on the level of the transmission signal received at the first port 11. The transmission signal output from the second port 12 goes through the impedance matching element 5 and is emitted from the antenna 4. The coupling signal output from the third port 13 is received at the APC circuit 3. In accordance with the level of the coupling signal output from the third port 13, the APC circuit 3 controls the gain of the power amplifier 2 so that the power amplifier 2 provides an output signal of approximately constant level.

Next, the second mode of use of the directional coupler 1 in the transmission circuit shown in FIG. 2 will be described. In the second mode of use, the directional coupler 1 is used to detect the level of a reflection wave signal resulting from the transmission signal reflected at the antenna 4. In the second mode of use, the reflected wave signal is the high frequency signal to be received at the directional coupler 1.

The reflected wave signal is received at the second port 12 and output from the first port 11. Thus, in the second mode of use, the second port 12 serves as the input port, the first port 11 serves as the output port, the fourth port 14 serves as the coupling port, and the third port 13 serves as the terminal port. In the second mode of use, the third port 13 is grounded via a terminator. The fourth port 14 is connected with a power detector (not illustrated). The fourth port 14 outputs a coupling signal having a power that depends on the power of the reflected wave signal received at the second port 12. The non-illustrated power detector detects the level of the coupling signal. The information on the level of the coupling signal is used to adjust the characteristics of the impedance matching element 5 so as to sufficiently reduce the level of the reflected wave signal.

The level of the reflected wave signal received at the directional coupler 1 is lower than that of the transmission signal received at the directional coupler 1. Thus, sufficient isolation is required of the directional coupler 1 not only in the first mode of use but also in the second mode of use.

The directional coupler 1 according to the first embodiment has circuitry that is symmetric or approximately symmetric with respect to the third matching section 30C, as mentioned previously. The directional coupler 1 is thus bidirectional. Consequently, the directional coupler 1 is usable in the first and second modes of use, and provides the same characteristics regardless of whether used in the first mode of use or the second mode of use.

Figure 3:
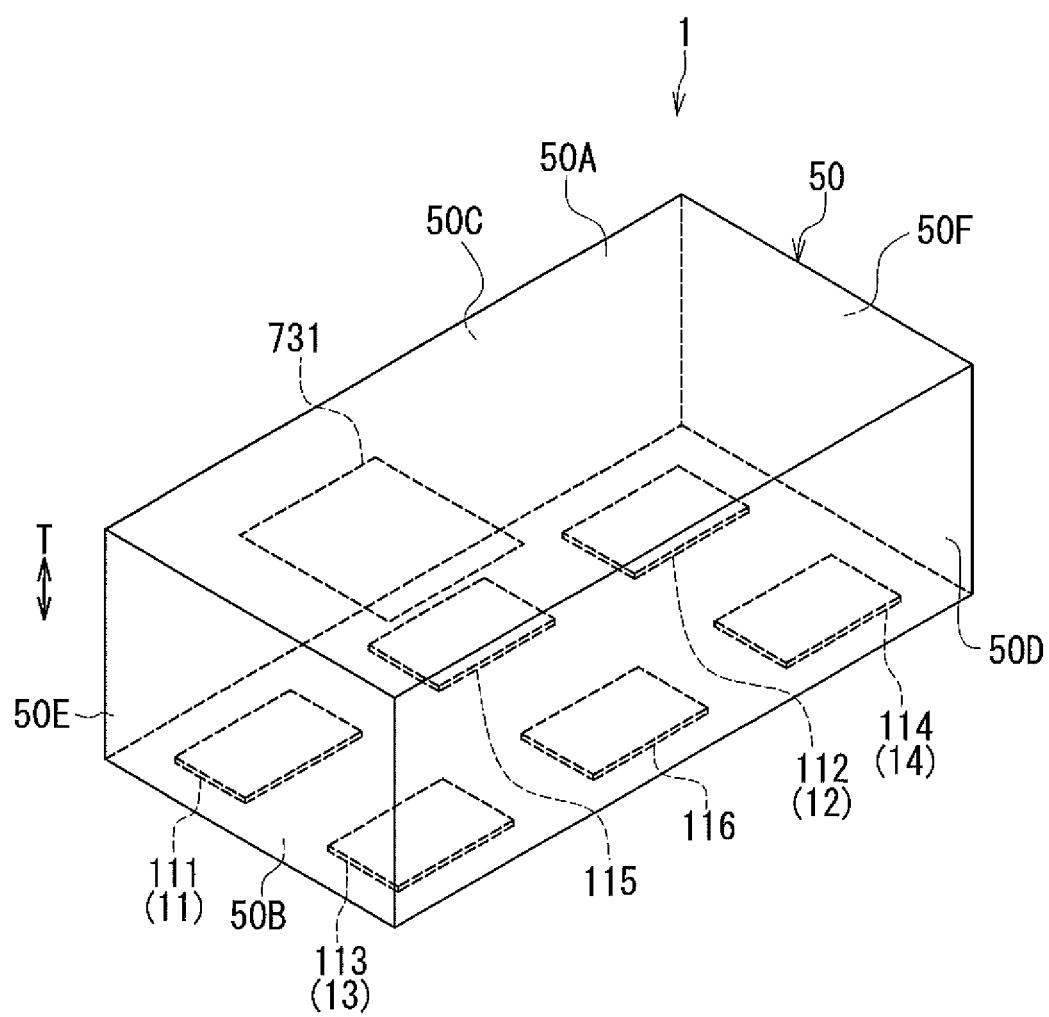
FIG. 3 is a perspective view of the directional coupler according to the first embodiment of the invention.

An example of the structure of the directional coupler 1 will now be described. FIG. 3 is a perspective view of the directional coupler 1. The directional coupler 1 shown in FIG. 3 includes a stack 50 for integrating the first to fourth ports 11 to 14, the main line 10, the first to fourth subline sections 20A, 20B, 20C and 20D, and the first to third matching sections 30A, 30B and 30C. As will be described in detail later, the stack 50 includes a plurality of dielectric layers and a plurality of conductor layers stacked on each other. Each of the inductors L1A and L1B is formed using one or more inductor-forming layers, which are one or more conductor layers among the plurality of conductor layers of the stack 50. Each of the inductors L2A and L2B is formed using a plurality of through holes formed in the plurality of dielectric layers of the stack 50. Each of the capacitors C1A, C2A, C1B and C2B is formed using two or more conductor layers among the plurality of conductor layers of the stack 50.

The stack 50 is shaped like a rectangular solid and has a periphery. The periphery of the stack 50 includes a top surface 50A, a bottom surface 50B, and four side surfaces 50C, 50D, 50E and 50F. The top surface 50A and the bottom surface 50B are opposite each other. The side surfaces 50C and 50D are opposite each other. The side surfaces 50E and 50F are opposite each other. The side surfaces 50C to 50F are perpendicular to the top surface 50A and the bottom surface 50B. For the stack 50, a direction perpendicular to the top surface 50A and the bottom surface 50B is the stacking direction of the plurality of dielectric layers and conductor layers. The stacking direction is shown by the arrow T in FIG. 3. The top surface 50A and the bottom surface 50B are located at opposite ends in the stacking direction T.

The directional coupler 1 shown in FIG. 3 has a first terminal 111, a second terminal 112, a third terminal 113, a fourth terminal 114, and two ground terminals 115 and 116. The first to fourth terminals 111, 112, 113 and 114 correspond to the first to fourth ports 11, 12, 13 and 14 shown in FIG. 1, respectively. The ground terminals 115 and 116 are connected to the ground. The terminals 111 to 116 are provided on the bottom surface 50B of the stack 50.

Figure 4:
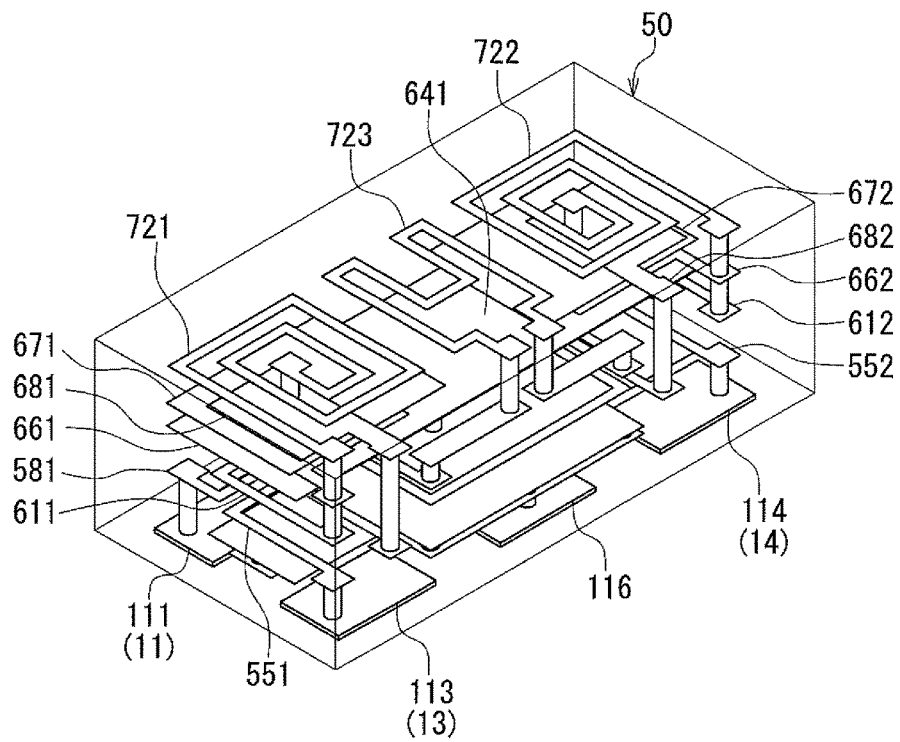
FIG. 4 is a perspective internal view of a stack included in the directional coupler shown in FIG. 3.
Figure 5:
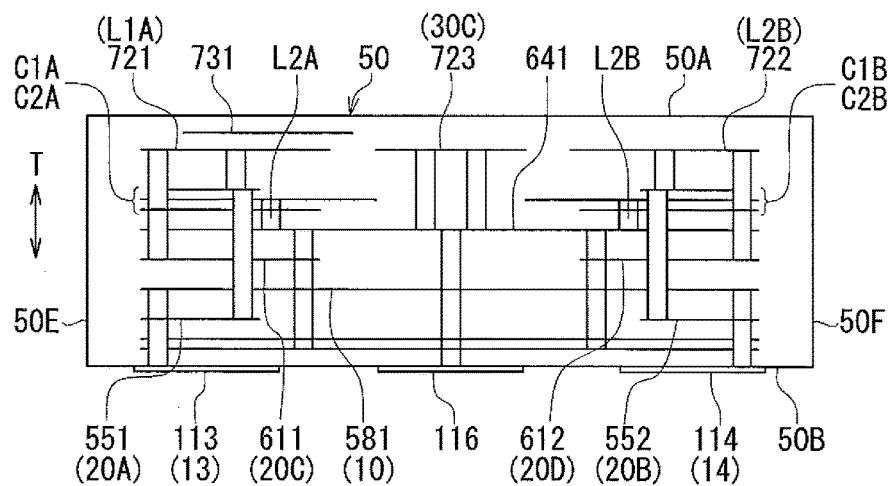
FIG. 5 is a cross-sectional view of the stack included in the directional coupler shown in FIG. 3.

The stack 50 will now be described in detail with reference to FIG. 4 to FIG. 11C. The stack 50 includes twenty-three dielectric layers stacked on top of one another. The twenty-three dielectric layers will be referred to as the first to twenty-third dielectric layers in the order from bottom to top. FIG. 4 is a perspective internal view of the stack 50. FIG. 5 is a cross-sectional view of the stack 50. FIG. 6A to FIG. 6D illustrate the respective patterned surfaces of the first to fourth dielectric layers. FIG. 7A to FIG. 7D illustrate the respective patterned surfaces of the fifth to eighth dielectric layers. FIG. 8A to FIG. 8D illustrate the respective patterned surfaces of the ninth to twelfth dielectric layers. FIG. 9A to FIG. 9D illustrate the respective patterned surfaces of the thirteenth to sixteenth dielectric layers. FIG. 10A to FIG. 10D illustrate the respective patterned surfaces of the seventeenth to twentieth dielectric layers. FIG. 11A to FIG. 11C illustrate the respective patterned surfaces of the twenty-first to twenty-third dielectric layers.

Figure 6A:
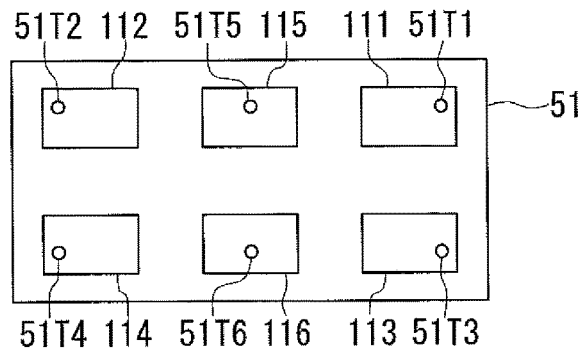
FIG. 6A to FIG. 6D are explanatory diagrams illustrating the respective patterned surfaces of the first to fourth dielectric layers of the stack included in the directional coupler shown in FIG. 3.

As shown in FIG. 6A, the first to fourth terminals 111, 112, 113 and 114 and the ground terminals 115 and 116 are formed on the patterned surface of the first dielectric layer 51. Further, through holes 51T1, 51T2, 51T3, 51T4, 51T5 and 51T6 are formed in the dielectric layer 51. The through holes 51T1, 51T2, 51T3, 51T4, 51T5 and 51T6 are connected to the terminals 111, 112, 113, 114, 115 and 116, respectively.

Figure 6B:
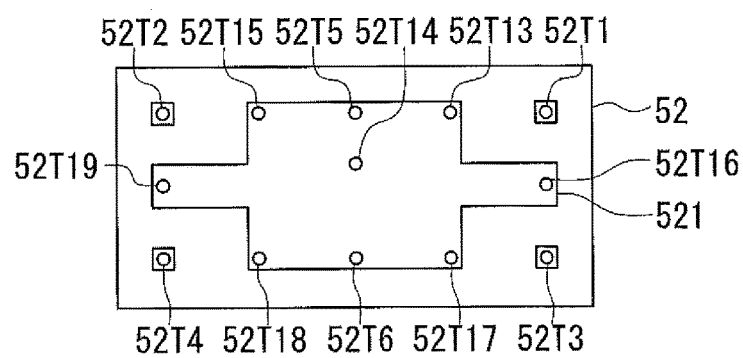

As shown in FIG. 6B, a ground conductor layer 521 is formed on the patterned surface of the second dielectric layer 52. Further, through holes 52T1, 52T2, 52T3, 52T4, 52T5, 52T6, 52T13, 52T14, 52T15, 52T16, 52T17, 52T18 and 52T19 are formed in the dielectric layer 52. The through holes 51T1 to 51T4 shown in FIG. 6A are connected to the through holes 52T1 to 52T4, respectively. The through holes 51T5 and 51T6 shown in FIG. 6A and the through holes 52T5, 52T6 and 52T13 to 52T19 are connected to the ground conductor layer 521.

Figure 6C:
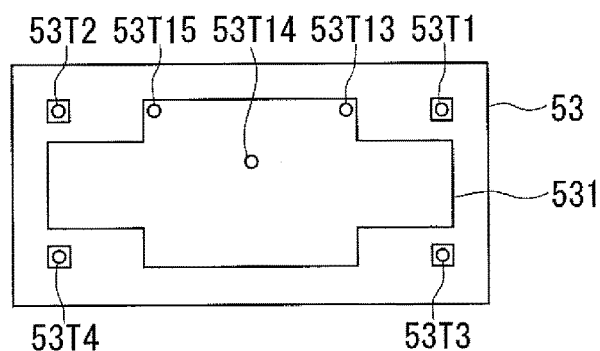

As shown in FIG. 6C, a ground conductor layer 531 is formed on the patterned surface of the third dielectric layer 53. Further, through holes 53T1, 53T2, 53T3, 53T4, 53T13, 53T14 and 53T15 are formed in the dielectric layer 53. The through holes 52T1 to 52T4 shown in FIG. 6B are connected to the through holes 53T1 to 53T4, respectively. The through holes 52T5, 52T6 and 52T13 to 52T19 shown in FIG. 6B and the through holes 53T13 to 53T15 are connected to the ground conductor layer 531.

Figure 6D:
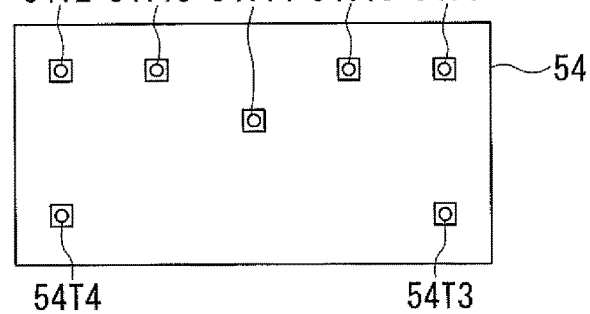

As shown in FIG. 6D, through holes 54T1, 54T2, 54T3, 54T4, 54T13, 54T14 and 54T15 are formed in the fourth dielectric layer 54. The through holes 53T1 to 53T4 and 53T13 to 53T15 shown in FIG. 6C are connected to the through holes 54T1 to 54T4 and 54T13 to 54T15, respectively.

Figure 7A:
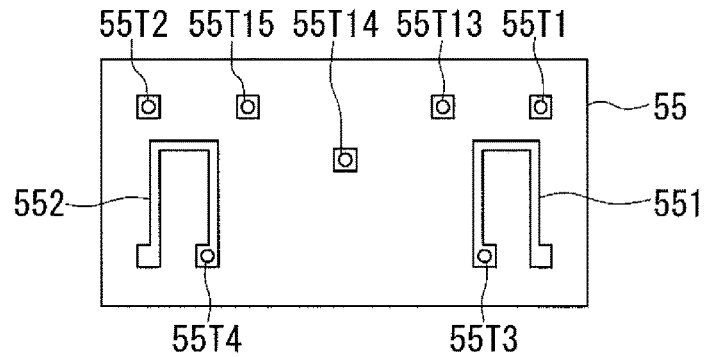
FIG. 7A to FIG. 7D are explanatory diagrams illustrating the respective patterned surfaces of the fifth to eighth dielectric layers of the stack included in the directional coupler shown in FIG. 3.

As shown in FIG. 7A, conductor layers 551 and 552 are formed on the patterned surface of the fifth dielectric layer 55. The conductor layers 551 and 552 are used for forming the first and second subline sections 20A and 20B, respectively. Each of the conductor layers 551 and 552 has a first end and a second end. Further, through holes 55T1, 55T2, 55T3, 55T4, 55T13, 55T14 and 55T15 are formed in the dielectric layer 55. The through holes 54T1, 54T2 and 54T13 to 54T15 shown in FIG. 6D are connected to the through holes 55T1, 55T2 and 55T13 to 55T15, respectively. The through hole 55T3 is connected to a portion of the conductor layer 551 near the first end thereof. The through hole 55T4 is connected to a portion of the conductor layer 552 near the first end thereof. The through hole 54T3 shown in FIG. 6D is connected to a portion of the conductor layer 551 near the second end thereof. The through hole 54T4 shown in FIG. 6D is connected to a portion of the conductor layer 552 near the second end thereof.

Figure 7B:
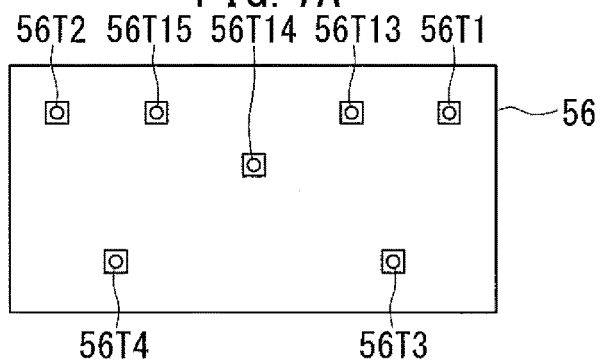

As shown in FIG. 7B, through holes 56T1, 56T2, 56T3, 56T4, 56T13, 56T14 and 56T15 are formed in the sixth dielectric layer 56. The through holes 55T1 to 55T4 and 55T13 to 55T15 shown in FIG. 7A are connected to the through holes 56T1 to 56T4 and 56T13 to 56T15, respectively.

Figure 7C:
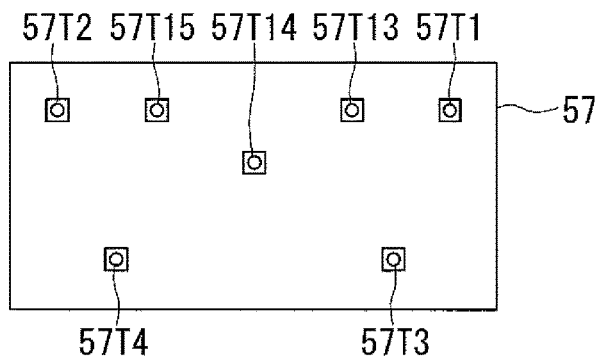

As shown in FIG. 7C, through holes 57T1, 571T2, 57T3, 57T4, 57T13, 57T14 and 57T15 are formed in the seventh dielectric layer 57. The through holes 56T1 to 56T4 and 56T13 to 56T15 shown in FIG. 7B are connected to the through holes 57T1 to 57T4 and 57T13 to 57T15, respectively.

Figure 7D:
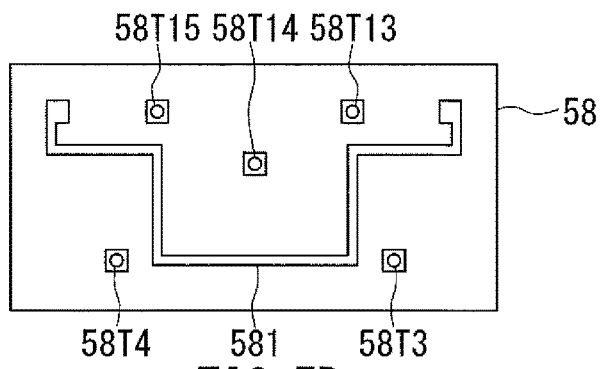

As shown in FIG. 7D, a conductor layer 581 is formed on the patterned surface of the eighth dielectric layer 58. The conductor layer 581 is used for forming the main line 10, and has a first end and a second end. Further, through holes 58T3, 58T4, 58T13, 58T14 and 58T15 are formed in the dielectric layer 58. The through holes 57T3, 57T4 and 57T13 to 57T15 shown in FIG. 7C are connected to the through holes 58T3, 58T4 and 58T13 to 58T15, respectively. The through hole 57T1 shown in FIG. 7C is connected to a portion of the conductor layer 581 near the first end thereof. The through hole 5712 shown in FIG. 7C is connected to a portion of the conductor layer 581 near the second end thereof.

Figure 8A:
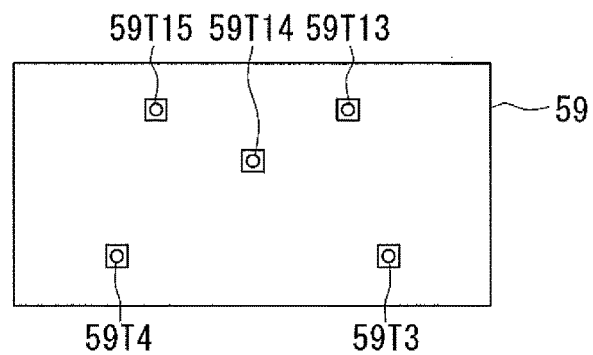
FIG. 8A to FIG. 8D are explanatory diagrams illustrating the respective patterned surfaces of the ninth to twelfth dielectric layers of the stack included in the directional coupler shown in FIG. 3.

As shown in FIG. 8A, through holes 59T3, 59T4, 59T13, 59T14 and 59T15 are formed in the ninth dielectric layer 59. The through holes 58T3, 58T4 and 58T13 to 58T15 shown in FIG. 7D are connected to the through holes 59T3, 59T4 and 59T13 to 59T15, respectively.

Figure 8B:
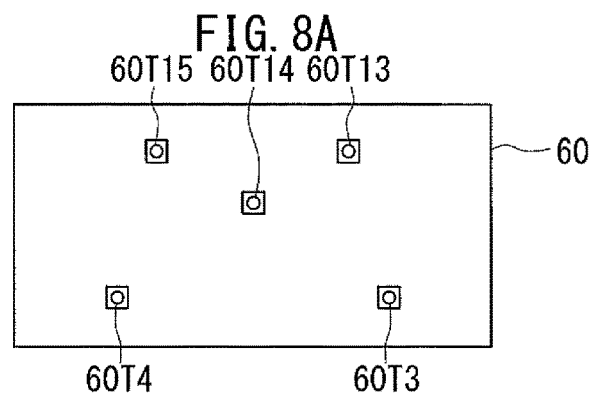

As shown in FIG. 8B, through holes 60T3, 60T4, 60T13, 60T14 and 60T15 are formed in the tenth dielectric layer 60. The through holes 59T3, 59T4 and 59T13 to 59T15 shown in FIG. 8A are connected to the through holes 60T3, 60T4 and 60T13 to 60T15, respectively.

Figure 8C:
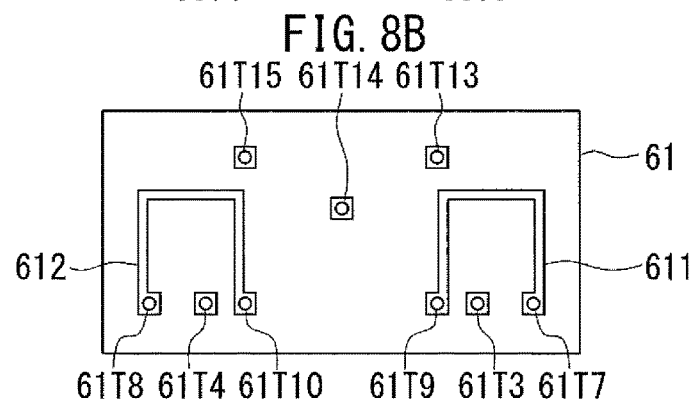

As shown in FIG. 8C, conductor layers 611 and 612 are formed on the patterned surface of the eleventh dielectric layer 61. The conductor layers 611 and 612 are used for forming the third and fourth subline sections 20C and 20D, respectively. Each of the conductor layers 611 and 612 has a first end and a second end. Further, through holes 61T3, 61T4, 61T7, 61T8, 61T9, 61T10, 61T13, 61T14 and 61T15 are formed in the dielectric layer 61. The through holes 60T3, 60T4 and 60T13 to 60T15 shown in FIG. 8B are connected to the through holes 61T3, 61T4 and 61T13 to 61T15, respectively. The through hole 61T7 is connected to a portion of the conductor layer 611 near the first end thereof. The through hole 61T8 is connected to a portion of the conductor layer 612 near the first end thereof. The through hole 61T9 is connected to a portion of the conductor layer 611 near the second end thereof. The through hole 61T10 is connected to a portion of the conductor layer 612 near the second end thereof.

Figure 8D:
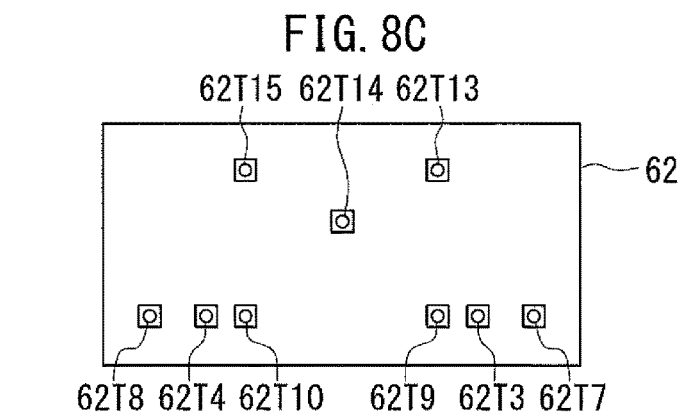

As shown in FIG. 8D, through holes 62T3, 62T4, 62T7, 62T8, 62T9, 62T10, 62T13, 62T14 and 62T15 are formed in the twelfth dielectric layer 62. The through holes 61T3, 61T4, 61T7 to 61T10 and 61T13 to 61T15 shown in FIG. 8C are connected to the through holes 62T3, 62T4, 62T7 to 62T10 and 62T13 to 62T15, respectively.

As shown in FIG. 9A, through holes 63T3, 63T4, 63T7, 63T8, 63T9, 63T10, 63T13, 63T14 and 63T15 are formed in the thirteenth dielectric layer 63. The through holes 62T3, 62T4, 6217 to 62T10 and 62T13 to 62T15 shown in FIG. 8D are connected to the through holes 63T3, 63T4, 63T7 to 63T10 and 63T13 to 63T15, respectively.

As shown in FIG. 9B, a ground conductor layer 641 and conductor layers 642 and 643 are formed on the patterned surface of the fourteenth dielectric layer 64. Each of the conductor layers 642 and 643 has a first end and a second end.

Further, through holes 64T3, 64T4, 64T7, 64T8, 64T9, 64T10, 64T11 and 64T12 are formed in the dielectric layer 64. The through holes 64T11 and 64T12 are used for forming the inductors L2A and L2B, respectively. The through holes 63T3, 63T4, 63T7 and 63T8 shown in FIG. 9A are connected to the through holes 64T3, 64T4, 64T7 and 64T8, respectively. The through hole 64T9 is connected to a portion of the conductor layer 642 near the first end thereof. The through hole 64T10 is connected to a portion of the conductor layer 643 near the first end thereof. The through holes 63T13 to 63T15 shown in FIG. 9A and the through holes 64T11 and 64T12 are connected to the conductor layer 641. The through hole 63T9 shown in FIG. 9A is connected to a portion of the conductor layer 642 near the second end thereof. The through hole 63T10 shown in FIG. 9A is connected to a portion of the conductor layer 643 near the second end thereof.

As shown in FIG. 9C, through holes 65T3, 65T4, 65T7, 65T8, 65T9, 65T10, 65T11 and 65T12 are formed in the fifteenth dielectric layer 65. The through holes 65T11 and 65T12 are used for forming the inductors L2A and L2B, respectively. The through holes 64T3, 64T4 and 64T7 to 64T12 shown in FIG. 9B are connected to the through holes 65T3, 65T4 and 65T7 to 65T12, respectively.

As shown in FIG. 9D, conductor layers 661 and 662 are formed on the patterned surface of the sixteenth dielectric layer 66. The conductor layers 661 and 662 are used for forming the capacitors C2A and C2B, respectively. Further, through holes 66T3, 66T4, 66T7, 66T8, 66T9, 66T10, 66T11 and 66T12 are formed in the dielectric layer 66. The through holes 66T11 and 66T12 are used for forming the inductors L2A and L2B, respectively. The through holes 65T3, 65T4 and 65T9 to 65T12 shown in FIG. 9C are connected to the through holes 66T3, 66T4 and 66T9 to 66T12, respectively. The through hole 66T7 is connected to the conductor layer 661 and to the through hole 65T7 shown in FIG. 9C. The through hole 66T8 is connected to the conductor layer 662 and to the through hole 65T8 shown in FIG. 9C.

Figure 10A:
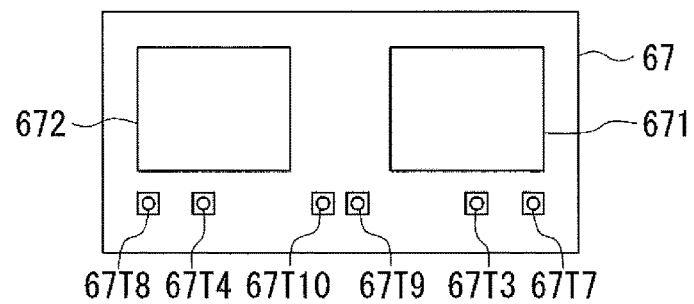
FIG. 10A to FIG. 10D are explanatory diagrams illustrating the respective patterned surfaces of the seventeenth to twentieth dielectric layers of the stack included in the directional coupler shown in FIG. 3.
Figure 11A:
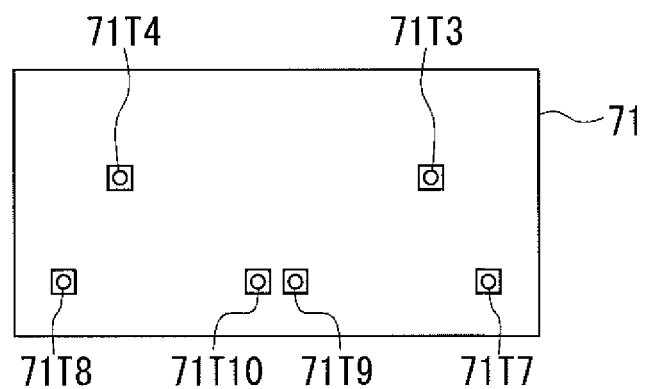
FIG. 11A to FIG. 11C are explanatory diagrams illustrating the respective patterned surfaces of the twenty-first to twenty-third dielectric layers of the stack included in the directional coupler shown in FIG. 3.
Figure 11B:
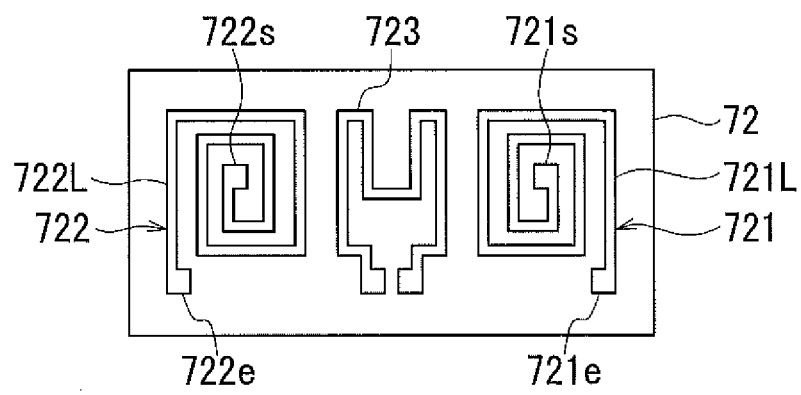
Figure 11C:
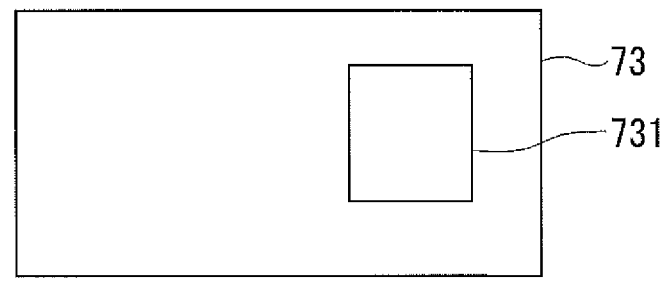

As shown in FIG. 10A, conductor layers 671 and 672 are formed on the patterned surface of the seventeenth dielectric layer 67. The conductor layer 671 is used for forming the capacitors C1A and C2A. The conductor layer 672 is used for forming the capacitors C1B and C2B. Further, through holes 67T3, 67T4, 67T7, 67T8, 67T9 and 67T10 are formed in the dielectric layer 67. The through holes 66T3, 66T4 and 66T7 to 66T10 shown in FIG. 9D are connected to the through holes 67T3, 67T4 and 67T7 to 67T10, respectively. The through hole 66T11 shown in FIG. 9D is connected to the conductor layer 671. The through hole 66T12 shown in FIG. 9D is connected to the conductor layer 672.

Figure 10B:
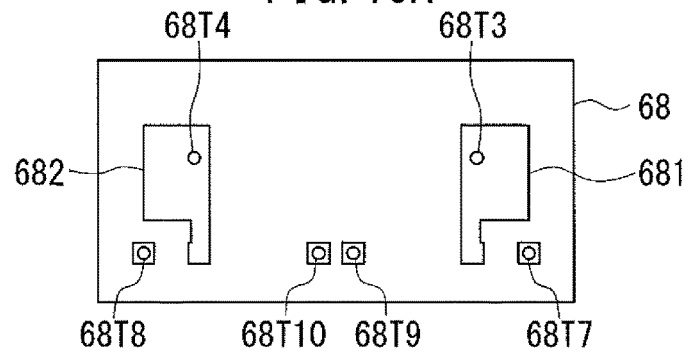

As shown in FIG. 10B, conductor layers 681 and 682 are formed on the patterned surface of the eighteenth dielectric layer 68. The conductor layers 681 and 682 are used for forming the capacitors C1A and C1B, respectively. Further, through holes 68T3, 68T4, 68T7, 68T8, 68T9 and 68T10 are formed in the dielectric layer 68. The through hole 67T3 shown in FIG. 10A and the through hole 68T3 are connected to the conductor layer 681. The through hole 67T4 shown in FIG. 10A and the through hole 68T4 are connected to the conductor layer 682. The through holes 67T7 to 67T10 shown in FIG. 10A are connected to the through holes 68T7 to 68T10, respectively.

Figure 10C:
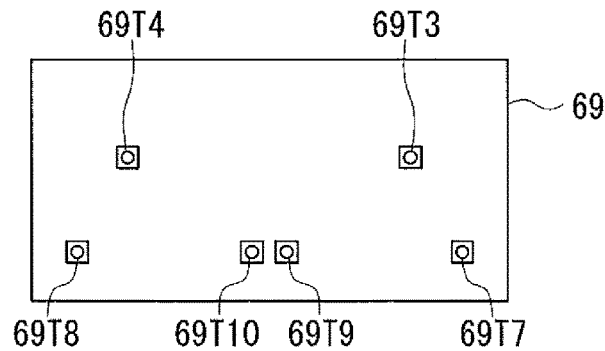

As shown in FIG. 10C, through holes 69T3, 69T4, 69T7, 69T8, 69T9 and 69T10 are formed in the nineteenth dielectric layer 69. The through holes 68T3, 68T4 and 68T7 to 68T10 shown in FIG. 10B are connected to the through holes 69T3, 69T4 and 69T7 to 69T10, respectively.

Figure 10D:
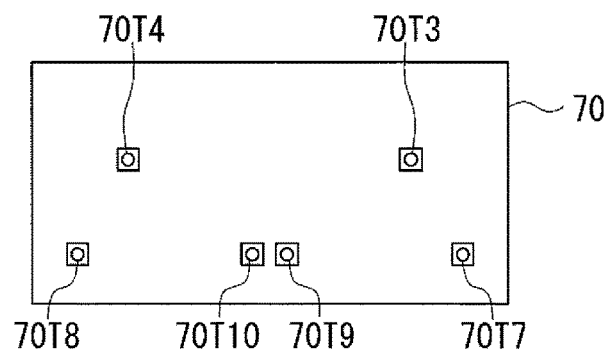

As shown in FIG. 10D, through holes 70T3, 70T4, 70T7, 70T8, 70T9 and 70T10 are formed in the twentieth dielectric layer 70. The through holes 69T3, 69T4 and 69T7 to 69T10 shown in FIG. 10C are connected to the through holes 70T3, 70T4 and 70T7 to 70T10, respectively.

As shown in FIG. 11A, through holes 71T3, 71T4, 71T7, 71T8, 71T9 and 71T10 are formed in the twenty-first dielectric layer 71. The through holes 70T3, 70T4 and 70T7 to 70T10 shown in FIG. 10D are connected to the through holes 71T3, 71T4 and 71T7 to 71T10, respectively.

As shown in FIG. 11B, inductor-forming layers 721 and 722 and a conductor layer 723 are formed on the patterned surface of the twenty-second dielectric layer 72. The inductor-forming layers 721 and 722 are conductor layers used for forming the inductors L1A and L1B, respectively. The conductor layer 723 is used for forming the third matching section 30C, and has a first end and a second end.

Now, the inductor-forming layers 721 and 722 will be described in detail. Each of the inductor-forming layers 721 and 722 includes two connection portions for electrical connection to respective other elements, and a line portion connecting the two connection portions. The two connection portions of the inductor-forming layer 721 will be denoted by symbols 721$s$ and 721$e$. The line portion of the inductor-forming layer 721 will be denoted by symbol 721L. The two connection portions of the inductor-forming layer 722 will be denoted by symbols 722$s$ and 722$e$. The line portion of the inductor-forming layer 722 will be denoted by symbol 722L. The inductor-forming layers 721 and 722 are each spiral-shaped.

The through hole 71T3 shown in FIG. 11A is connected to the connection portion 721$s$ of the inductor-forming layer 721. The through hole 71 T4 shown in FIG. 11A is connected to the connection portion 722$s$ of the inductor-forming layer 722. The through hole 71T7 shown in FIG. 11A is connected to the connection portion 721e of the inductor-forming layer 721. The through hole 71T8 shown in FIG. 11A is connected to the connection portion 722e of the inductor-forming layer 722. The through hole 71T9 shown in FIG. 11A is connected to a portion of the conductor layer 723 near the first end thereof. The through hole 71T10 shown in FIG. 11A is connected to a portion of the conductor layer 723 near the second end thereof.

As shown in FIG. 11C, a mark 731 is formed on the patterned surface of the twenty-third dielectric layer 73.

The stack 50 shown in FIG. 3 is formed by stacking the first to twenty-third dielectric layers 51 to 73 such that the patterned surface of the first dielectric layer 51 also serves as the bottom surface 50B of the stack 50.

FIG. 4 shows the interior of the stack 50. FIG. 5 shows a cross section of the stack 50 as viewed from the side surface 50D.

Correspondences of the circuit components of the directional coupler 1 shown in FIG. 1 with the components inside the stack 50 shown in FIG. 6A to FIG. 11C will now be described. The main line 10 is formed of the conductor layer 581 shown in FIG. 7D. The conductor layer 581 has a first surface facing toward the same direction as the patterned surface of the dielectric layer 58, and a second surface opposite to the first surface. The first surface of the conductor layer 581 includes a first portion and a second portion. The second surface of the conductor layer 581 includes a third portion and a fourth portion.

A portion of the conductor layer 551 shown in FIG. 7A is opposed to the first portion of the first surface of the conductor layer 581 with the dielectric layers 55 to 57 interposed therebetween. A portion of the conductor layer 552 shown in FIG. 7A is opposed to the second portion of the first surface of the conductor layer 581 with the dielectric layers 55 to 57 interposed therebetween. The first subline section 20A is formed of the aforementioned portion of the conductor layer 551. The second subline section 20B is formed of the aforementioned portion of the conductor layer 552.

A portion of the conductor layer 611 shown in FIG. 8C is opposed to the third portion of the second surface of the conductor layer 581 with the dielectric layers 58 to 60 interposed therebetween. A portion of the conductor layer 612 shown in FIG. 8C is opposed to the fourth portion of the second surface of the conductor layer 581 with the dielectric layers 58 to 60 interposed therebetween. The third subline section 20C is formed of the aforementioned portion of the conductor layer 611. The fourth subline section 20D is formed of the aforementioned portion of the conductor layer 612.

The inductor L1A of the first matching section 30A is formed only of the inductor-forming layer 721 shown in FIG. 11B. The connection portion 721s of the inductor-forming layer 721 is connected to the conductor layer 551 forming the first subline section 20A via the through holes 55T3, 56T3, 57T3, 58T3, 59T3, 60T3, 61T3, 62T3, 63T3, 64T3, 65T3, 66T3 and 67T3, the conductor layer 681, and the through holes 68T3, 69T3, 70T3 and 71T3. The connection portion 721e of the inductor-forming layer 721 is connected to the conductor layer 611 forming the third subline section 20C via the through holes 61T7, 62T7, 63T7, 64T7, 65T7, 66T7, 67T7, 68T7, 69T7, 70T7 and 71T7.

The capacitor C1A of the first matching section 30A is formed of the conductor layers 671 and 681 shown in FIG. 10A and FIG. 10B, and the dielectric layer 67 interposed between the conductor layers 671 and 681. The conductor layer 681 is connected to the conductor layer 551 forming the first subline section 20A via the through holes 55T3, 56T3, 57T3, 58T3, 59T3, 60T3, 61T3, 6213, 63T3, 64T3, 65T3, 66T3 and 67T3.

The capacitor C2A of the first matching section 30A is formed of the conductor layers 661 and 671 shown in FIG. 9D and FIG. 10A, and the dielectric layer 66 interposed between the conductor layers 661 and 671. The conductor layer 661 is connected to the conductor layer 611 forming the third subline section 20C via the through holes 61T7, 62T7, 63T7, 64T7 and 65T7.

The inductor L2A of the first matching section 30A is formed of the through holes 64T11, 65T11 and 66T11 shown in FIG. 9B to FIG. 9D. The through hole 66T11 is connected to the conductor layer 671 shown in FIG. 10A. The through hole 64T11 is connected to the ground conductor layer 641.

The inductor L1B of the second matching section 30B is formed only of the inductor-forming layer 722 shown in FIG. 11B. The connection portion 722s of the inductor-forming layer 722 is connected to the conductor layer 552 forming the second subline section 20B via the through holes 55T4, 56T4, 57T4, 58T4, 59T4, 60T4, 61T4, 62T4, 63T4, 64T4, 65T4, 66T4 and 67T4, the conductor layer 682, and the through holes 68T4, 69T4, 70T4 and 71T4. The connection portion 722e of the inductor-forming layer 722 is connected to the conductor layer 612 forming the fourth subline section 20D via the through holes 61T8, 62T8, 63T8, 64T8, 65T8, 66T8, 67T8, 68T8, 69T8, 70T8 and 71T8.

The capacitor C1B of the second matching section 30B is formed of the conductor layers 672 and 682 shown in FIG. 10A and FIG. 10B, and the dielectric layer 67 interposed between the conductor layers 672 and 682. The conductor layer 682 is connected to the conductor layer 552 forming the second subline section 20B via the through holes 55T4, 56T4, 57T4, 58T4, 59T4, 60T4, 61T4, 62T4, 63T4, 64T4, 65T4, 66T4 and 67T4.

The capacitor C2B of the second matching section 30B is formed of the conductor layers 662 and 672 shown in FIG. 9D and FIG. 10A, and the dielectric layer 66 interposed between the conductor layers 662 and 672. The conductor layer 662 is connected to the conductor layer 612 forming the fourth subline section 20D via the through holes 61T8, 62T8, 63T8, 64T8 and 65T8.

The inductor L2B of the second matching section 30B is formed of the through holes 64T12, 65T12 and 66T12 shown in FIG. 9B to FIG. 9D. The through hole 66T12 is connected to the conductor layer 672 shown in FIG. 10A. The through hole 64T12 is connected to the ground conductor layer 641.

The third matching section 30C is formed of the conductor layer 723 shown in FIG. 11B. The portion of the conductor layer 723 near the first end thereof is connected to the conductor layer 611 forming the third subline section 20C via the through holes 61T9, 62T9 and 63T9, the conductor layer 642, and the through holes 64T9, 65T9, 66T9, 67T9, 68T9, 69T9, 70T9 and 71T9. The portion of the conductor layer 723 near the second end thereof is connected to the conductor layer 612 forming the fourth subline section 20D via the through holes 61T10, 62T10 and 63T10, the conductor layer 643, and the through holes 64T10, 65T10, 66T10, 67T10, 68T10, 69T10, 70T10 and 71T10.

In the stack 50, the ground conductor layer 641 connected to the ground is interposed between the conductor layer 681 forming the main line 10 and the conductor layers forming the first to third matching sections 30A, 30B and 30C. Thus, the first to third matching sections 30A, 30B and 30C are not configured to be electromagnetically coupled to the main line 10.

The ground conductor layer 531 shown in FIG. 6C has the function of adjusting the impedance of each of the first and second subline sections 20A and 20B to a desired value. The ground conductor layer 641 shown in FIG. 9B has the function of adjusting the impedance of each of the third and fourth subline sections 20C and 20D to a desired value.

The structural features of the first and second matching sections 30A and 30B in the stack 50 will now be described. The plurality of conductor layers of the stack 50 include one or more inductor-forming layers which are one or more conductor layers used to form the first inductor L1A of the first matching section 30A, and another one or more inductor-forming layers which are one or more conductor layers used to form the first inductor L1B of the second matching section 30B. In the first embodiment, the first inductor L1A is formed only of the inductor-forming layer 721 having a spiral shape, and the first inductor L1B is formed only of the inductor-forming layer 722 having a spiral shape.

The inductor-forming layer 721 includes the two connection portions 721s and 721e for electrical connection to respective other elements, and the line portion 721L connecting the two connection portions 721s and 721e. Likewise, the inductor-forming layer 722 includes the two connection portions 722s and 722e for electrical connection to respective other elements, and the line portion 722L connecting the two connection portions 722s and 722e.

The entirety of the first inductor L1A excluding the connection portions 721s and 721e does not include portions that overlap each other when viewed in the stacking direction T. Likewise, the entirety of the first inductor L1B excluding the connection portions 722s and 722e does not include portions that overlap each other when viewed in the stacking direction T.

The first inductor L1A is located closer to the top surface 50A than are the first and second capacitors C1A and C2A, the second inductor L2A, the main line 10 and the subline sections 20A, 20B, 20C and 20D. The second inductor L2A is located closer to the bottom surface 50B than are the first and second capacitors C1A and C2A.

Likewise, the first inductor L1B is located closer to the top surface 50A than are the first and second capacitors C1B and C2B, the second inductor L2B, the main line 10 and the subline sections 20A, 20B, 20C and 20D. The second inductor L2B is located closer to the bottom surface 50B than are the first and second capacitors C1B and C2B.

The directional coupler 1 according to the first embodiment makes it possible to reduce a change in coupling in response to a change in frequency over a wide frequency band. This will be described in detail below.

Of the directional coupler 1, the portion made up of the third coupling section 40C, the fourth coupling section 40D and the third matching section 30C can be said to constitute a directional coupler made up of two coupling sections and a single matching section. In the following description, the portion made up of the third coupling section 40C, the fourth coupling section 40D and the third matching section 30C will be referred to as the coupler portion. The directional coupler 1 can be said to broadly include the coupler portion, the first and second coupling sections 40A and 40B, and the first and second matching sections 30A and 30B. The characteristics of these components will now be described.

Figure 12:
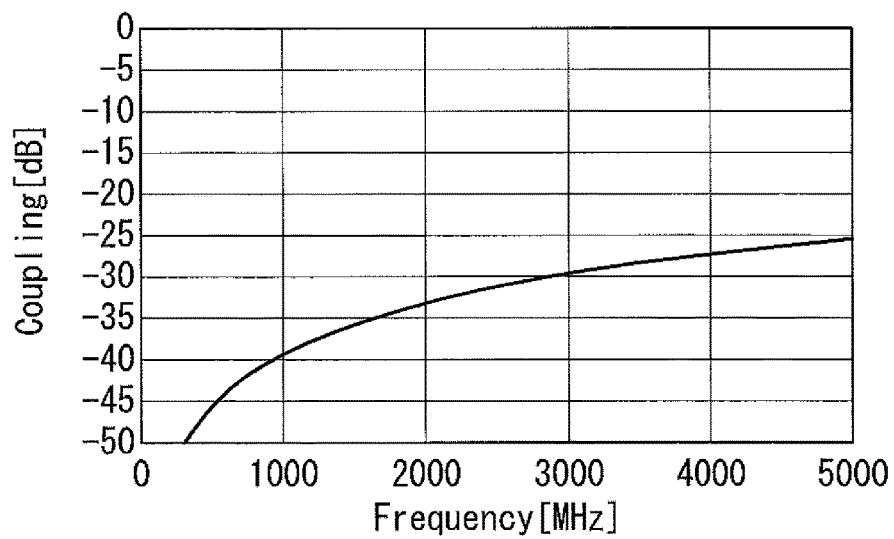
FIG. 12 is a characteristic diagram illustrating the frequency response of the coupling of each of the first and second coupling sections alone in the first embodiment of the invention.

FIG. 12 illustrates the frequency response of the coupling of each of the first and second coupling sections 40A and 40B alone. In FIG. 12, the horizontal axis represents frequency, and the vertical axis represents coupling. As shown in FIG. 12. the coupling of each of the first and second coupling sections 40A and 40B alone increases with increasing frequency. Although not illustrated, the coupling of each of the third and fourth coupling sections 40C and 40D alone also increases with increasing frequency. The coupling of each of the third and fourth coupling sections 40C and 40D alone is higher than the coupling of each of the first and second coupling sections 40A and 40B alone. At a frequency of 2000 MHz, the coupling of each of the third and fourth coupling sections 40C and 40D alone is preferably higher than the coupling of each of the first and second coupling sections 40A and 40B alone by 5 dB or more.

Now, the amount by which each of the matching sections 30A, 30B and 30C changes the phase of the signal passing therethrough will be referred to as the amount of phase change. The amount of phase change is expressed in negative values because each of the matching sections 30A, 30B and 30C causes a phase delay of the signal passing therethrough. It can be said that the larger the absolute value of the amount of phase change, the greater is the change caused by each of the matching sections 30A, 30B and 30C in the phase of the signal passing therethrough.

Each of the first and second matching sections 30A and 30B is formed using the first and second inductors and the first and second capacitors. The first and second matching sections 30A and 30B are capable of passing high frequency signals over a wider frequency band when compared with low-pass filters.

Now, we will discuss a case where the first inductor has a stray capacitance. U.S. Pat. No. 9,077,061 B2 discloses a method for forming an inductor by using a stack. According to the method, a plurality of conductor layers located at different positions in the stacking direction are connected in series via one or more through holes to form an inductor. To form an inductor by this method, the plurality of conductor layers are typically arranged to overlap each other when viewed in the stacking direction. In this case, capacitance is generated between every adjacent conductor layers, and as a result, the inductor will have a large stray capacitance. The inductor will also have a large stray capacitance if a relatively large conductor layer is present near one or more conductor layers that form the inductor.

If the first inductor in each of the first and second matching sections 30A and 30B has a stray capacitance, the characteristics of each of the first and second matching sections 30A and 30B differ from desired characteristics. This will be described with reference to FIG. 13 to FIG. 16.

Figure 13:
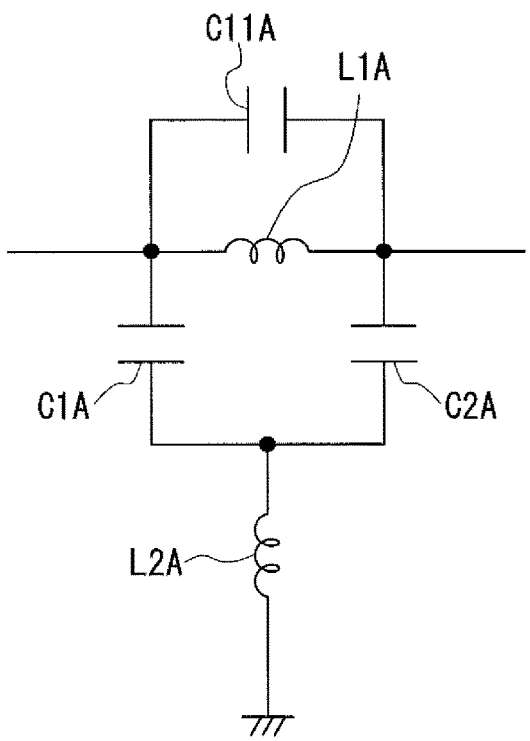
FIG. 13 is a circuit diagram illustrating a matching section of a first comparative example.

FIG. 13 illustrates a matching section of a first comparative example. The matching section of the first comparative example is configured by adding a stray capacitance C11A of the inductor L1A to the first matching section 30A. The stray capacitance C11A is connected to the first inductor L1A in parallel.

Figure 14:
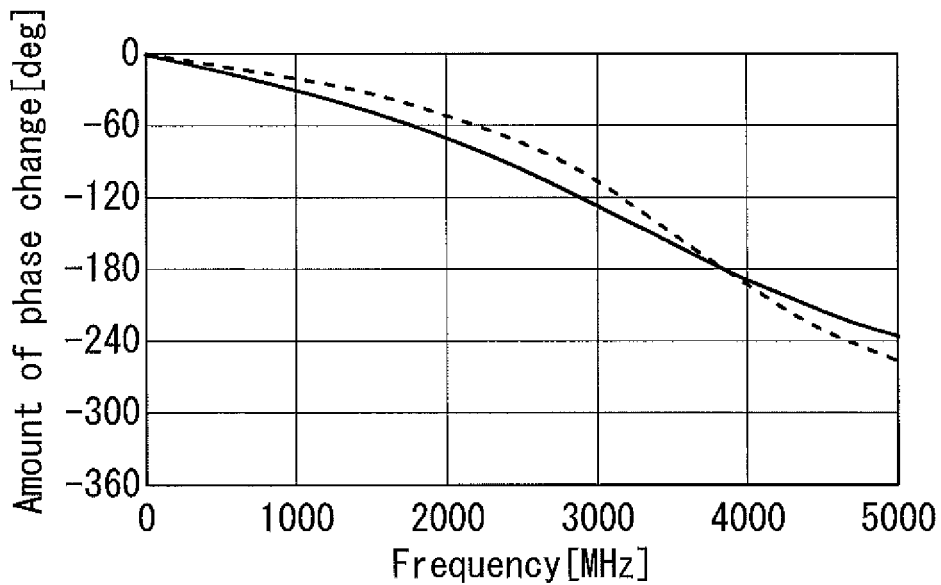
FIG. 14 is a characteristic diagram illustrating the frequency response of the amount of phase change caused by each of a first matching section of the first embodiment of the invention and the matching section of the first comparative example.

FIG. 14 illustrates the frequency response of the amount of phase change caused by each of the first matching section 30A and the matching section of the first comparative example. In FIG. 14 the horizontal axis represents frequency, and the vertical axis represents the amount of phase change. Further, in FIG. 14 the solid line represents the frequency response for the first matching section 30A, and the broken line represents the frequency response for the matching section of the first comparative example.

Figure 15:
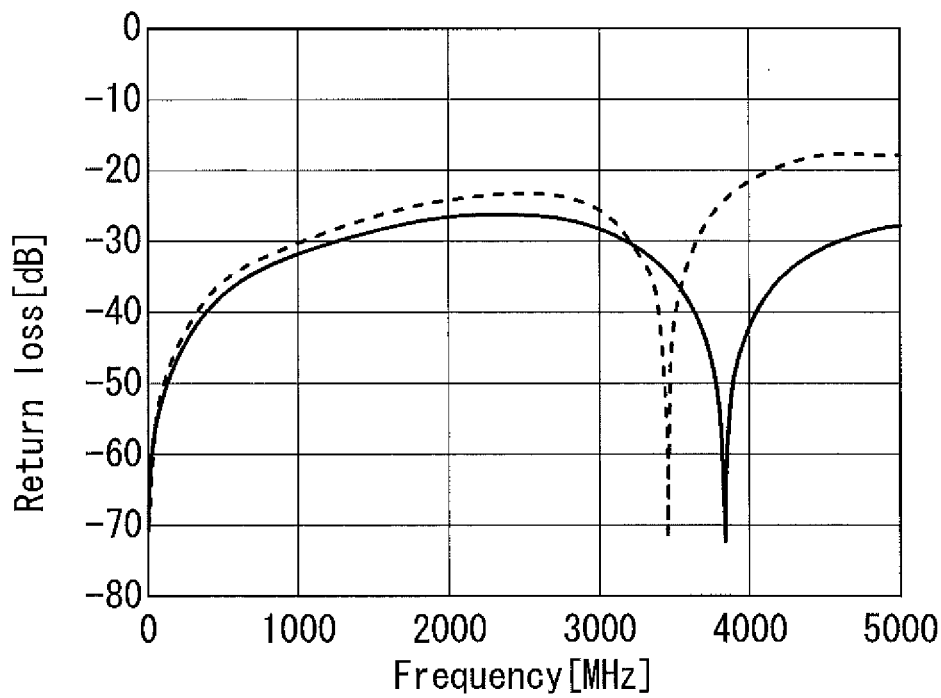
FIG. 15 is a characteristic diagram illustrating the frequency response of the return loss of each of the first matching section of the first embodiment of the invention and the matching section of the first comparative example.

FIG. 15 illustrates the frequency response of the return loss of each of the first matching section 30A and the matching section of the first comparative example. In FIG. 15 the horizontal axis represents frequency, and the vertical axis represents return loss. Further, in FIG. 15 the solid line represents the frequency response for the first matching section 30A, and the broken line represents the frequency response for the matching section of the first comparative example.

Figure 16:
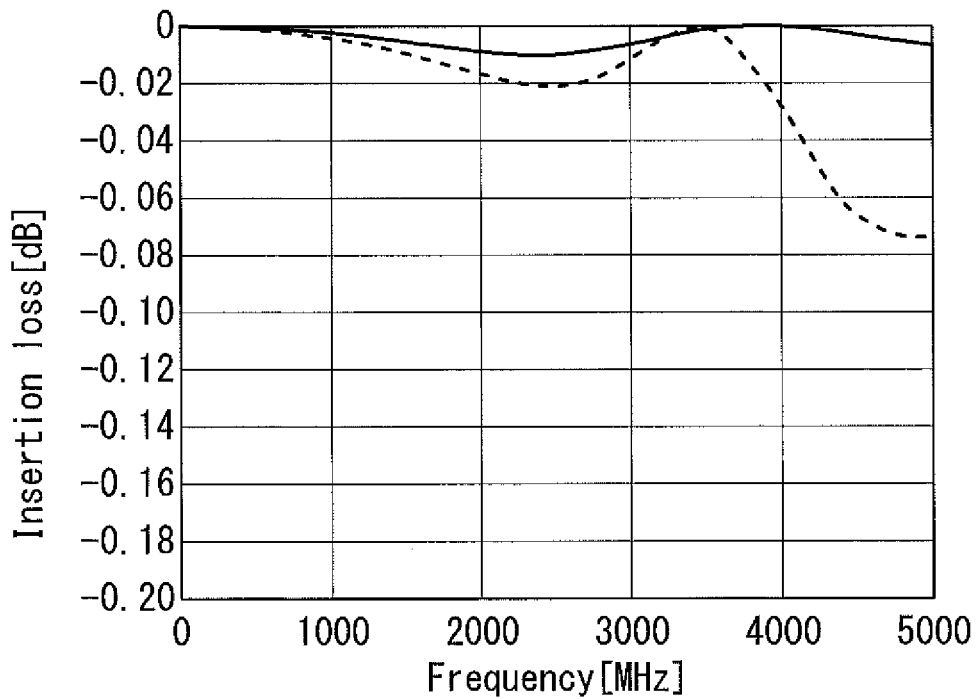
FIG. 16 is a characteristic diagram illustrating the frequency response of the insertion loss of each of the first matching section of the first embodiment of the invention and the matching section of the first comparative example.

FIG. 16 illustrates the frequency response of the insertion loss of each of the first matching section 30A and the matching section of the first comparative example. In FIG. 16 the horizontal axis represents frequency, and the vertical axis represents insertion loss. Further, in FIG. 16 the solid line represents the frequency response for the first matching section 30A, and the broken line represents the frequency response for the matching section of the first comparative example.

If the first inductor L1A has the stray capacitance C11A, the characteristics of the first matching section 30A change from the desired characteristics shown by the solid lines in FIGS. 14-16 to the characteristics of the matching section of the first comparative example shown by the broken lines in FIGS. 14-16. A particular concern raised by the stray capacitance C11A of the first inductor L1A is that the frequency response of the amount of phase change caused by the first matching section 30A undergoes the following changes. As shown in FIG. 14, if the first inductor L1A has the stray capacitance C11A, the absolute value of the amount of phase change becomes smaller than a desired value in a frequency region lower than the frequency at which the absolute value of the amount of phase change is 180 degrees, and becomes larger than the desired value in a frequency region higher than the frequency at which the absolute value of the amount of phase change is 180 degrees.

The second matching section 30B has the same or almost the same characteristics as the first matching section 30A. As is the case with the first matching section 30A, if the first inductor L1B in the second matching section 30B has a stray capacitance, the characteristics of the second matching section 30B change from the desired characteristics to the characteristics of the matching section of the first comparative example. As will be shown later, if the first inductor in each of the first and second matching sections 30A and 30B has a stray capacitance, the directional coupler 1 has a reduced effect of reducing a change in coupling in response to a change in frequency.

Figure 17:
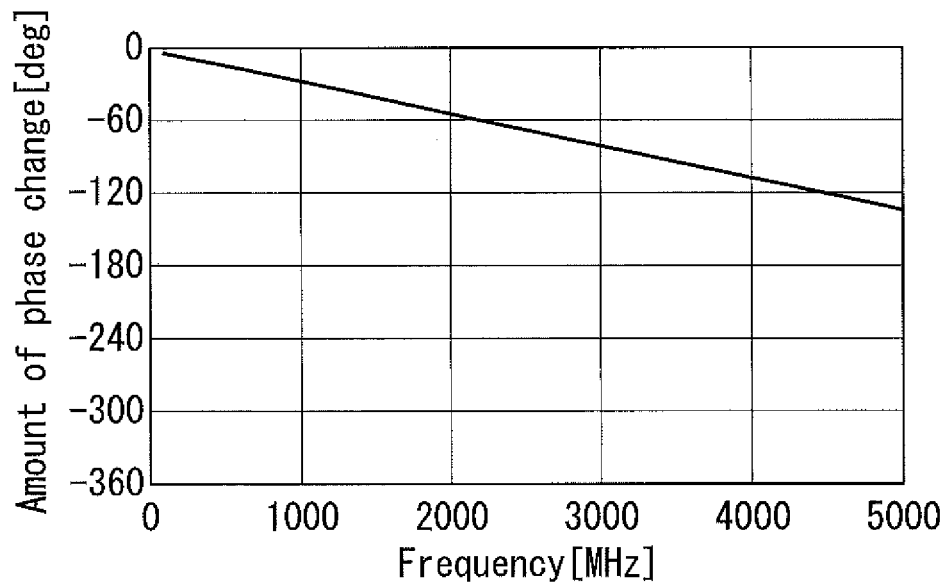
FIG. 17 is a characteristic diagram illustrating the frequency response of the amount of phase change caused by a third matching section of the first embodiment of the invention.

FIG. 17 illustrates the frequency response of the amount of phase change caused by the third matching section 30C. In FIG. 17 the horizontal axis represents frequency, and the vertical axis represents the amount of phase change. As shown in FIG. 14 and FIG. 17, the third matching section 30C causes a smaller change in the phase of a signal passing therethrough than the change caused by each of the first and second matching sections 30A and 30B given that signals passing therethrough have the same frequency. In other words, for the third matching section 30C, the absolute value of the amount of phase change becomes 180 degrees at a higher frequency when compared with the first and second matching sections 30A and 30B. In the example shown in FIG. 14, for each of the first and second matching sections 30A and 30B, the absolute value of the amount of phase change becomes 180 degrees at a frequency of approximately 3800 MHz, whereas for the third matching section 30C, the absolute value of the amount of phase change becomes 180 degrees at a frequency above 5000 MHz. At a frequency of 2000 MHz, the absolute value of the amount of phase change caused by each of the first and second matching sections 30A and 30B and the absolute value of the amount of phase change caused by the third matching section 30C preferably differ by 10 degrees or more.

Figure 18:
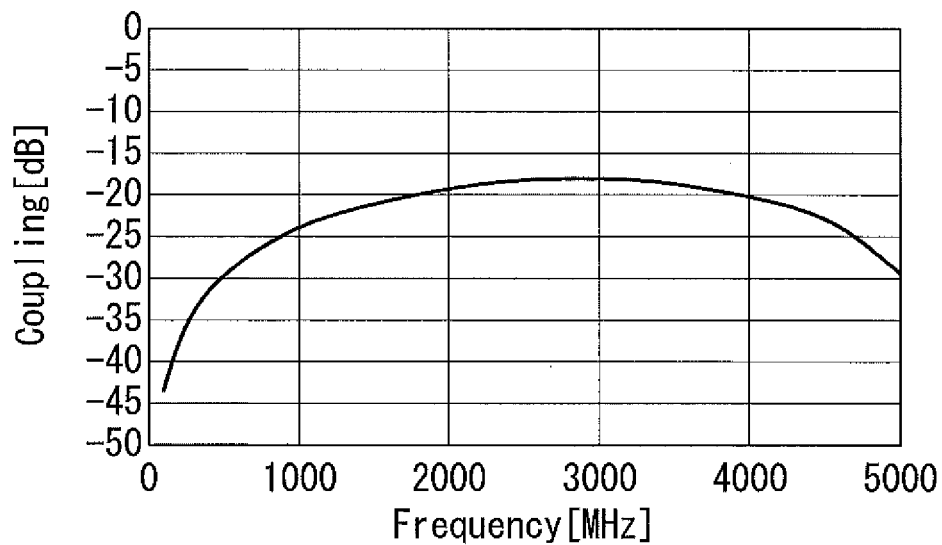
FIG. 18 is a characteristic diagram illustrating the frequency response of the coupling of a coupler portion, which is a portion of the directional coupler according to the first embodiment of the invention.

FIG. 18 illustrates the frequency response of the coupling of the aforementioned coupler portion made up of the third coupling section 40C, the fourth coupling section 40D and the third matching section 30C. In FIG. 18 the horizontal axis represents frequency, and the vertical axis represents coupling. In the first mode of use, two signal paths are formed between the input port and the coupling port in the coupler portion. The input port is the first port 11, and the coupling port is the first end 20C1 of the third subline section 20C. One of the two signal paths runs through the third coupling section 40C, and the other runs through the fourth coupling section 40D and the third matching section 30C.

As shown in FIG. 18, the coupling of the coupler portion increases with increasing frequency up to approximately 3000 MHz, and decreases with increasing frequency in a frequency range from approximately 3000 MHz to 5000 MHz. This is because, with increasing frequency in the frequency range shown on the horizontal axis of FIG. 18, the coupling of each of the third and fourth coupling sections 40C and 40D alone increases, and on the other hand, the absolute value of the amount of phase change caused by the third matching section 30C becomes closer to 180 degrees. The closer to 180 degrees is the absolute value of the amount of phase change caused by the third matching section 30C, the greater is the degree to which a signal having passed through the signal path running through the third coupling section 40C and a signal having passed through the signal path running through the fourth coupling section 40D and the third matching section 30C cancel each other out. Thus, a change in the coupling of the coupler portion in response to a change in frequency is reduced.

A directional coupler configured by adding a stray capacitance of the first inductor to each of the first and second matching sections 30A and 30B in the directional coupler 1 will be referred to as a directional coupler of a first comparative example.

Figure 19:
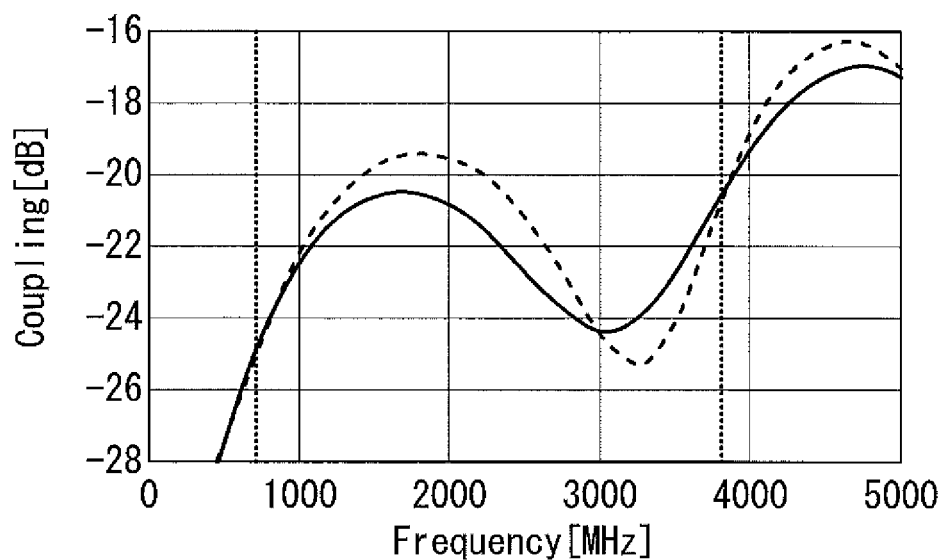
FIG. 19 is a characteristic diagram illustrating the frequency response of the coupling of each of the directional coupler according to the first embodiment of the invention and a directional coupler of a first comparative example.
Figure 20:
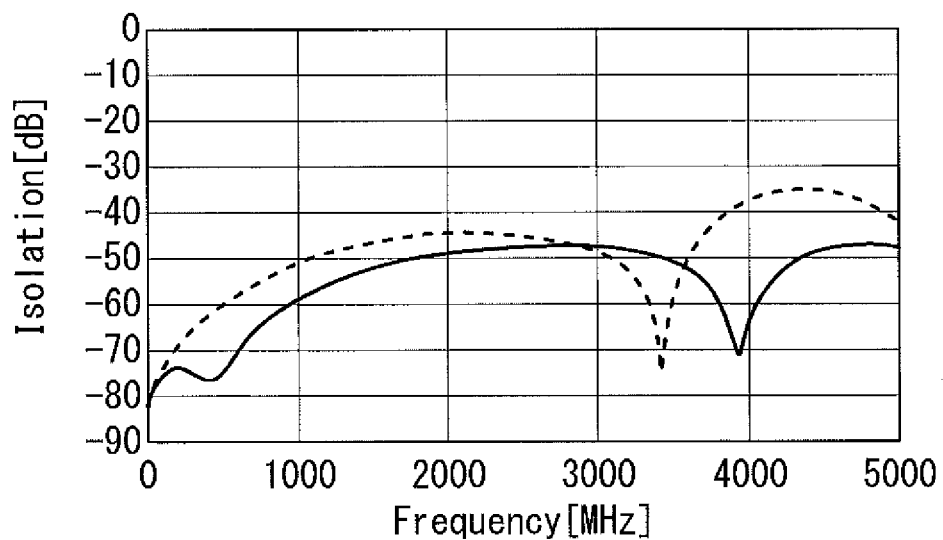
FIG. 20 is a characteristic diagram illustrating the frequency response of the isolation of each of the directional coupler according to the first embodiment of the invention and the directional coupler of the first comparative example.
Figure 21:
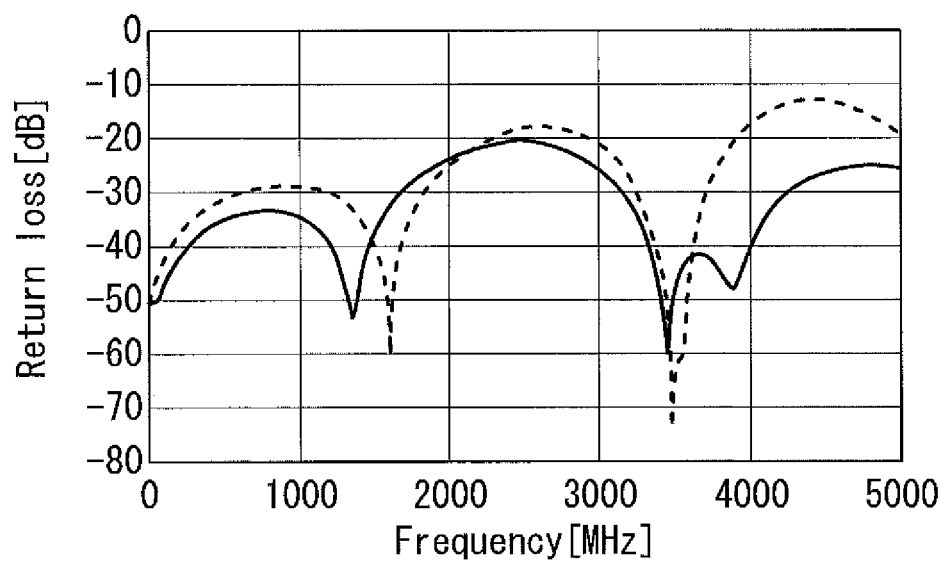
FIG. 21 is a characteristic diagram illustrating the frequency response of the return loss at the coupling port of each of the directional coupler according to the first embodiment of the invention and the directional coupler of the first comparative example.

FIG. 19 to FIG. 21 illustrate an example of characteristics of the directional coupler 1 according to the first embodiment and the directional coupler of the first comparative example. In the example shown in FIG. 19 to FIG. 21, the service frequency band of the directional coupler 1 is 700 to 3800 MHz. In FIG. 19 the upper and lower limits of this service frequency band are shown by two dotted lines. The characteristics shown in FIG. 19 to FIG. 21 were determined by simulation. In each of FIG. 19 to FIG. 21, the solid line represents the characteristic of the directional coupler 1 used in the first mode of use, and the broken line represents the characteristic of the directional coupler of the first comparative example used in the first mode of use. In the simulation, the characteristic of the directional coupler 1 used in the second mode of use is the same as the characteristic of the directional coupler 1 used in the first mode of use, and the characteristic of the directional coupler of the first comparative example used in the second mode of use is the same as the characteristic of the directional coupler of the first comparative example used in the first mode of use.

FIG. 19 illustrates the frequency response of the coupling of each of the directional coupler 1 and the directional coupler of the first comparative example. In FIG. 19 the horizontal axis represents frequency, and the vertical axis represents coupling. If we let −c (dB) denote coupling, the directional coupler 1 exhibits a sufficiently large value of c, that is, 20 or above, in the service frequency band.

FIG. 20 illustrates the frequency response of the isolation of each of the directional coupler 1 and the directional coupler of the first comparative example. In FIG. 20 the horizontal axis represents frequency, and the vertical axis represents isolation. If we let −i (dB) denote isolation, the directional coupler 1 exhibits a sufficiently large value of i, that is, 45 or above, in the service frequency band.

FIG. 21 illustrates the frequency response of the return loss at the coupling port of each of the directional coupler 1 and the directional coupler of the first comparative example. In FIG. 21 the horizontal axis represents frequency, and the vertical axis represents return loss at the coupling port. If we let −r (dB) denote return loss at the coupling port, the directional coupler 1 exhibits a sufficiently large value of r, that is, 20 or above, in the service frequency band. This means that the reflection coefficient as viewed in the direction from one of the third and fourth ports 13 and 14 to the other has an absolute value of zero or near zero in the service frequency band.

As indicated by the solid line in FIG. 19, the frequency response of the coupling of the directional coupler 1 shows a reduced change in coupling in response to a change in frequency over a wide frequency range. In contrast, the frequency response of the coupling of the directional coupler of the first comparative example indicated by the broken line in FIG. 19 shows a greater change in coupling in response to a change in frequency when compared with the frequency response of the coupling of the directional coupler 1. This is due to the stray capacitance of the first inductor in each of the first and second matching sections 30A and 30B.

Now, a conceptual description will be given of the reason why the directional coupler 1 according to the first embodiment is able to reduce a change in coupling in response to a change in frequency over a wide frequency range. In the directional coupler 1, as mentioned previously, the coupling of each of the third and fourth coupling sections 40C and 40D alone is higher than the coupling of each of the first and second coupling sections 40A and 40B alone. Thus, the frequency response of the coupling of the directional coupler 1 depends greatly on the frequency response of the coupling of the coupler portion shown in FIG. 18.

In the directional coupler 1, a signal having passed through the first coupling section 40A and a signal having passed through the second coupling section 40B are combined with a signal having passed through the coupler portion under the respective phase relationships determined at the first matching section 30A and the second matching section 30B to form a coupling signal. The closer to 180 degrees is the absolute value of the amount of phase change caused by each of the first and second matching sections 30A and 30B, the greater is the degree to which the signal having passed through the first coupling section 40A and the signal having passed through the second coupling section 40B cancel out the signal having passed through the coupler portion. By virtue of such an operation, the frequency response of the coupling of the directional coupler 1 exhibits a reduced change in coupling in response to a change in frequency when compared with the frequency response of the coupling of the coupler portion shown in FIG. 18.

Further, for the third matching section 30C, the absolute value of the amount of phase change becomes 180 degrees at a higher frequency when compared with the first and second matching sections 30A and 30B. As a result, as shown in FIG. 18, the coupling of the coupler portion provides such a frequency response that a change in coupling in response to a change in frequency is reduced in a frequency range higher than the frequency at which the absolute value of the amount of phase change caused by each of the first and second matching sections 30A and 30B becomes 180 degrees. This makes it possible for the directional coupler 1 to reduce a change in coupling in response to a change in frequency even in a frequency range higher than the frequency at which the absolute value of the amount of phase change caused by each of the first and second matching sections 30A and 30B becomes 180 degrees. By virtue of such an operation, the directional coupler 1 is able to reduce a change in coupling in response to a change in frequency over a wide frequency range.

If the first inductor in each of the first and second matching sections 30A and 30B has a stray capacitance, as shown in FIG. 14, the absolute value of the amount of phase change caused by each of the first and second matching sections 30A and 30B gets farther away from 180 degrees than a desired value in both of frequency ranges higher than and lower than the frequency at which the absolute value of the amount of phase change becomes 180 degrees. This means a reduction in the degree to which a signal having passed through the first coupling section 40A and a signal having passed through the second coupling section 40B cancel out a signal having passed through the coupler portion. As a result, as shown by the broken line in FIG. 19, a change in coupling in response to a change in frequency increases.

As mentioned previously, when an inductor is formed using a stack, the inductor will have a large stray capacitance in the cases where a plurality of conductor layers that form the inductor are arranged to overlap each other when viewed in the stacking direction, and where a relatively large conductor layer is present near one or more conductor layers that form the inductor.

In the first embodiment, the entirety of the first inductor L1A excluding the connection portions 721s and 721e does not include portions that overlap each other when viewed in the stacking direction T. Likewise, the entirety of the first inductor L1B excluding the connection portions 722s and 722e does not include portions that overlap each other when viewed in the stacking direction T. By virtue of these features, the first embodiment makes it possible to prevent the first inductors L1A and L1B from having a large stray capacitance.

Further, in the first embodiment, the first inductor L1A is located closer to the top surface 50A than are the first and second capacitors C1A and C2A, the second inductor L2A, the main line 10 and the subline sections 20A, 20B, 20C and 20D. Likewise, the first inductor L1B is located closer to the top surface 50A than are the first and second capacitors C1B and C2B, the second inductor L2B, the main line 10 and the subline sections 20A, 20B, 20C and 20D. In other words, any conductor layer used for forming the directional coupler 1 is not present above the first inductors L1A and L1B. This also serves to prevent the first inductors L1A and L1B from having a large stray capacitance.

Further, in the first embodiment, the second inductor L2A is located closer to the bottom surface 50B than are the first and second capacitors C1A and C2A. Likewise, the second inductor L2B is located closer to the bottom surface 50B than are the first and second capacitors C1B and C2B. By virtue of these features, the first embodiment makes it possible to increase the distance between the first inductor L1A and the second inductor L2A, and the distance between the first inductor L1B and the second inductor L2B. This also serves to prevent the first inductors L1A and L1B from having a large stray capacitance.

As described above, the first embodiment makes it possible to prevent the first inductors L1A and L1B from having a large stray capacitance. As a result, it becomes possible to achieve a further reduction in a change in the coupling of the directional coupler 1 in response to a change in frequency.

Thus, the directional coupler 1 according to the first embodiment is wideband capable. The directional coupler 1 according to the first embodiment is usable for multiple signals in multiple frequency bands used in CA.

Further, as mentioned previously, the directional coupler 1 can have symmetric or approximately symmetric circuitry. This allows the directional coupler 1 to be bidirectional.

Further, in the first embodiment, given that signals having the same frequency pass through the first to third matching sections 30A, 30B and 30C, the third matching section 30C causes a smaller change in the phase of the signal passing therethrough than the change caused by each of the first and second matching sections 30A and 30B. The third matching section 30C can thus be formed easily, using a relatively short line. This makes it easier to construct the directional coupler 1 than in the case where the third matching section 30C is formed using a plurality of inductors and a plurality of capacitors like the first and second matching sections 30A and 30B.

Further, in the first embodiment, any conductor layer that may obstruct the passage of magnetic flux generated by the first inductors L1A and L1B is not present above the first inductors L1A and L1B. Thus, the first inductors L1A and L1B can have sufficiently large inductances even if they are small in size. This allows for miniaturization of the directional coupler 1.

The second inductor L2A in the first matching section 30A and the second inductor L2B in the second matching section 30B both have an inductance of 0.1 nH or higher. Typically, in a stack that is used to form an electronic component and includes a plurality of stacked dielectric layers and conductor layers, any conductor layer connected to the ground has a stray inductance lower than 0.1 nH. The inductance of each of the second inductors L2A and L2B, which is 0.1 nH or higher, is thus clearly distinguishable from the stray inductance.

In the first embodiment, the circuitry of the directional coupling 1 may not be completely symmetric but need only be approximately symmetric. The directional coupler 1 can be wideband capable and bidirectional even if the circuitry thereof is not completely symmetric. Necessary conditions and preferable conditions for satisfying the requirement that the circuitry of the directional coupler 1 be approximately symmetric are specifically as follows, for example.

The difference between the coupling of the first coupling section 40A and the coupling of the second coupling section 40B at a frequency of 2000 MHz needs to be 2 dB or less, and is preferably 1 dB or less. The difference between the amount of phase change caused by the first matching section 30A and the amount of phase change caused by the second matching section 30B at 2000 MHz needs to be 20 degrees or less, and is preferably 10 degrees or less, and more preferably 5 degrees or less. The difference between the coupling of the third coupling section 40C and the coupling of the fourth coupling section 40D at 2000 MHz needs to be 2 dB or less, and is preferably 1 dB or less.

[Second Embodiment]

Figure 22:
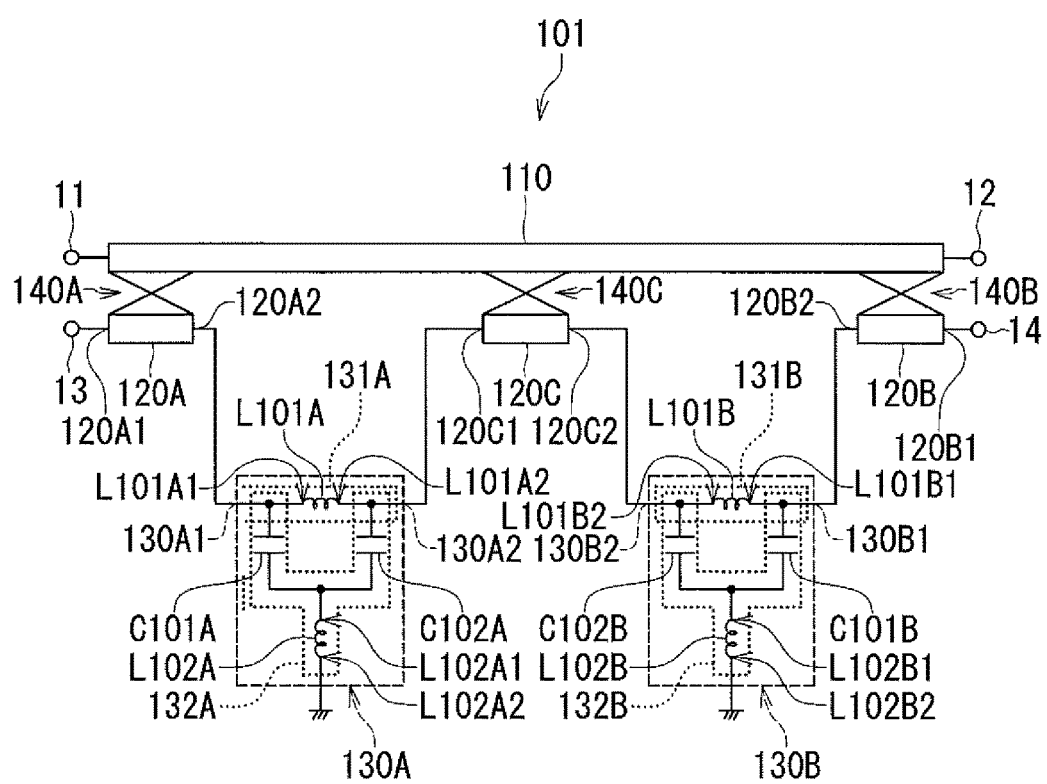
FIG. 22 is a circuit diagram illustrating the circuitry of a directional coupler according to a second embodiment of the invention.

A second embodiment of the invention will now be described. First, reference is made to FIG. 22 to describe the circuitry of a directional coupler according to the second embodiment. As shown in FIG. 22, the directional coupler 101 according to the second embodiment includes a first port 11, a second port 12, a third port 13, and a fourth port 14. One of the third and fourth ports 13 and 14 is grounded via a terminator 15 having a resistance of, for example, 50Ω.

The directional coupler 101 further includes: a main line 110 connecting the first port 11 and the second port 12; N subline sections each of which is formed of a line configured to be electromagnetically coupled to the main line 110; (N−1) matching section(s); and a stack for integrating the first to fourth ports 11 to 14, the main line 110, the N subline sections and the (N−1) matching section(s).

N is an integer of 2 or more. In the second embodiment, N is 3. Specifically, the directional coupler 101 includes a first subline section 120A, a second subline section 120B, a third subline section 120C, a first matching section 130A, and a second matching section 130B.

The first subline section 120A has a first end 120A1 and a second end 120A2 opposite to each other. The second subline section 120B has a first end 120B1 and a second end 120B2 opposite to each other. The third subline section 120C has a first end 120C1 and a second end 120C2 opposite to each other. The first matching section 130A has a first end 130A1 and a second end 130A2 opposite to each other. The second matching section 130B has a first end 130B1 and a second end 130B2 opposite to each other.

The first end 120A1 of the first subline section 120A is connected to the third port 13. The first matching section 130A is provided between the second end 120A2 of the first subline section 120A and the first end 120C1 of the third subline section 120C. The first end 130A1 of the first matching section 130A is connected to the second end 120A2 of the first subline section 120A. The first end 120C1 of the third subline section 120C is connected to the second end 130A2 of the first matching section 130A.

The first end 120B1 of the second subline section 120B is connected to the fourth port 14. The second matching section 130B is provided between the second end 120B2 of the second subline section 120B and the second end 120C2 of the third subline section 120C. The first end 130B1 of the second matching section 130B is connected to the second end 120B2 of the second subline section 120B. The second end 120C2 of the third subline section 120C is connected to the second end 130B2 of the second matching section 130B.

The first matching section 130A includes a first path 131A connecting the first end 130A1 and the second end 130A2, and a second path 132A connecting the first path 131A to the ground. The first path 131A includes a first inductor L101A. The first inductor L101A has a first end L101A1 and a second end L101A2 opposite to each other. Here, of the two ends of the first inductor L101A, the first end L101A1 is taken as the end closer to the first subline section 120A, whereas the second end L101A2 is taken as the end closer to the third subline section 120C.

The second path 132A includes a first capacitor C101A and a second inductor L102A connected in series. The second inductor L102A has a first end L102A1 and a second end L102A2. In terms of circuitry, the first end L102A1 is closest to the first path 131A, and the second end L102A2 is closest to the ground. The first capacitor C101A is provided between the first end L101A1 of the first inductor L101A and the first end L102A1 of the second inductor L102A. In the second embodiment, the second path 132A further includes a second capacitor C102A provided between the second end L101A2 of the first inductor L101A and the first end L102A1 of the second inductor L102A. The second inductor L102A has an inductance of 0.1 nH or higher. The inductance of the second inductor L102A is preferably not higher than 7 nH.

The circuitry of the second matching section 130B is similar to that of the first matching section 130A. More specifically, the second matching section 130B includes a first path 131B connecting the first end 130B1 and the second end 130B2, and a second path 132B connecting the first path 131B to the ground. The first path 131B includes a first inductor L101B. The first inductor L101B has a first end L101B and a second end L101B2 opposite to each other. Here, of the two ends of the first inductor L101B, the first end L101B is taken as the end closer to the second subline section 120B, whereas the second end L101B2 is taken as the end closer to the third subline section 120C.

The second path 132B includes a first capacitor C101B and a second inductor L102B connected in series. The second inductor L102B has a first end L102B1 and a second end L102B2. In terms of circuitry, the first end L102B1 is closest to the first path 131B, and the second end L102B2 is closest to the ground. The first capacitor C101B is provided between the first end L101B1 of the first inductor L101B and the first end L102B1 of the second inductor L102B. In the second embodiment, the second path 132B further includes a second capacitor C102B provided between the second end L101B2 of the first inductor L101B and the first end L102B1 of the second inductor L102B. The second inductor L102B has an inductance of 0.1 nH or higher. The inductance of the second inductor L102B is preferably not higher than 7 nH.

Here, a combination of respective portions of the main line 110 and the first subline section 120A coupled to each other will be referred to as the first coupling section 140A. A combination of respective portions of the main line 110 and the second subline section 120B coupled to each other will be referred to as the second coupling section 140B. A combination of respective portions of the main line 110 and the third subline section 130C coupled to each other will be referred to as the third coupling section 140C.

The strengths of coupling of the first to third coupling sections 140A, 140B and 140C will be defined as follows. The strength of coupling of the first coupling section 140A is the strength of coupling of the first subline section 120A to the main line 110. The strength of coupling of the first coupling section 140A is expressible in terms of the coupling of the first coupling section 140A alone. The higher the coupling of the first coupling section 140A alone, the higher the strength of coupling of the first coupling section 140A.

The strength of coupling of the second coupling section 140B is the strength of coupling of the second subline section 120B to the main line 110. The strength of coupling of the second coupling section 140B is expressible in terms of the coupling of the second coupling section 140B alone. The higher the coupling of the second coupling section 140B alone, the higher the strength of coupling of the second coupling section 140B.

The strength of coupling of the third coupling section 140C is the strength of coupling of the third subline section 120C to the main line 110. The strength of coupling of the third coupling section 140C is expressible in terms of the coupling of the third coupling section 140C alone. The higher the coupling of the third coupling section 140C alone, the higher the strength of coupling of the third coupling section 140C.

In the second embodiment, the third subline section 120C is coupled more strongly to the main line 110 than are the first and second subline sections 120A and 120B. In other words, the strength of coupling of the third coupling section 140C is higher than the strength of coupling of each of the first and second coupling sections 140A and 140B.

Each of the first and second matching sections 130A and 130B is a circuit for performing impedance matching between a signal source and a load, assuming a situation in which one of the third and fourth ports 13 and 14 is grounded via a terminator serving as the load, and the other of the third and fourth ports 13 and 14 is connected with the signal source having an output impedance equal to the resistance of the terminator (e.g., 50Ω). On the assumption of the above situation, the first and second matching sections 130A and 130B are each designed so that the reflection coefficient as viewed in the direction from one of the third and fourth ports 13 and 14 to the other has an absolute value of zero or near zero in the service frequency band of the directional coupler 101. Each of the first and second matching sections 130A and 130B causes a change in the phase of a signal passing therethrough.

The circuitry of the directional coupler 101, including element values, is preferably symmetric with respect to the third coupling section 140C. The circuitry of the directional coupling 1 may not be completely symmetric, but need only be approximately symmetric.

In the following, we discuss the case where the circuitry of the directional coupler 1 is symmetric. In this case, the strength of coupling of the second coupling section 140B is equal to the strength of coupling of the first coupling section 140A. Further, the circuitry of the first matching section 130A and that of the second matching section 130B, including element values, are mutually symmetric with respect to the third coupling section 140C. More specifically, the inductances of the first inductors L101A and L101B pairing up with each other are substantially equal to each other; the inductances of the second inductors L102A and L102B pairing up with each other are substantially equal to each other; the capacitances of the first capacitors C101A and C101B pairing up with each other are substantially equal to each other; and the capacitances of the second capacitors C102A and C102B pairing up with each other are substantially equal to each other. When signals of the same frequency pass through the first and second matching sections 130A and 130B, the first and second matching sections 130A and 130B cause changes of the same magnitude in the phase of those signals. The directional coupler 101 is bidirectional because the circuitry thereof is symmetric with respect to the third coupling section 140C.

In the first matching section 130A shown in FIG. 22, the first capacitor C101A is provided between the first end L101A1 of the first inductor L101A and the first end L102A1 of the second inductor L102A, and the second capacitor C102A is provided between the second end L101A2 of the first inductor L101A and the first end L102A1 of the second inductor L102A. In the second matching section 130B shown in FIG. 22, the first capacitor C101B is provided between the first end L101B1 of the first inductor L101B and the first end L102B1 of the second inductor L102B, and the second capacitor C102B is provided between the second end L101B2 of the first inductor L101B and the first end L102B1 of the second inductor L102B. However, in terms of circuitry, the first and second capacitors C101A and C102A in the first matching section 130A may be provided in a reversed arrangement from that in the example shown in FIG. 22, and ditto for the first and second capacitors C101B and C102B in the second matching section 130B. More specifically, in the first matching section 130A, the first capacitor C101A may be provided between the second end L101A2 of the first inductor L101A and the first end L102A1 of the second inductor L102A, and the second capacitor C102A may be provided between the first end L101A1 of the first inductor L101A and the first end L102A1 of the second inductor L102A. In this case, in the second matching section 130B, the first capacitor C101B is provided between the second end L101B2 of the first inductor L101B and the first end L102B1 of the second inductor L102B, and the second capacitor C102B is provided between the first end L101B1 of the first inductor L101B and the first end L102B1 of the second inductor L102B.

The operation of the directional coupler 101 according to the second embodiment will now be described. The directional coupler 101 is usable in the first and second modes of use described in relation to the first embodiment.

In the first mode of use, a high frequency signal is received at the first port 11 and output from the second port 12. The third port 13 outputs a coupling signal having a power that depends on the power of the high frequency signal received at the first port 11.

In the first mode of use, a first, a second and a third signal path are formed between the first port 11 serving as the input port and the third port 13 serving as the coupling port. The first signal path runs through the first coupling section 140A. The second signal path runs through the third coupling section 140C and the first matching section 130A. The third signal path runs through the second coupling section 140B, the second matching section 130B and the first matching section 130A. When a high frequency signal has been received at the first port 11, the coupling signal to be output from the third port 13 is a signal resulting from a combination of signals that have respectively passed through the first to third signal paths. The coupling of the directional coupler 101 used in the first mode of use depends on the strength of coupling of each of the first to third coupling sections 140A, 140B and 140C and the relationship among the phases of the signals that have respectively passed through the first to third signal paths.

In the first mode of use, a fourth, a fifth and a sixth signal path are formed between the second port 12 serving as the output port and the third port 13 serving as the coupling port. The fourth signal path runs through the first coupling section 140A. The fifth signal path runs through the third coupling section 140C and the first matching section 130A. The sixth signal path runs through the second coupling section 140B, the second matching section 130B and the first matching section 130A. The isolation of the directional coupler 101 used in the first mode of use depends on the strength of coupling of each of the first to third coupling sections 140A, 140B and 140C and the relationship among the phases of signals that have respectively passed through the fourth to sixth signal paths.

In the second mode of use, a high frequency signal is received at the second port 12 and output from the first port 11. The fourth port 14 outputs a coupling signal having a power that depends on the power of the high frequency signal received at the second port 12.

In the second mode of use, a seventh, an eighth and a ninth signal path are formed between the second port 12 serving as the input port and the fourth port 14 serving as the coupling port. The seventh signal path runs through the second coupling section 140B.

The eighth signal path runs through the third coupling section 140C and the second matching section 130B. The ninth signal path runs through the first coupling section 140A, the first matching section 130A and the second matching section 130B. When a high frequency signal has been received at the second port 12, the coupling signal to be output from the fourth port 14 is a signal resulting from a combination of signals that have respectively passed through the seventh to ninth signal paths. The coupling of the directional coupler 101 used in the second mode of use depends on the strength of coupling of each of the first to third coupling sections 140A, 140B and 140C and the relationship among the phases of the signals that have respectively passed through the seventh to ninth signal paths.

In the second mode of use, a tenth, an eleventh and a twelfth signal path are formed between the first port 11 serving as the output port and the fourth port 14 serving as the coupling port. The tenth signal path runs through the second coupling section 140B. The eleventh signal path runs through the third coupling section 140C and the second matching section 130B. The twelfth signal path runs through the first coupling section 140A, the first matching section 130A and the second matching section 130B. The isolation of the directional coupler 101 used in the second mode of use depends on the strength of coupling of each of the first to third coupling sections 140A, 140B and 140C and the relationship among the phases of signals that have respectively passed through the tenth to twelfth signal paths.

Figure 23:
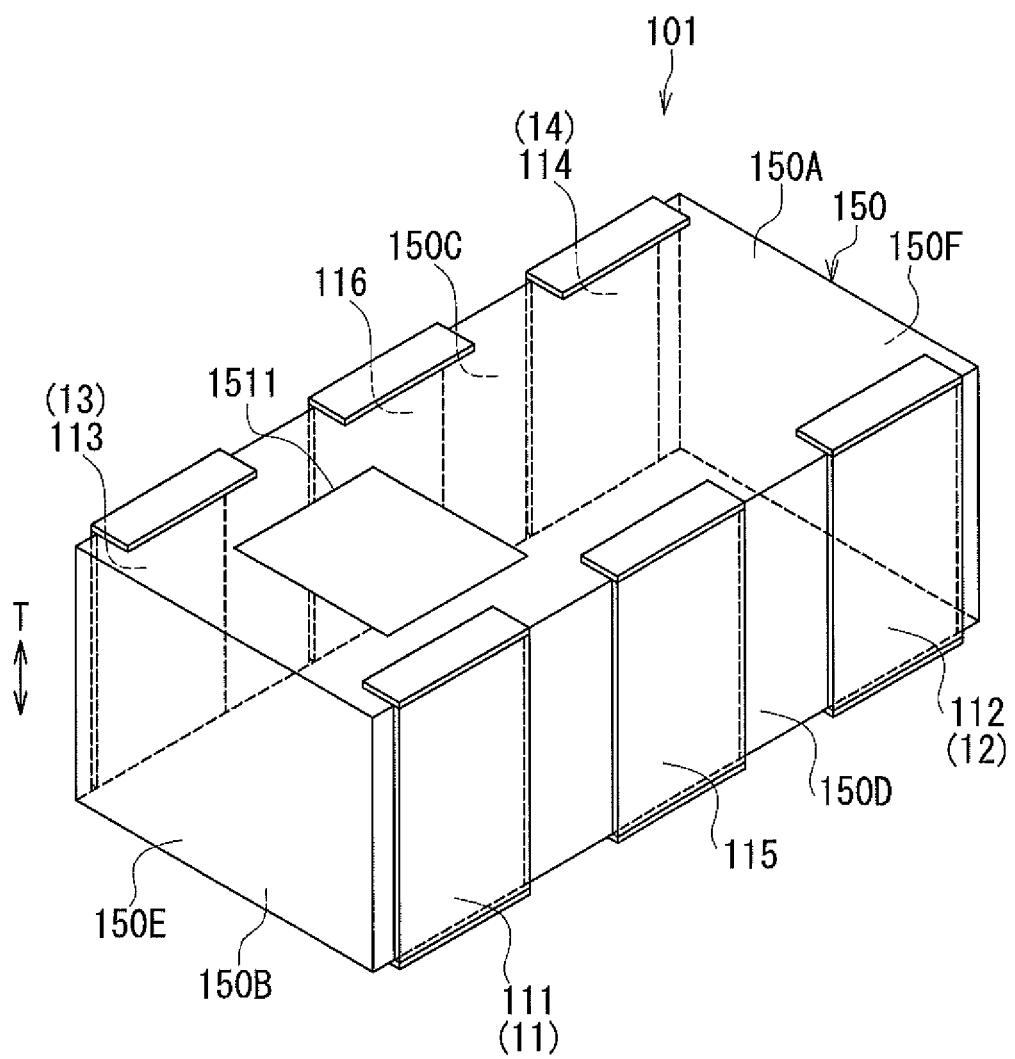
FIG. 23 is a perspective view of the directional coupler according to the second embodiment of the invention.

An example of the structure of the directional coupler 101 will now be described. FIG. 23 is a perspective view of the directional coupler 101. The directional coupler 101 shown in FIG. 23 includes a stack 150 for integrating the first to fourth ports 11 to 14, the main line 110, the first to third subline sections 120A, 120B and 120C, and the first and second matching sections 130A and 130B. As will be described in detail later, the stack 150 includes a plurality of dielectric layers and a plurality of conductor layers stacked on each other. Each of the inductors L101A, L102A, L101B and L102B is formed using one or more inductor-forming layers, which are one or more conductor layers among the plurality of conductor layers of the stack 150. Each of the capacitors C101A, C102A, C101B and C102B is formed using two or more conductor layers among the plurality of conductor layers of the stack 150.

The stack 150 is shaped similarly to the stack 50 of the first embodiment. More specifically, the stack 150 is shaped like a rectangular solid and has a periphery. The periphery of the stack 150 includes a top surface 150A, a bottom surface 150B, and four side surfaces 150C, 150D, 150E and 150F. The top surface 150A and the bottom surface 150B are opposite each other. The side surfaces 150C and 150D are opposite each other. The side surfaces 150E and 150F are opposite each other. The side surfaces 150C to 150F are perpendicular to the top surface 150A and the bottom surface 150B. For the stack 150, a direction perpendicular to the top surface 150A and the bottom surface 150B is the stacking direction of the plurality of dielectric layers and conductor layers. The stacking direction is shown by the arrow T in FIG. 23. The top surface 150A and the bottom surface 150B are located at opposite ends in the stacking direction T.

The directional coupler 101 shown in FIG. 23 has a first terminal 111, a second terminal 112, a third terminal 113, a fourth terminal 114, and two ground terminals 115 and 116, like the directional coupler 1 of the first embodiment shown in FIG. 3. The first to fourth terminals 111, 112, 113 and 114 correspond to the first to fourth ports 11, 12, 13 and 14 shown in FIG. 22, respectively. The ground terminals 115 and 116 are connected to the ground. In the second embodiment, the terminals 111 to 116 are provided on the periphery of the stack 150. The terminals 111, 112 and 115 are arranged to extend from the top surface 150A to the bottom surface 150B through the side surface 150C. The terminals 113, 114 and 116 are arranged to extend from the top surface 150A to the bottom surface 150B through the side surface 150D.

Figure 24:
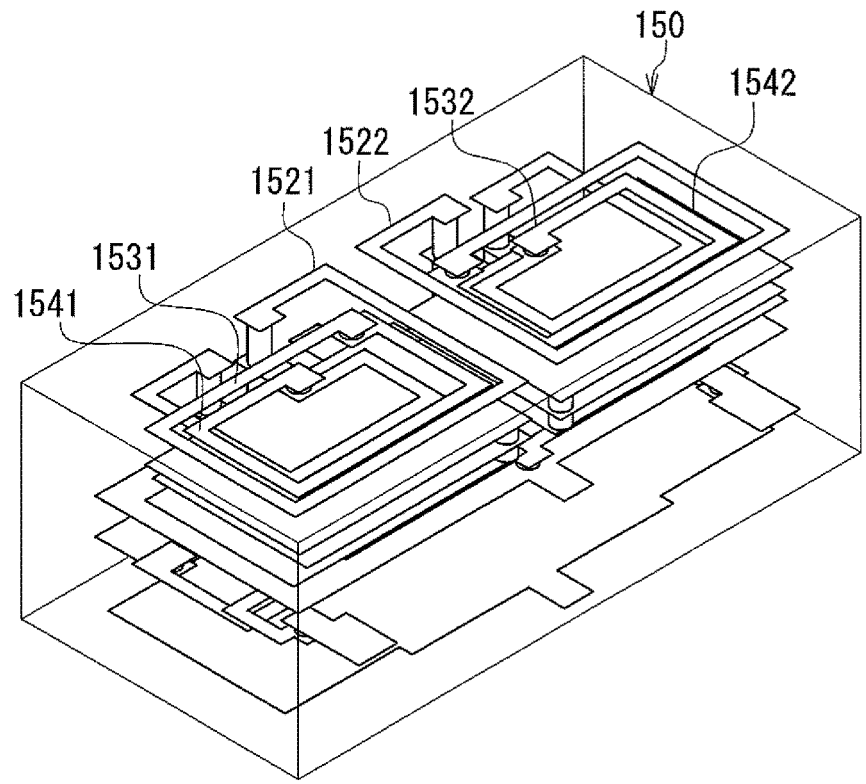
FIG. 24 is a perspective internal view of a stack included in the directional coupler shown in FIG. 23.
Figure 25:
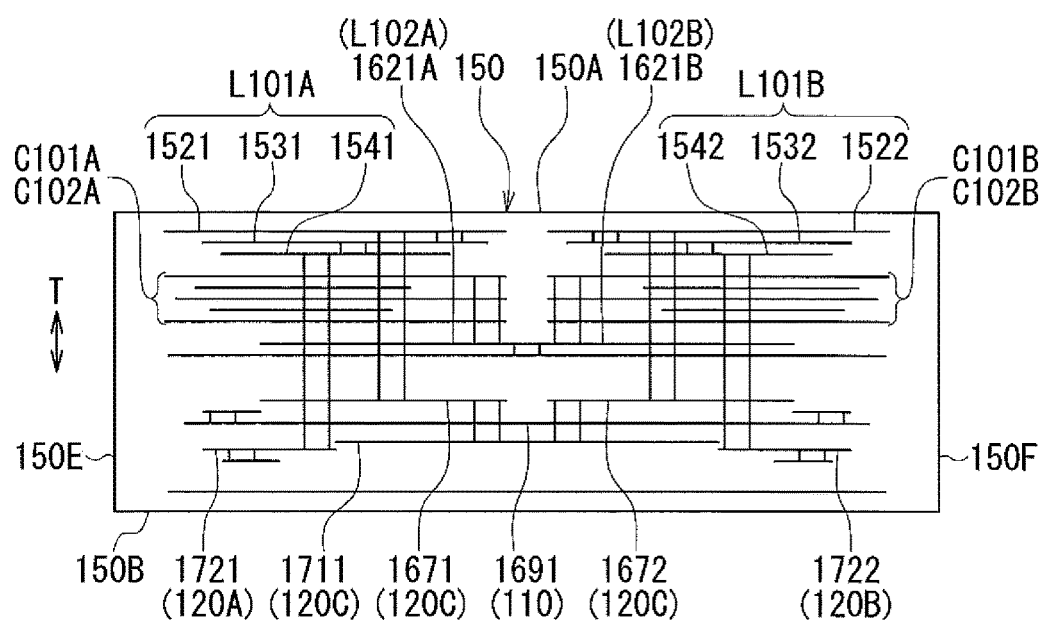
FIG. 25 is a cross-sectional view of the stack included in the directional coupler shown in FIG. 24.

The stack 150 will now be described in detail with reference to FIG. 24 to FIG. 31E. The stack 150 includes twenty-five dielectric layers stacked on top of one another. The twenty-five dielectric layers will be referred to as the first to twenty-fifth dielectric layers in the order from top to bottom. FIG. 24 is a perspective internal view of the stack 150. FIG. 25 is a cross-sectional view of the stack 150. FIG. 26A to FIG. 26D illustrate the respective patterned surfaces of the first to fourth dielectric layers. FIG. 27A to FIG. 27D illustrate the respective patterned surfaces of the fifth to eighth dielectric layers. FIG. 28A to FIG. 28D illustrate the respective patterned surfaces of the ninth to twelfth dielectric layers. FIG. 29A to FIG. 29D illustrate the respective patterned surfaces of the thirteenth to sixteenth dielectric layers. FIG. 30A to FIG. 30D illustrate the respective patterned surfaces of the seventeenth to twentieth dielectric layers. FIG. 31A to FIG. 31E illustrate the respective patterned surfaces of the twenty-first to twenty-fifth dielectric layers.

Figure 26A:
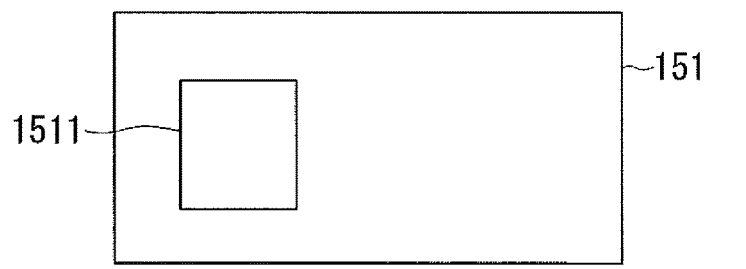
FIG. 26A to FIG. 26D are explanatory diagrams illustrating the respective patterned surfaces of the first to fourth dielectric layers of the stack included in the directional coupler shown in FIG. 23.
Figure 26B:
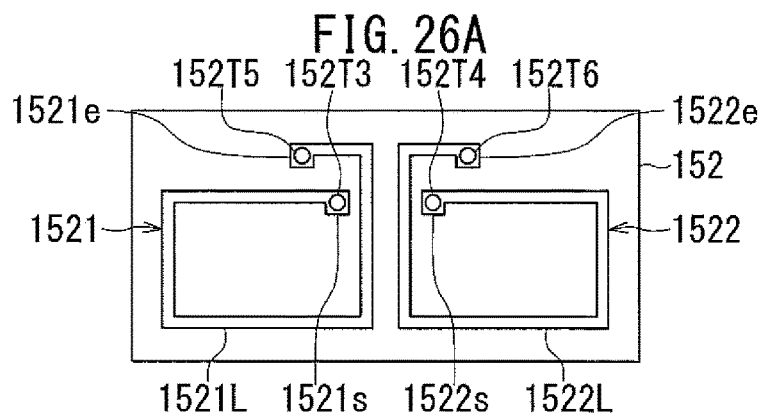

As shown in FIG. 26A, a mark 1511 is formed on the patterned surface of the first dielectric layer 151. As shown in FIG. 26B, inductor-forming layers 1521 and 1522 are formed on the patterned surface of the second dielectric layer 152. The inductor-forming layers 1521 and 1522 are conductor layers used for forming the inductors L101A and L101B, respectively.

Now, the inductor-forming layers 1521 and 1522 will be described in detail. Each of the inductor-forming layers 1521 and 1522 includes two connection portions for electrical connection to respective other elements, and a line portion connecting the two connection portions. The two connection portions of the inductor-forming layer 1521 will be denoted by symbols 1521s and 1521e. The line portion of the inductor-forming layer 1521 will be denoted by symbol 1521L. The two connection portions of the inductor-forming layer 1522 will be denoted by symbols 1522s and 1522e. The line portion of the inductor-forming layer 1522 will be denoted by symbol 1522L.

Further, through holes 152T3, 152T4, 152T5 and 152T6 are formed in the dielectric layer 152. The through hole 152T3 is connected to the connection portion 1521s of the inductor-forming layer 1521. The through hole 152T4 is connected to the connection portion 1522s of the inductor-forming layer 1522. The through hole 152T5 is connected to the connection portion 1521e of the inductor-forming layer 1521. The through hole 152T6 is connected to the connection portion 1522e of the inductor-forming layer 1522.

Figure 26C:
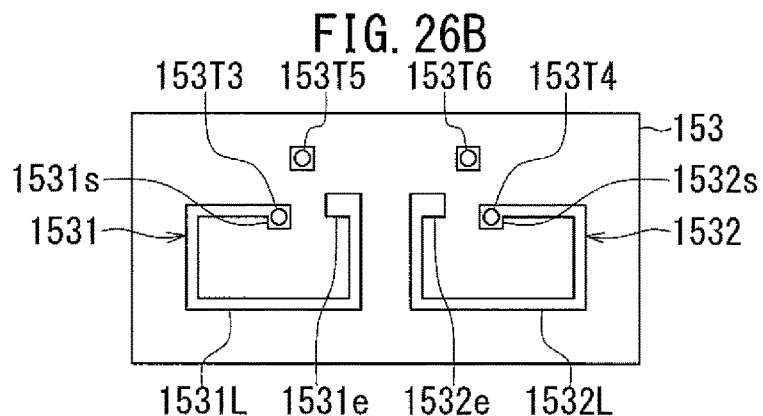

As shown in FIG. 26C, inductor-forming layers 1531 and 1532 are formed on the patterned surface of the third dielectric layer 153. The inductor-forming layers 1531 and 1532 are conductor layers used for forming the inductors L101A and L101B, respectively. Each of the inductor-forming layers 1531 and 1532 includes two connection portions and a line portion, like the inductor-forming layers 1521 and 1522. The two connection portions of the inductor-forming layer 1531 will be denoted by symbols 1531s and 1531e. The line portion of the inductor-forming layer 1531 will be denoted by symbol 1531L. The two connection portions of the inductor-forming layer 1532 will be denoted by symbols 1532s and 1532e. The line portion of the inductor-forming layer 1532 will be denoted by symbol 1532L.

Further, through holes 153T3, 153T4, 153T5 and 153T6 are formed in the dielectric layer 153. The through hole 153T3 is connected to the connection portion 1531s of the inductor-forming layer 1531. The through hole 153T4 is connected to the connection portion 1532s of the inductor-forming layer 1532. The through holes 152T5 and 152T6 shown in FIG. 26B are connected to the through holes 153T5 and 153T6, respectively. The through hole 152T3 shown in FIG. 26B is connected to the connection portion 1531e of the inductor-forming layer 1531. The through hole 152T4 shown in FIG. 26B is connected to the connection portion 1532e of the inductor-forming layer 1532.

Figure 26D:
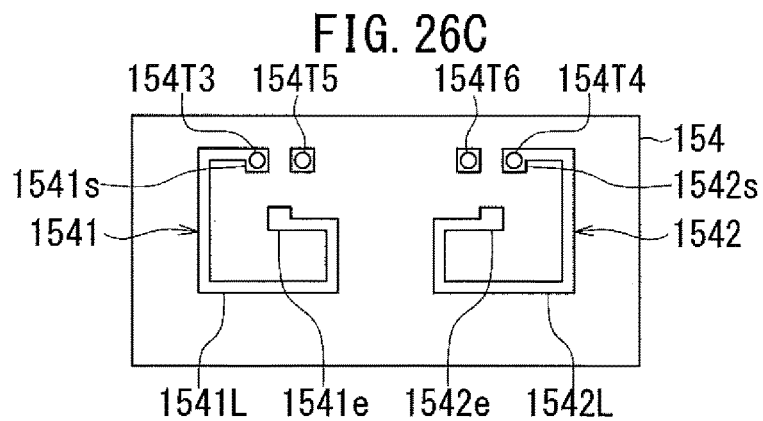

As shown in FIG. 26D, inductor-forming layers 1541 and 1542 are formed on the patterned surface of the fourth dielectric layer 154. The inductor-forming layers 1541 and 1542 are conductor layers used for forming the inductors L101A and L101B, respectively. Each of the inductor-forming layers 1541 and 1542 includes two connection portions and a line portion, like the inductor-forming layers 1521 and 1522. The two connection portions of the inductor-forming layer 1541 will be denoted by symbols 1541s and 1541e. The line portion of the inductor-forming layer 1541 will be denoted by symbol 1541L. The two connection portions of the inductor-forming layer 1542 will be denoted by symbols 1542s and 1542e. The line portion of the inductor-forming layer 1542 will be denoted by symbol 1542L.

Further, through holes 154T3, 154T4, 154T5 and 154T6 are formed in the dielectric layer 154. The through hole 154T3 is connected to the connection portion 1541s of the inductor-forming layer 1541. The through hole 154T4 is connected to the connection portion 1542s of the inductor-forming layer 1542. The through holes 153T5 and 153T6 shown in FIG. 26C are connected to the through holes 154T5 and 154T6, respectively. The through hole 153T3 shown in FIG. 26C is connected to the connection portion 1541e of the inductor-forming layer 1541. The through hole 153T4 shown in FIG. 26C is connected to the connection portion 1542e of the inductor-forming layer 1542.

Figure 27A:
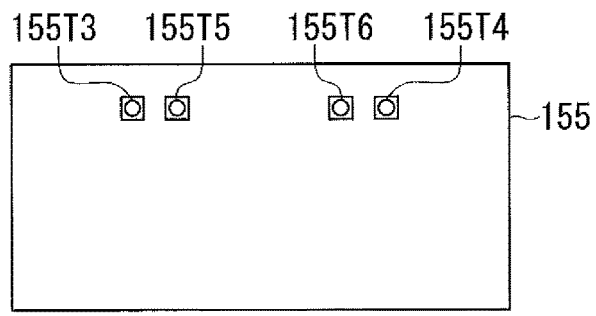
FIG. 27A to FIG. 27D are explanatory diagrams illustrating the respective patterned surfaces of the fifth to eighth dielectric layers of the stack included in the directional coupler shown in FIG. 23.

As shown in FIG. 27A, through holes 155T3, 155T4, 155T5 and 155T6 are formed in the fifth dielectric layer 155. The through holes 154T3 to 154T6 shown in FIG. 26D are connected to the through holes 155T3 to 155T6, respectively.

Figure 27B:
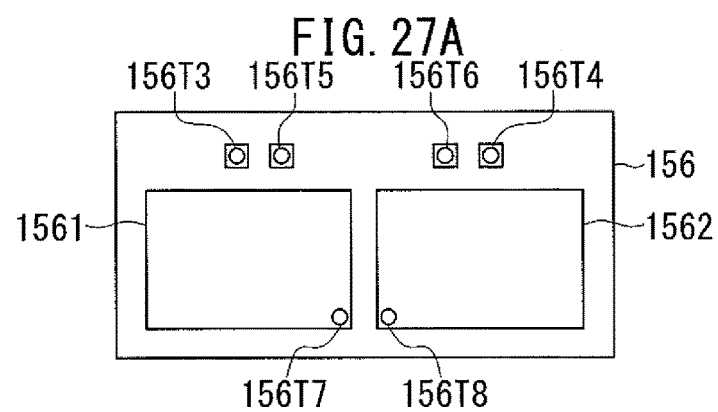

As shown in FIG. 27B, conductor layers 1561 and 1562 are formed on the patterned surface of the sixth dielectric layer 156. The conductor layers 1561 and 1562 are used for forming the capacitors C102A and C102B, respectively. Further, through holes 156T3, 156T4, 156T5, 156T6, 156T7 and 156T8 are formed in the dielectric layer 156. The through holes 155T3 to 155T6 shown in FIG. 27A are connected to the through holes 156T3 to 156T6, respectively. The through hole 15617 is connected to the conductor layer 1561. The through hole 156T8 is connected to the conductor layer 1562.

Figure 27C:
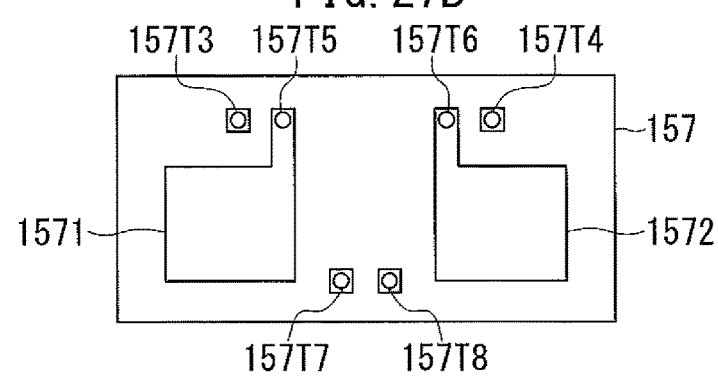

As shown in FIG. 27C, conductor layers 1571 and 1572 are formed on the patterned surface of the seventh dielectric layer 157. The conductor layers 1571 and 1572 are used for forming the capacitors C102A and C102B, respectively. Further, through holes 157T3, 157T4, 157T5, 157T6, 157T7 and 157T8 are formed in the dielectric layer 157. The through holes 156T3, 156T4, 156T7 and 156T8 shown in FIG. 27B are connected to the through holes 157T3, 157T4, 15717 and 157T8, respectively. The through hole 157T5 is connected to the conductor layer 1571. The through hole 157T6 is connected to the conductor layer 1572.

Figure 27D:
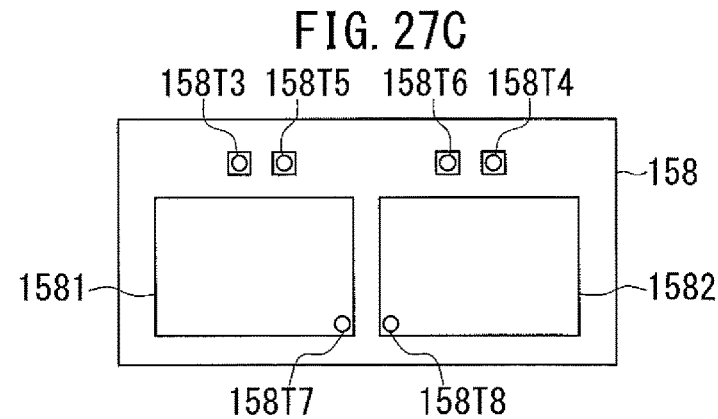

As shown in FIG. 27D, conductor layers 1581 and 1582 are formed on the patterned surface of the eighth dielectric layer 158. The conductor layer 1581 is used for forming the capacitors C101A and C102A. The conductor layer 1582 is used for forming the capacitors C101B and C102B. Further, through holes 158T3, 158T4, 158T5, 158T6, 158T7 and 158T8 are formed in the dielectric layer 158. The through holes 157T3 to 157T6 shown in FIG. 27C are connected to the through holes 158T3 to 158T6, respectively. The through hole 158T7 is connected to the conductor layer 1581 and to the through hole 157T7 shown in FIG. 27C. The through hole 158T8 is connected to the conductor layer 1582 and to the through hole 157T8 shown in FIG. 27C.

Figure 28A:
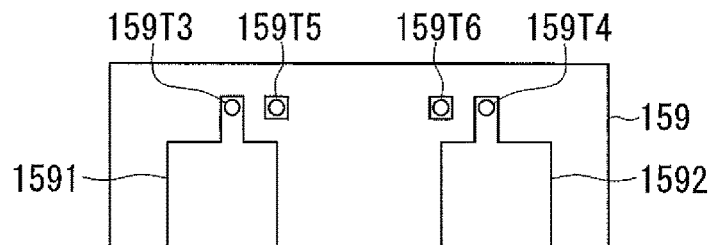
FIG. 28A to FIG. 28D are explanatory diagrams illustrating the respective patterned surfaces of the ninth to twelfth dielectric layers of the stack included in the directional coupler shown in FIG. 23.

As shown in FIG. 28A, conductor layers 1591 and 1592 are formed on the patterned surface of the ninth dielectric layer 159. The conductor layers 1591 and 1592 are used for forming the capacitors C101A and C101B, respectively. Further, through holes 159T3, 159T4, 159T5, 159T6, 159T7 and 159T8 are formed in the dielectric layer 159. The through hole 159T3 is connected to the conductor layer 1591 and to the through hole 158T3 shown in FIG. 27D. The through hole 159T4 is connected to the conductor layer 1592 and to the through hole 158T4 shown in FIG. 27D. The through holes 158T5 to 158T8 shown in FIG. 27D are connected to the through holes 159T5 to 159T8, respectively.

Figure 28B:
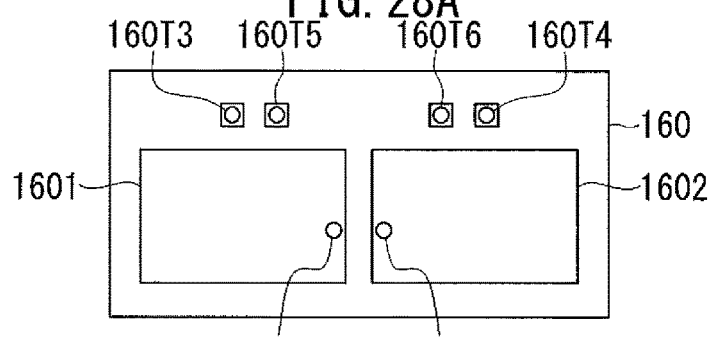

As shown in FIG. 28B, conductor layers 1601 and 1602 are formed on the patterned surface of the tenth dielectric layer 160. The conductor layers 1601 and 1602 are used for forming the capacitors C101A and C101B, respectively. Further, through holes 160T3, 160T4, 160T5, 160T6, 160T7 and 160T8 are formed in the dielectric layer 160. The through holes 159T3 to 159T6 shown in FIG. 28A are connected to the through holes 160T3 to 160T6, respectively. The through hole 159T7 shown in FIG. 28A and the through hole 160T7 are connected to the conductor layer 1601. The through hole 159T8 shown in FIG. 28A and the through hole 160T8 are connected to the conductor layer 1602.

Figure 28C:
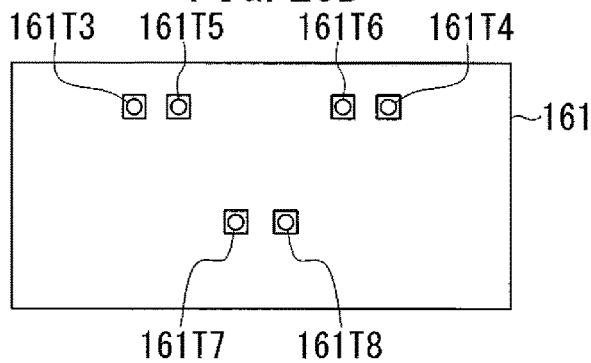

As shown in FIG. 28C, through holes 161T3, 161T4, 161T5, 161T6, 161T7 and 161T8 are formed in the eleventh dielectric layer 161. The through holes 160T3 to 160T8 shown in FIG. 28B are connected to the through holes 161T3 to 161T8, respectively.

Figure 28D:
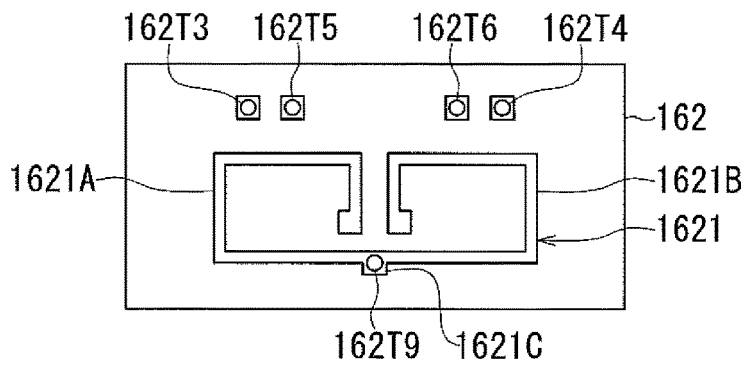

As shown in FIG. 28D, a conductor layer 1621 is formed on the patterned surface of the twelfth dielectric layer 162. The conductor layer 1621 includes a line portion 1621A forming the inductor L102A, a line portion 1621B forming the inductor L102B, and a connection portion 1621C connecting the line portions 1621A and 1621B. Each of the line portions 1621A and 1621B has a first end and a second end. The first end of the line portion 1621A and the first end of the line portion 1621B are connected to the connection portion 1621C. Further, through holes 162T3, 162T4, 162T5, 162T6 and 162T9 are formed in the dielectric layer 162. The through holes 161T3 to 161T6 shown in FIG. 28C are connected to the through holes 162T3 to 162T6, respectively. The through hole 162T9 is connected to the connection portion 1621C of the conductor layer 1621. The through hole 161T7 shown in FIG. 28C is connected to a portion of the line portion 1621A near the second end thereof. The through hole 161T8 shown in FIG. 28C is connected to a portion of the line portion 1621B near the second end thereof.

Figure 29A:
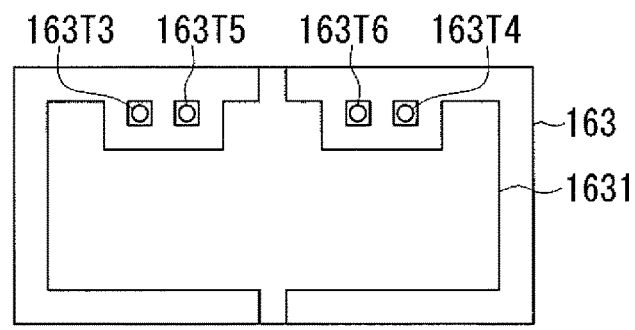
FIG. 29A to FIG. 29D are explanatory diagrams illustrating the respective patterned surfaces of the thirteenth to sixteenth dielectric layers of the stack included in the directional coupler shown in FIG. 23.

As shown in FIG. 29A, a ground conductor layer 1631 is formed on the patterned surface of the thirteenth dielectric layer 163. The ground conductor layer 1631 is connected to the ground terminals 115 and 116 shown in FIG. 23. Further, through holes 163T3, 163T4, 163T5 and 163T6 are formed in the dielectric layer 163. The through holes 162T3 to 162T6 shown in FIG. 28D are connected to the through holes 163T3 to 163T6, respectively. The through hole 162T9 shown in FIG. 28D is connected to the ground conductor layer 1631.

Figure 29B:
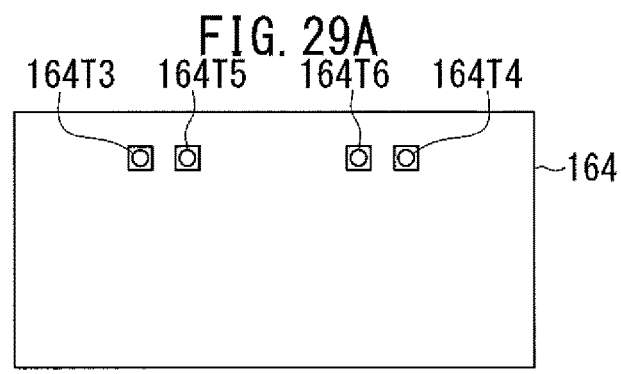

As shown in FIG. 29B, through holes 164T3, 164T4, 164T5 and 164T6 are formed in the fourteenth dielectric layer 164. The through holes 163T3 to 163T6 shown in FIG. 29A are connected to the through holes 164T3 to 164T6, respectively.

Figure 29C:
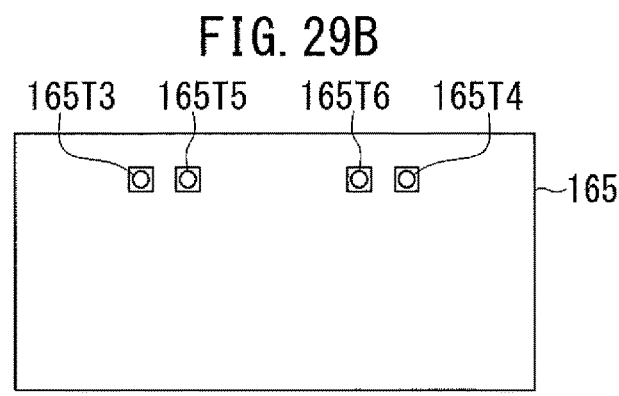

As shown in FIG. 29C, through holes 165T3, 165T4, 165T5 and 165T6 are formed in the fifteenth dielectric layer 165. The through holes 164T3 to 164T6 shown in FIG. 29B are connected to the through holes 165T3 to 165T6, respectively.

Figure 29D:
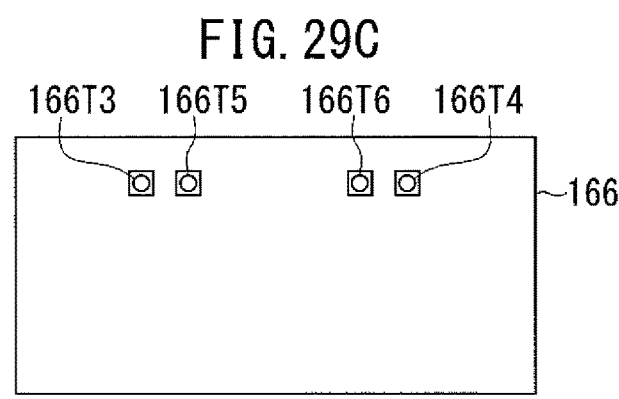

As shown in FIG. 29D, through holes 166T3, 166T4, 166T5 and 166T6 are formed in the sixteenth dielectric layer 166. The through holes 165T3 to 165T6 shown in FIG. 29C are connected to the through holes 166T3 to 166T6, respectively.

Figure 30A:
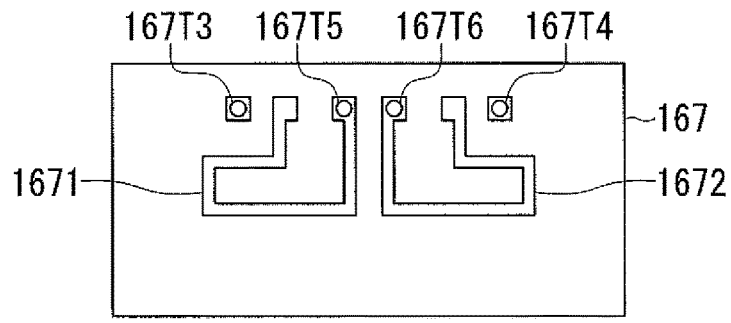
FIG. 30A to FIG. 30D are explanatory diagrams illustrating the respective patterned surfaces of the seventeenth to twentieth dielectric layers of the stack included in the directional coupler shown in FIG. 23.

As shown in FIG. 30A, conductor layers 1671 and 1672 are formed on the patterned surface of the seventeenth dielectric layer 167. The conductor layers 1671 and 1672 are used for forming the third subline section 120C. Each of the conductor layers 1671 and 1672 has a first end and a second end. Further, through holes 167T3, 167T4, 167T5 and 167T6 are formed in the dielectric layer 167. The through holes 166T3 and 166T4 shown in FIG. 29D are connected to the through holes 167T3 and 167T4, respectively. The through hole 167T5 is connected to a portion of the conductor layer 1671 near the first end thereof. The through hole 167T6 is connected to a portion of the conductor layer 1672 near the first end thereof. The through hole 166T5 shown in FIG. 29D is connected to a portion of the conductor layer 1671 near the second end thereof. The through hole 166T6 shown in FIG. 29D is connected to a portion of the conductor layer 1672 near the second end thereof.

Figure 30B:
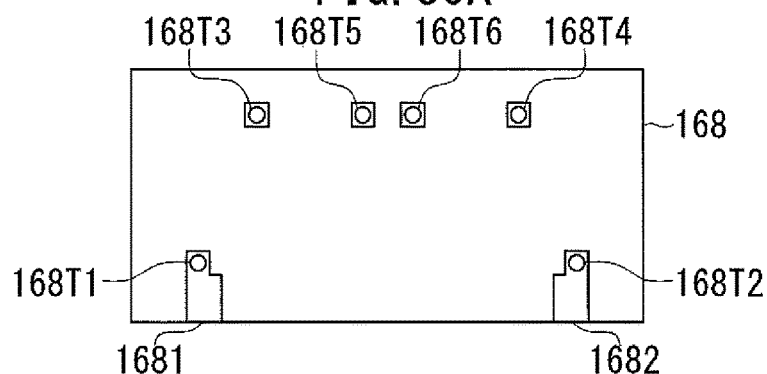

As shown in FIG. 30B, conductor layers 1681 and 1682 are formed on the patterned surface of the eighteenth dielectric layer 168. The conductor layer 1681 is connected to the first terminal 111 shown in FIG. 23. The conductor layer 1682 is connected to the second terminal 112 shown in FIG. 23. Further, through holes 168T1, 16812, 168T3, 168T4, 168T5 and 168T6 are formed in the dielectric layer 168. The through hole 168T1 is connected to the conductor layer 1681. The through hole 168T2 is connected to the conductor layer 1682. The through holes 167T3 to 167T6 shown in FIG. 30A are connected to the through holes 168T3 to 168T6, respectively.

Figure 30C:
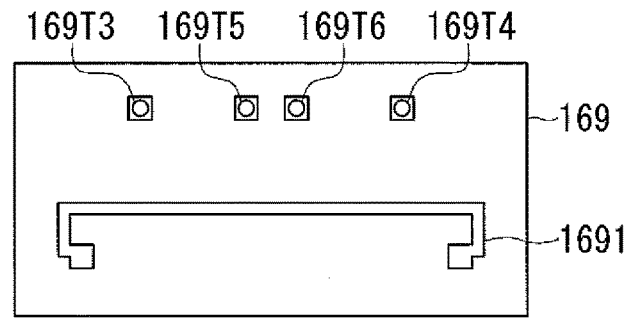

As shown in FIG. 30C, a conductor layer 1691 is formed on the patterned surface of the nineteenth dielectric layer 169. The conductor layer 1691 is used for forming the main line 110, and has a first end and a second end. Further, through holes 169T3, 169T4, 169T5 and 169T6 are formed in the dielectric layer 169. The through holes 168T3 to 168T6 shown in FIG. 30B are connected to the through holes 169T3 to 169T6, respectively. The through hole 168T1 shown in FIG. 30B is connected to a portion of the conductor layer 1691 near the first end thereof. The through hole 168T2 shown in FIG. 30B is connected to a portion of the conductor layer 1691 near the second end thereof.

Figure 30D:
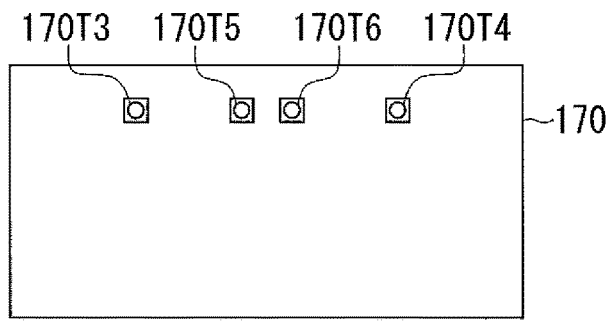

As shown in FIG. 30D, through holes 170T3, 170T4, 170T5 and 170T6 are formed in the twentieth dielectric layer 170. The through holes 169T3 to 169T6 shown in FIG. 30C are connected to the through holes 170T3 to 170T6, respectively.

Figure 31A:
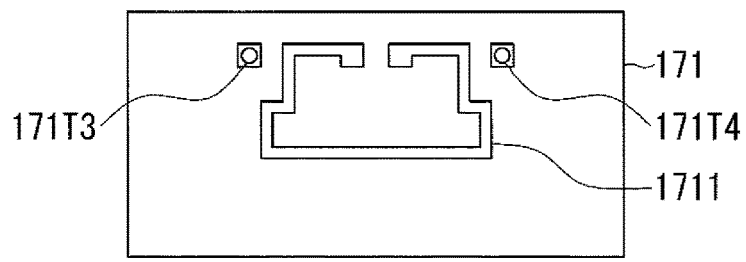
FIG. 31A to FIG. 31E are explanatory diagrams illustrating the respective patterned surfaces of the twenty-first to twenty-fifth dielectric layers of the stack included in the directional coupler shown in FIG. 23.

As shown in FIG. 31A, a conductor layer 1711 is formed on the patterned surface of the twenty-first dielectric layer 171. The conductor layer 1711 is used for forming the third subline section 120C, and has a first end and a second end. Further, through holes 171T3 and 171T4 are formed in the dielectric layer 171. The through holes 170T3 and 170T4 shown in FIG. 30D are connected to the through holes 171T3 and 171T4, respectively. The through hole 170T5 shown in FIG. 30D is connected to a portion of the conductor layer 1711 near the first end thereof. The through hole 170T6 shown in FIG. 30D is connected to a portion of the conductor layer 1711 near the second end thereof.

Figure 31B:
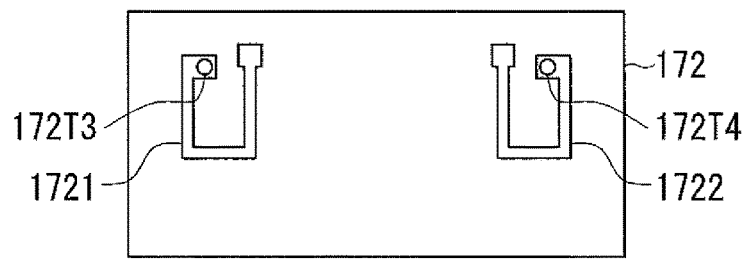

As shown in FIG. 31B, conductor layers 1721 and 1722 are formed on the patterned surface of the twenty-second dielectric layer 172. The conductor layers 1721 and 1722 are used for forming the first and second subline sections 120A and 120B, respectively. Each of the conductor layers 1721 and 1722 has a first end and a second end. Further, through holes 172T3 and 172T4 are formed in the dielectric layer 172. The through hole 172T3 is connected to a portion of the conductor layer 1721 near the first end thereof. The through hole 172T4 is connected to a portion of the conductor layer 1722 near the first end thereof. The through hole 171T3 shown in FIG. 31A is connected to a portion of the conductor layer 1721 near the second end thereof. The through hole 171T4 shown in FIG. 31A is connected to a portion of the conductor layer 1722 near the second end thereof.

Figure 31C:
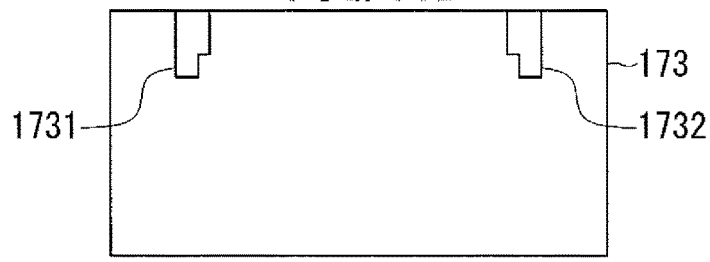

As shown in FIG. 31C, conductor layers 1731 and 1732 are formed on the patterned surface of the twenty-third dielectric layer 173. The conductor layer 1731 is connected to the third terminal 113 shown in FIG. 23. The conductor layer 1732 is connected to the fourth terminal 114 shown in FIG. 23. The through hole 172T3 shown in FIG. 31B is connected to the conductor layer 1731. The through hole 172T4 shown in FIG. 31B is connected to the conductor layer 1732.

Figure 31D:
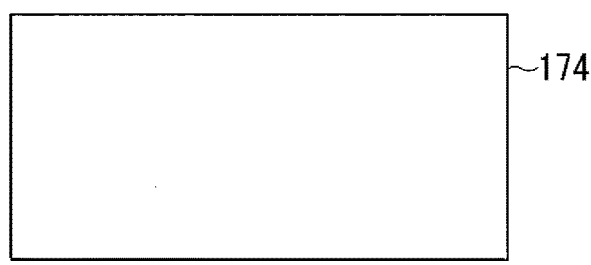
Figure 31E:
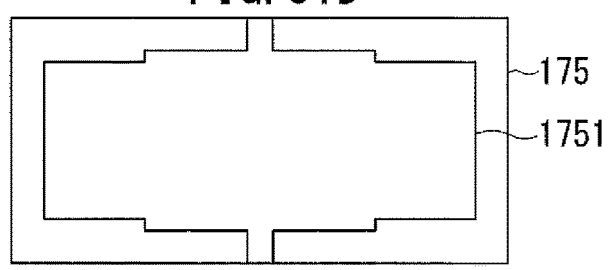

As shown in FIG. 31D, no conductor layer is formed on the patterned surface of the twenty-fourth dielectric layer 174. As shown in FIG. 31E, a ground conductor layer 1751 is formed on the patterned surface of the twenty-fifth dielectric layer 175. The ground conductor layer 1751 is connected to the ground terminals 115 and 116 shown in FIG. 23.

The stack 150 shown in FIG. 23 is formed by stacking the first to twenty-fifth dielectric layers 151 to 175 so that the patterned surface of the first dielectric layer 151 also serves as the top surface 150A of the stack 150. Then, the terminals 111 to 116 are formed on the periphery of the stack 150 to complete the directional coupler 101 shown in FIG. 23.

FIG. 24 shows the interior of the stack 150. FIG. 25 shows a cross section of the stack 150 as viewed from the side surface 150C.

Correspondences of the circuit components of the directional coupler 101 shown in FIG. 22 with the components inside the stack 150 shown in FIG. 26A to FIG. 31E will now be described. The main line 110 is formed of the conductor layer 1691 shown in FIG. 30C. The conductor layer 1691 has a first surface facing toward the same direction as the patterned surface of the dielectric layer 169, and a second surface opposite to the first surface. The first surface of the conductor layer 1691 includes a first portion and a second portion. The second surface of the conductor layer 1691 includes a third portion, a fourth portion and a fifth portion.

A portion of the conductor layer 1721 shown in FIG. 31B is opposed to the third portion of the second surface of the conductor layer 1691 with the dielectric layers 169, 170 and 171 interposed therebetween. The first subline section 120A is formed of the aforementioned portion of the conductor layer 1721.

A portion of the conductor layer 1722 shown in FIG. 31B is opposed to the fourth portion of the second surface of the conductor layer 1691 with the dielectric layers 169, 170 and 171 interposed therebetween. The second subline section 120B is formed of the aforementioned portion of the conductor layer 1722.

The third subline section 120C is formed as follows. The portion of the conductor layer 1671 (FIG. 30A) near the first end thereof is connected to the portion of the conductor layer 1711 (FIG. 31A) near the first end thereof via the through holes 167T5, 168T5, 169T5 and 170T5. The portion of the conductor layer 1672 (FIG. 30A) near the first end thereof is connected to the portion of the conductor layer 1711 near the second end thereof via the through holes 167T6, 168T6, 169T6 and 170T6. Part of the conductor layer 1671 is opposed to the first portion of the first surface of the conductor layer 1691 with the dielectric layers 167 and 168 interposed therebetween. Part of the conductor layer 1672 is opposed to the second portion of the first surface of the conductor layer 1691 with the dielectric layers 167 and 168 interposed therebetween. Part of the conductor layer 1711 is opposed to the fifth portion of the second surface of the conductor layer 1691 with the dielectric layers 169 and 170 interposed therebetween. The third subline section 120C is formed of the aforementioned parts of the conductor layers 1671, 1672 and 1711.

The inductor L101A of the first matching section 130A is formed as follows. The inductor-forming layers 1521, 1531 and 1541 shown in FIG. 26B to FIG. 26D are connected to each other in series via the through holes 152T3 and 153T3. The inductor L101A is formed of these inductor-forming layers 1521, 1531 and 1541 and the two through holes 152T3 and 153T3 connecting them. The inductor-forming layer 1541 is connected to the conductor layer 1721 forming the first subline section 120A via the through holes 154T3, 155T3, 156T3, 157T3, 158T3, 159T3, 160T3, 161T3, 162T3, 163T3, 164T3, 165T3, 166T3, 167T3, 168T3, 169T3, 170T3 and 171T3. The inductor-forming layer 1521 is connected to the conductor layer 1671 forming the third subline section 120C via the through holes 152T5, 153T5, 154T5, 155T5, 156T5, 157T5, 158T5, 159T5, 160T5, 161T5, 162T5, 163T5, 164T5, 165T5 and 166T5.

The capacitor C101A of the first matching section 130A is formed of the conductor layers 1581, 1591 and 1601 shown in FIGS. 27D, 28A and 28B, the dielectric layer 158 interposed between the conductor layers 1581 and 1591, and the dielectric layer 159 interposed between the conductor layers 1591 and 1601. The conductor layer 1591 is connected to the conductor layer 1721 forming the first subline section 120A via the through holes 159T3, 160T3, 161T3, 162T3, 163T3, 164T3, 165T3, 166T3, 167T3, 168T3, 169T3, 170T3 and 171T3.

The capacitor C102A of the first matching section 130A is formed of the conductor layers 1561, 1571 and 1581 shown in FIG. 27B to FIG. 27D, the dielectric layer 156 interposed between the conductor layers 1561 and 1571, and the dielectric layer 157 interposed between the conductor layers 1571 and 1581. The conductor layer 1571 is connected to the conductor layer 1671 forming the third subline section 120C via the through holes 157T5, 158T5, 159T5, 160T5, 161T5, 162T5, 163T5, 164T5, 165T5 and 166T5.

The inductor L102A of the first matching section 130A is formed of the line portion 1621A of the the conductor layer 1621 shown in FIG. 28D. The first end of the line portion 1621A is connected to the ground conductor layer 1631 shown in FIG. 29A via the connection portion 1621C and the through hole 162T9. The portion of the line portion 1621A near the second end thereof is connected to the conductor layer 1601 shown in FIG. 28B via the through holes 160T7 and 161T7, and connected to the conductor layers 1561 and 1581 shown in FIG. 27B and FIG. 27D via the through holes 156T7, 157T7, 158T7 and 159T7, the conductor layer 1601 and the through holes 160T7 and 161T7.

The inductor L101B of the second matching section 130B is formed as follows. The inductor-forming layers 1522, 1532 and 1542 shown in FIG. 26B to FIG. 26D are connected to each other in series via the through holes 152T4 and 153T4. The inductor L101B is formed of these inductor-forming layers 1522, 1532 and 1542 and the two through holes 152T4 and 153T4 connecting them. The inductor-forming layer 1542 is connected to the conductor layer 1722 forming the second subline section 120B via the through holes 154T4, 155T4, 156T4, 157T4, 158T4, 159T4, 160T4, 161T4, 162T4, 163T4, 164T4, 165T4, 166T4, 167T4, 168T4, 169T4, 170T4 and 171T4. The inductor-forming layer 1522 is connected to the conductor layer 1672 forming the third subline section 120C via the through holes 152T6, 153T6, 154T6, 155T6, 156T6, 157T6, 158T6, 159T6, 160T6, 161T6, 162T6, 163T6, 164T6, 165T6 and 166T6.

The capacitor C101B of the second matching section 130B is formed of the conductor layers 1582, 1592 and 1602 shown in FIGS. 27D, 28A and 28B, the dielectric layer 158 interposed between the conductor layers 1582 and 1592, and the dielectric layer 159 interposed between the conductor layers 1592 and 1602. The conductor layer 1592 is connected to the conductor layer 1722 forming the second subline section 120B via the through holes 159T4, 160T4, 161T4, 162T4, 163T4, 164T4, 165T4, 166T4, 167T4, 168T4, 169T4, 170T4 and 171T4.

The capacitor C102B of the second matching section 130B is formed of the conductor layers 1562, 1572 and 1582 shown in FIG. 27B to FIG. 27D, the dielectric layer 156 interposed between the conductor layers 1562 and 1572, and the dielectric layer 157 interposed between the conductor layers 1572 and 1582. The conductor layer 1572 is connected to the conductor layer 1672 forming the third subline section 120C via the through holes 157T6, 158T6, 159T6, 160T6, 161T6, 162T6, 163T6, 164T6, 165T6 and 166T6.

The inductor L102B of the second matching section 130B is formed of the line portion 1621B of the the conductor layer 1621 shown in FIG. 28D. The first end of the line portion 1621B is connected to the ground conductor layer 1631 shown in FIG. 29A via the connection portion 1621C and the through hole 162T9. The portion of the line portion 1621B near the second end thereof is connected to the conductor layer 1602 shown in FIG. 28B via the through holes 160T8 and 161T8, and connected to the conductor layers 1562 and 1582 shown in FIG. 27B and FIG. 27D via the through holes 156T8, 157T8, 158T8 and 159T8, the conductor layer 1602 and the through holes 160T8 and 161T8.

In the stack 150, the ground conductor layer 1631 connected to the ground is interposed between the conductor layer 1691 forming the main line 110 and the conductor layers forming the first and second matching sections 130A and 130B. Thus, the first and second matching sections 130A and 130B are not configured to be electromagnetically coupled to the main line 110.

The ground conductor layer 1751 shown in FIG. 31E has the function of adjusting the impedance of each of the first and second subline sections 120A and 120B to a desired value.

The structural features of the first and second matching sections 130A and 130B in the stack 150 will now be described. The plurality of conductor layers of the stack 150 include a plurality of inductor-forming layers which are a plurality of conductor layers used to form the first inductor L101A of the first matching section 130A, and another plurality of inductor-forming layers which are a plurality of conductor layers used to form the first inductor L101B of the second matching section 130B. In the second embodiment, the first inductor L101A is formed of three inductor-forming layers 1521, 1531 and 1541 connected in series; and the first inductor L101B is formed of three inductor-forming layers 1522, 1532 and 1542 connected in series.

Each of the inductor-forming layers 1521, 1531 and 1541 includes two connection portions for electrical connection to respective other elements, and a line portion connecting the two connection portions. Likewise, each of the inductor-forming layers 1522, 1532 and 1542 includes two connection portions for electrical connection to respective other elements, and a line portion connecting the two connection portions.

The inductor-forming layers 1521, 1531 and 1541 forming the first inductor L101A are arranged such that their respective line portions do not overlap each other when viewed in the stacking direction T. Thus, the entirety of the first inductor L101A excluding the connection portions does not include portions that overlap each other when viewed in stacking direction T. The entirety of the first inductor L101A has a spiral shape when viewed in the stacking direction T. The three-dimensional shape of the entirety of the first inductor L101A is like a square frustum.

Similarly, the inductor-forming layers 1522, 1532 and 1542 forming the first inductor L101B are arranged such that their respective line portions do not overlap each other when viewed in the stacking direction T. Thus, the entirety of the first inductor L101B excluding the connection portions does not include portions that overlap each other when viewed in stacking direction T. The entirety of the first inductor L101B has a spiral shape when viewed in the stacking direction T. The three-dimensional shape of the entirety of the first inductor L101B is like a square frustum.

The first inductor L101A is located closer to the top surface 150A than are the first and second capacitors C101A and C102A, the second inductor L102A, the main line 110 and the subline sections 120A, 120B and 120C. The second inductor L102A is located closer to the bottom surface 150B than are the first and second capacitors C101A and C102A.

Likewise, the first inductor L101B is located closer to the top surface 150A than are the first and second capacitors C101B and C102B, the second inductor L102B, the main line 110 and the subline sections 120A, 120B and 120C. The second inductor L102B is located closer to the bottom surface 150B than are the first and second capacitors C101B and C102B.

The directional coupler 101 according to the second embodiment makes it possible to reduce a change in coupling in response to a change in frequency over a wide frequency band. This will be described in detail below.

The coupling of each of the first to third coupling sections 140A, 140B and 140C alone increases with increasing frequency. The coupling of the third coupling section 140C alone is higher than the coupling of each of the first and second coupling sections 140A and 140B alone.

Now, the amount by which each of the first and second matching sections 130A and 130B changes the phase of a signal passing therethrough will be referred to as the amount of phase change. The amount of phase change is expressed in negative values because each of the matching sections 130A and 130B causes a phase delay of the signal passing therethrough. It can be said that the larger the absolute value of the amount of phase change, the greater is the change caused by each of the matching sections 130A and 130B in the phase of the signal passing therethrough.

The matching sections 130A and 130B are configured in the same manner as the matching sections 30A and 30B of the first embodiment. Now, a matching section configured by adding a stray capacitance of the first inductor L101A to the first matching section 130A will be referred to as a matching section of a second comparative example. The stray capacitance is connected to the first inductor L101A in parallel.

Figure 32:
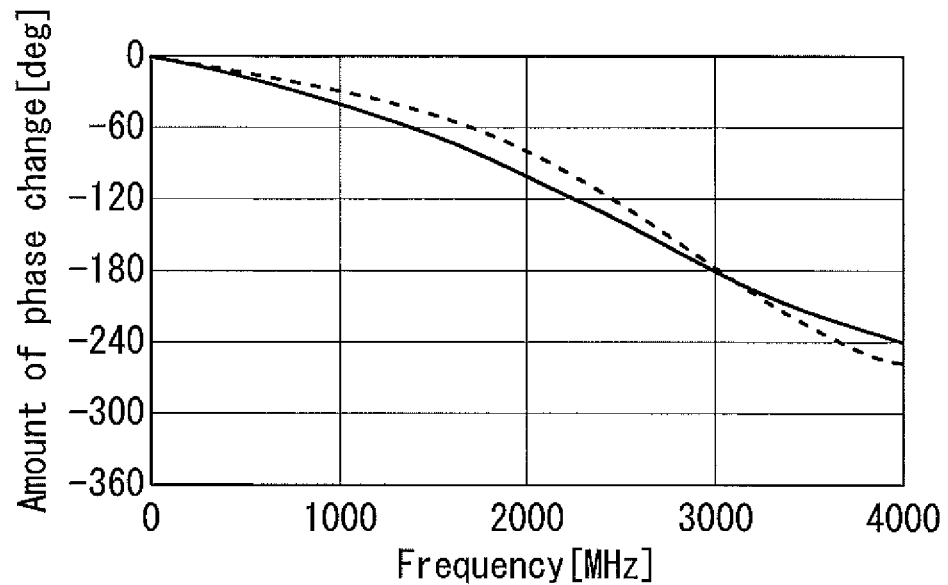
FIG. 32 is a characteristic diagram illustrating the frequency response of the amount of phase change caused by each of the first matching section of the second embodiment of the invention and a matching section of a second comparative example.

FIG. 32 illustrates the frequency response of the amount of phase change caused by each of the first matching section 130A and the matching section of the second comparative example. In FIG. 32 the horizontal axis represents frequency, and the vertical axis represents the amount of phase change. Further, in FIG. 32 the solid line represents the frequency response for the first matching section 130A, and the broken line represents the frequency response for the matching section of the second comparative example.

Figure 33:
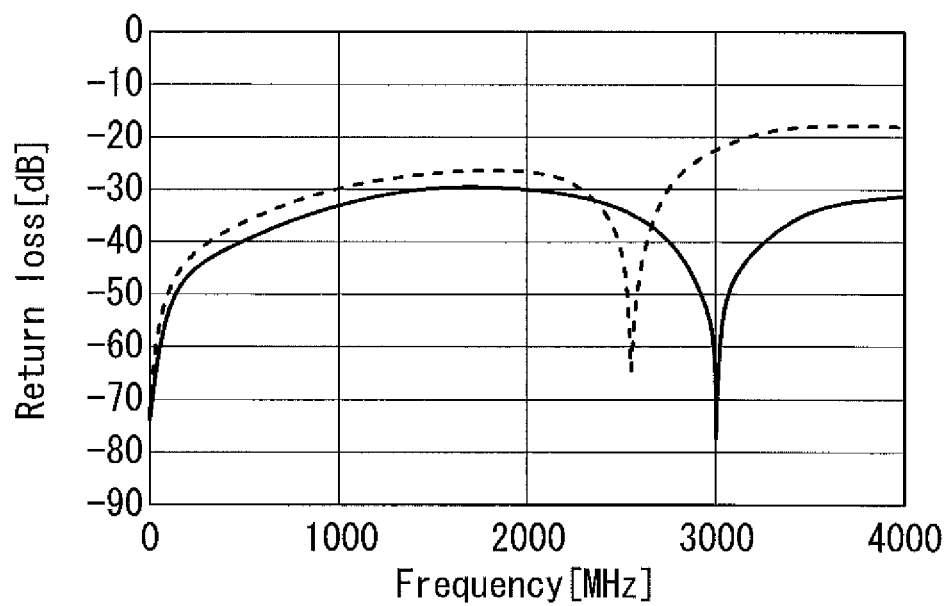
FIG. 33 is a characteristic diagram illustrating the frequency response of the return loss of each of the first matching section of the second embodiment of the invention and the matching section of the second comparative example.

FIG. 33 illustrates the frequency response of the return loss of each of the first matching section 130A and the matching section of the second comparative example. In FIG. 33 the horizontal axis represents frequency, and the vertical axis represents return loss. Further, in FIG. 33 the solid line represents the frequency response for the first matching section 130A, and the broken line represents the frequency response for the matching section of the second comparative example.

Figure 34:
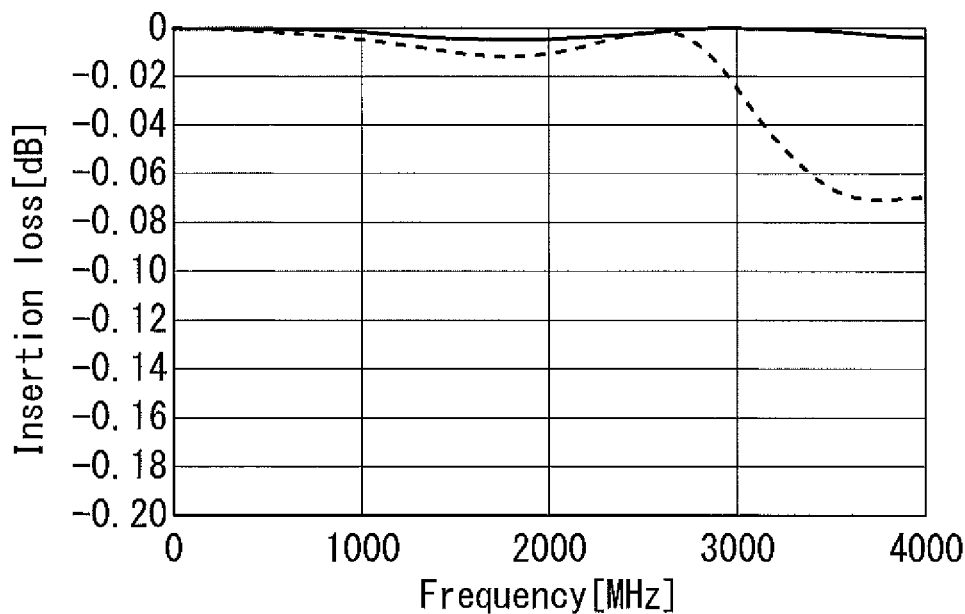
FIG. 34 is a characteristic diagram illustrating the frequency response of the insertion loss of each of the first matching section of the second embodiment of the invention and the matching section of the second comparative example.

FIG. 34 illustrates the frequency response of the insertion loss of each of the first matching section 130A and the matching section of the second comparative example. In FIG. 34 the horizontal axis represents frequency, and the vertical axis represents insertion loss. Further, in FIG. 34 the solid line represents the frequency response for the first matching section 130A, and the broken line represents the frequency response for the matching section of the second comparative example.

If the first inductor L101A has a stray capacitance, the characteristics of the first matching section 130A change from the desired characteristics shown by the solid lines in FIGS. 32-34 to the characteristics of the matching section of the second comparative example shown by the broken lines in FIGS. 32-34. A particular concern raised by the stray capacitance of the first inductor L101A is that the frequency response of the amount of phase change caused by the first matching section 130A undergoes the following changes. As shown in FIG. 32, if the first inductor L101A has the stray capacitance, the absolute value of the amount of phase change becomes smaller than a desired value in a frequency region lower than the frequency at which the absolute value of the amount of phase change is 180 degrees, and becomes larger than the desired value in a frequency region higher than the frequency at which the absolute value of the amount of phase change is 180 degrees.

The second matching section 130B has the same or almost the same characteristics as the first matching section 130A. As is the case with the first matching section 130A, if the first inductor L101B in the second matching section 130B has a stray capacitance, the characteristics of the second matching section 130B change from the desired characteristics to the characteristics of the matching section of the second comparative example. As will be shown later, if the first inductor in each of the first and second matching sections 130A and 130B has a stray capacitance, the directional coupler 101 has a reduced effect of reducing a change in coupling in response to a change in frequency.

A directional coupler configured by adding a stray capacitance of the first inductor to each of the first and second matching sections 130A and 130B in the directional coupler 101 will be referred to as a directional coupler of a second comparative example.

Figure 35:
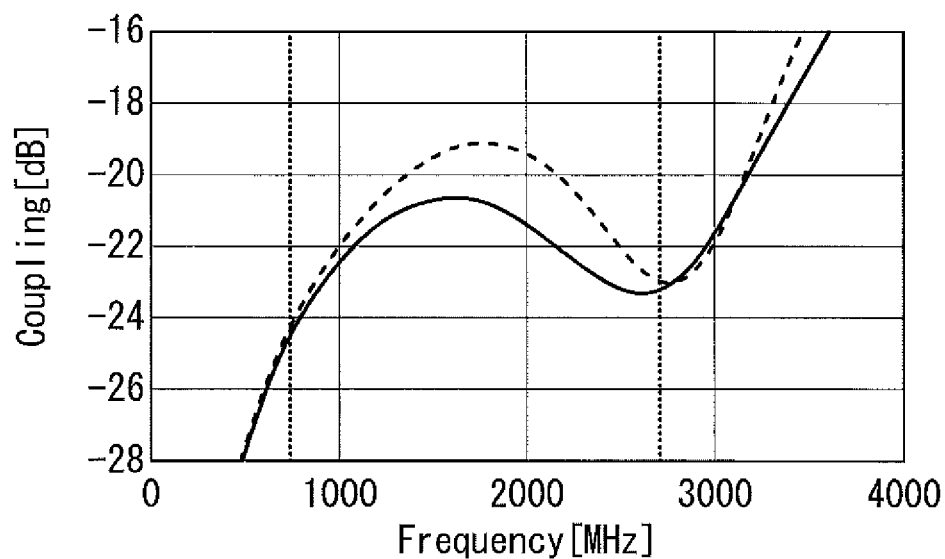
FIG. 35 is a characteristic diagram illustrating the frequency response of the coupling of each of the directional coupler according to the second embodiment of the invention and a directional coupler of a second comparative example.
Figure 36:
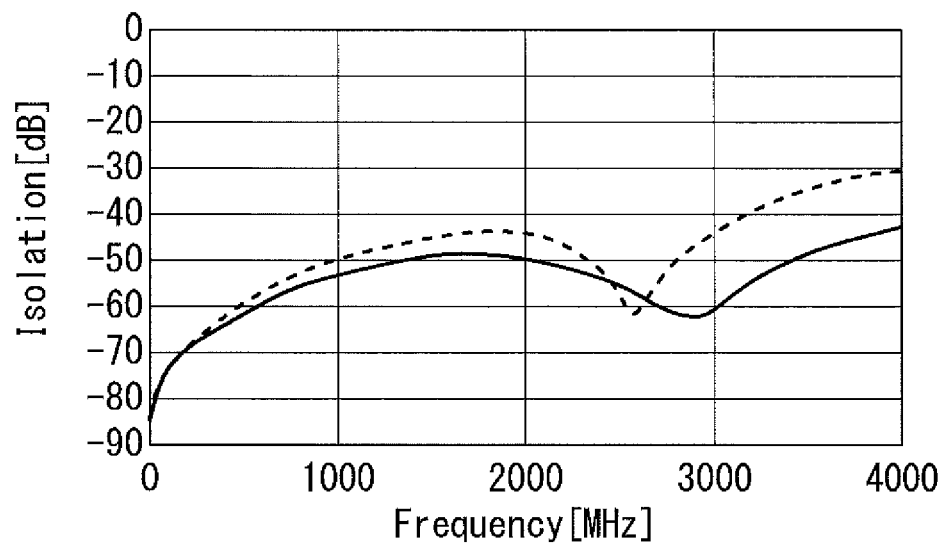
FIG. 36 is a characteristic diagram illustrating the frequency response of the isolation of each of the directional coupler according to the second embodiment of the invention and the directional coupler of the second comparative example.
Figure 37:
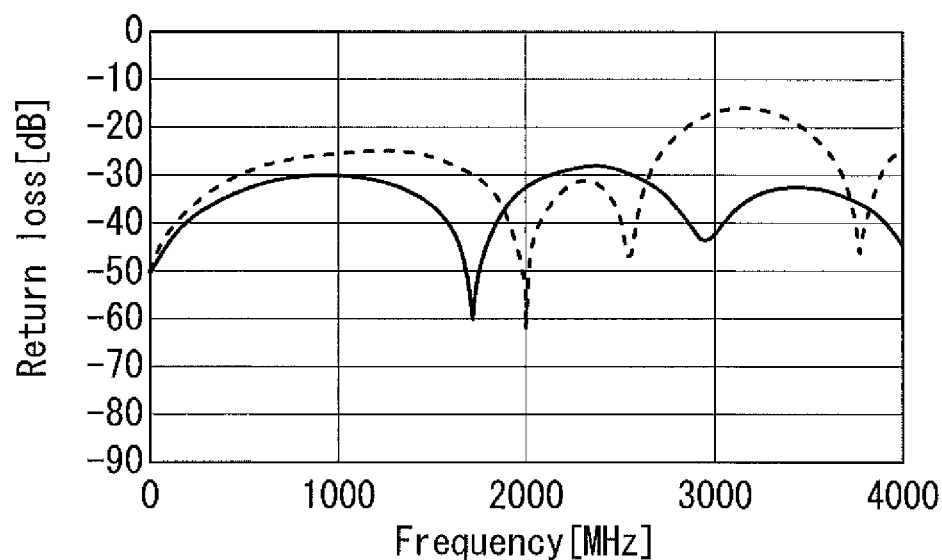
FIG. 37 is a characteristic diagram illustrating the frequency response of the return loss at the coupling port of each of the directional coupler according to the second embodiment of the invention and the directional coupler of the second comparative example.

FIG. 35 to FIG. 37 illustrate an example of characteristics of the directional coupler 101 according to the second embodiment and the directional coupler of the second comparative example. In the example shown in FIG. 35 to FIG. 37, the service frequency band of the directional coupler 101 is 700 to 2700 MHz. In FIG. 35 the upper and lower limits of this service frequency band are shown by two dotted lines. The characteristics shown in FIG. 35 to FIG. 37 were determined by simulation. In each of FIG. 35 to FIG. 37, the solid line represents the characteristic of the directional coupler 101 used in the first mode of use, and the broken line represents the characteristic of the directional coupler of the second comparative example used in the first mode of use. In the simulation, the characteristic of the directional coupler 101 used in the second mode of use is the same as the characteristic of the directional coupler 101 used in the first mode of use, and the characteristic of the directional coupler of the second comparative example used in the second mode of use is the same as the characteristic of the directional coupler of the second comparative example used in the first mode of use.

FIG. 35 illustrates the frequency response of the coupling of each of the directional coupler 101 and the directional coupler of the second comparative example. In FIG. 35 the horizontal axis represents frequency, and the vertical axis represents coupling. If we let −c (dB) denote coupling, the directional coupler 101 exhibits a sufficiently large value of c, that is, 20 or above, in the service frequency band.

FIG. 36 illustrates the frequency response of the isolation of each of the directional coupler 101 and the directional coupler of the second comparative example. In FIG. 36 the horizontal axis represents frequency, and the vertical axis represents isolation. If we let −i (dB) denote isolation, the directional coupler 101 exhibits a sufficiently large value of i, that is, 45 or above, in the service frequency band.

FIG. 37 illustrates the frequency response of the return loss at the coupling port of each of the directional coupler 101 and the directional coupler of the second comparative example. In FIG. 37 the horizontal axis represents frequency, and the vertical axis represents return loss at the coupling port. If we let −r (dB) denote return loss at the coupling port, the directional coupler 101 exhibits a sufficiently large value of r, that is, 25 or above, in the service frequency band. This means that the reflection coefficient as viewed in the direction from one of the third and fourth ports 13 and 14 to the other has an absolute value of zero or near zero in the service frequency band.

As indicated by the solid line in FIG. 35, the frequency response of the coupling of the directional coupler 101 shows a reduced change in coupling in response to a change in frequency over a wide frequency range. In contrast, the frequency response of the coupling of the directional coupler of the second comparative example indicated by the broken line in FIG. 35 shows a greater change in coupling in response to a change in frequency when compared with the frequency response of the coupling of the directional coupler 101. This is due to the stray capacitance of the first inductor in each of the first and second matching sections 130A and 130B.

Now, a conceptual description will be given of the reason why the directional coupler 101 according to the second embodiment is able to reduce a change in coupling in response to a change in frequency over a wide frequency range. In the directional coupler 101, as mentioned previously, the coupling of the third coupling section 140C alone is higher than the coupling of each of the first and second coupling sections 140A and 140B alone. In the directional coupler 101, a signal having passed through the first coupling section 140A and a signal having passed through the second coupling section 140B are combined with a signal having passed through the third coupling section 140C under the respective phase relationships determined at the first matching section 130A and the second matching section 130B to form a coupling signal. The closer to 180 degrees is the absolute value of the amount of phase change caused by each of the first and second matching sections 130A and 130B, the greater is the degree to which the signal having passed through the first coupling section 140A and the signal having passed through the second coupling section 140B cancel out the signal having passed through the third coupling section 140C. By virtue of such an operation, the frequency response of the coupling of the directional coupler 101 exhibits a reduced change in coupling in response to a change in frequency when compared with the frequency response of the coupling of the third coupling section 140C alone.

If the first inductor in each of the first and second matching sections 130A and 130B has a stray capacitance, as shown in FIG. 32, the absolute value of the amount of phase change caused by each of the first and second matching sections 130A and 130B gets farther away from 180 degrees than a desired value in both of frequency ranges higher than and lower than the frequency at which the absolute value of the amount of phase change becomes 180 degrees. This means a reduction in the degree to which a signal having passed through the first coupling section 140A and a signal having passed through the second coupling section 140B cancel out a signal having passed through the third coupling section 140C. As a result, as shown by the broken line in FIG. 35, a change in coupling in response to a change in frequency increases.

In the second embodiment, the entirety of the first inductor L101A excluding the connection portions does not include portions that overlap each other when viewed in the stacking direction T. Likewise, the entirety of the first inductor L101B excluding the connection portions does not include portions that overlap each other when viewed in the stacking direction T. By virtue of these features, the second embodiment makes it possible to prevent the first inductors L101A and L101B from having a large stray capacitance.

Further, in the second embodiment, the first inductor L101A is located closer to the top surface 150A than are the first and second capacitors C101A and C102A, the second inductor L102A, the main line 110 and the subline sections 120A, 120B and 120C. Likewise, the first inductor L101B is located closer to the top surface 150A than are the first and second capacitors C101B and C102B, the second inductor L102B, the main line 110 and the subline sections 120A, 120B and 120C. In other words, any conductor layer used for forming the directional coupler 101 is not present above the first inductors L101A and L101B. This also serves to prevent the first inductors L101A and L101B from having a large stray capacitance.

Further, in the second embodiment, the second inductor L102A is located closer to the bottom surface 150B than are the first and second capacitors C101A and C102A. Likewise, the second inductor L102B is located closer to the bottom surface 150B than are the first and second capacitors C101B and C102B. By virtue of these features, the second embodiment makes it possible to increase the distance between the first inductor L101A and the second inductor L102A, and the distance between the first inductor L101B and the second inductor L102B. This also serves to prevent the first inductors L101A and L101B from having a large stray capacitance.

As described above, the second embodiment makes it possible to prevent the first inductors L101A and L101B from having a large stray capacitance. As a result, it becomes possible to achieve a further reduction in a change in the coupling of the directional coupler 101 in response to a change in frequency.

Thus, the directional coupler 101 according to the second embodiment is wideband capable. Further, as mentioned previously, the directional coupler 101 can have symmetric or approximately symmetric circuitry. This allows the directional coupler 101 to be bidirectional.

Further, in the second embodiment, any conductor layer that may obstruct the passage of magnetic flux generated by the first inductors L101A and L101B is not present above the first inductors L101A and L101B. Thus, the first inductors L101A and L101B can have sufficiently large inductances even if they are small in size. This allows for miniaturization of the directional coupler 101.

The remainder of configuration, operation and effects of the second embodiment are similar to those of the first embodiment.

The present invention is not limited to the foregoing embodiments, and various modifications may be made thereto. For example, in the first embodiment, the third matching section 30C may have the same configuration as the first and second matching sections 30A and 30B, excluding element values.

In the present invention, the number of the subline sections, N, may be any integer of 2 or more. If N is 2, the directional coupler is provided with a first and a second subline section and a matching section, and the matching section is configured to satisfy the requirements concerning the (N−1) matching section or at least one of the (N−1) matching sections recited in the appended claims. If N is 3 or more, at least one of the three matching sections is configured to satisfy the requirements concerning at least one of the (N−1) matching sections recited in the appended claims.

In the present invention, the second inductor may be located closer to the bottom surface of the stack than are the first capacitor, the main line and the N subline sections.

Obviously, many modifications and variations of the present invention are possible in the light of the above teachings. Thus, it is to be understood that, within the scope of the appended claims and equivalents thereof, the invention may be practiced in other than the foregoing most preferable embodiments.

What is claimed is:
1. A directional coupler comprising:
 a first port;
 a second port;
 a third port;
 a fourth port;
 a main line connecting the first port and the second port;
 N subline sections each of which is formed of a line configured to be electromagnetically coupled to the main line;
 (N−1) matching section(s); and
 a stack for integrating the first to fourth ports, the main line, the N subline sections and the (N−1) matching section(s), wherein

N is an integer of 2 or more, the N subline sections and the (N−1) matching section(s) are arranged in series between the third port and the fourth port such that one of the N subline sections is connected to the third port, another one of the N subline sections is connected to the fourth port, and the subline sections alternate with the matching section(s) in terms of circuitry, the (N−1) matching section or each of the (N−1) matching sections causes a change in the phase of a signal passing therethrough, the (N−1) matching section or at least one of the (N−1) matching sections includes a first path connecting two subline sections located on opposite sides of the matching section, and a second path connecting the first path to a ground, the first path includes a first inductor, the second path includes a first capacitor and a second inductor connected in series, the stack includes a plurality of dielectric layers and a plurality of conductor layers stacked on each other, the plurality of conductor layers include one or more inductor-forming layers which are one or more conductor layers used to form the first inductor, each of the one or more inductor-forming layers includes two connection portions for electrical connection to respective other elements, and a line portion connecting the two connection portions, and an entirety of the first inductor excluding the two connection portions does not include portions that overlap each other when viewed in a direction of stacking of the plurality of dielectric layers and the plurality of conductor layers.

2. The directional coupler according to claim 1, wherein the stack has a top surface and a bottom surface located at opposite ends in the direction of stacking of the plurality of dielectric layers and the plurality of conductor layers, and the first inductor is located closer to the top surface of the stack than are the first capacitor, the second inductor, the main line and the N subline sections.

3. The directional coupler according to claim 2, wherein the second inductor is located closer to the bottom surface of the stack than is the first capacitor.

4. The directional coupler according to claim 1, wherein the first inductor is formed only of one inductor-forming layer having a spiral shape.

5. The directional coupler according to claim 1, wherein the first inductor is formed of a plurality of inductor-forming layers, the plurality of inductor-forming layers being arranged such that their respective line portions do not overlap each other when viewed in the direction of stacking of the plurality of dielectric layers and the plurality of conductor layers.

6. The directional coupler according to claim 5, wherein the entirety of the first inductor has a spiral shape when viewed in the direction of stacking of the plurality of dielectric layers and the plurality of conductor layers.

7. The directional coupler according to claim 1, wherein the first inductor has a first end and a second end opposite to each other, the second inductor has a first end and a second end, the first end being closest to the first path in terms of circuitry, the second end being closest to the ground in terms of circuitry, the first capacitor is provided between the first end of the first inductor and the first end of the second inductor, and the second path further includes a second capacitor provided between the second end of the first inductor and the first end of the second inductor.

* * * * *